United States Patent [19]
Kunisa et al.

[11] Patent Number: 5,739,779
[45] Date of Patent: Apr. 14, 1998

[54] ENCODING CIRCUIT AND DECODING CIRCUIT

[75] Inventors: Akiomi Kunisa, Anpachi-gun; Seiichiro Takahashi, Gifu; Nobuo Itoh, Nagoya, all of Japan

[73] Assignee: Sanyo Electric Co., Ltd., Moriguchi, Japan

[21] Appl. No.: 697,136

[22] Filed: Aug. 20, 1996

[30] Foreign Application Priority Data

Aug. 23, 1995 [JP] Japan .................................. 7-239213
Sep. 20, 1995 [JP] Japan .................................. 7-267930

[51] Int. Cl.⁶ .................................................. H03M 7/14
[52] U.S. Cl. .................................................. 341/59; 341/106
[58] Field of Search .................................. 341/58, 59, 67, 341/65, 106

[56] References Cited

U.S. PATENT DOCUMENTS 5,508,701  4/1996  Nose et al. ................................ 341/58
5,600,315  2/1997  Shimpuku et al. ........................ 341/59

FOREIGN PATENT DOCUMENTS 52-128024  10/1977  Japan .
1-27510     5/1989  Japan .
4-77991    12/1992  Japan .
5-34747     5/1993  Japan .
6-311042   11/1994  Japan .

Primary Examiner—Jeffrey A. Gaffin
Assistant Examiner—Peguy Jean-Pierre
Attorney, Agent, or Firm—Armstrong, Westerman, Hattori, McLeland & Naughton

[57] ABSTRACT

Several different types of look-up tables are available in the present invention. That is, one look-up table is selected for each m-bit dataword according to the number of consecutive 0's at lower digits, which include a lowermost digit, of the n-bit codeword preceding thereto and the encoding is performed by using the selected look-up table. Furthermore, the bit-pattern at the lower digits, which include a lowermost digit, of a current n-bit codeword is replaced according to the number of consecutive 0's at upper digits, which include an uppermost digit, of the n-bit codeword following thereafter.

18 Claims, 16 Drawing Sheets

Fig.3

| The Number of Consecutive 0's at Upper Bits of 15-Bit Codewords | The Number of 15-Bit Codewords Satisfying the Constraint d=2, k=9 |
|---|---|
| (100* ) 0 | 120 |
| (0100* ) 1 | 83 |
| (00100* ) 2 | 57 |
| (000100* ) 3 | 39 |
| (0000100* ) 4 | 27 |
| (00000100* ) 5 | 19 |
| (000000100* ) 6 | 13 |
| (0000000100* ) 7 | 9 |
| (00000000100* ) 8 | 6 |
| (000000000100* ) 9 | 4 |

Fig. 4

(a) RULE FOR SELECTING THE LOOK-UP TABLE

| Preceding Codeword | Table Number |
|---|---|
| 1 | 0 (0a-0h) |
| 1 0 | 1 (1a-1h) |
| 1 0 0 | 2 (2a-2h) |
| 1 0 0 0 | 3 (3a-3h) |
| 1 0 0 0 0 | 4 (4a-4h) |
| 1 0 0 0 0 0 | 5 (5a-5h) |
| 1 0 0 0 0 0 0 | 6 (6a-6h) |
| 1 0 0 0 0 0 0 0 | 6 (6a-6h) |
| 1 0 0 0 0 0 0 0 0 | 6 (6a-6h) |
| 1 0 0 0 0 0 0 0 0 0 | 7 (7a-7h) |

(b) RULE FOR REPLACING THE LOWER BITS OF THE PRECEDING CODEWORD

| Before Replacing | | After Replacing | |
|---|---|---|---|
| Preceding | Current | Preceding | Current |
| 0 0 0 1 0 | 1 0 0 1 | 0 0 1 0 0 | 1 0 0 1 |
| 0 0 0 1 0 | 1 0 0 0 0 0 1 | 0 0 1 0 0 | 1 0 0 0 0 0 1 |
| 0 0 0 1 0 | 1 0 0 0 0 0 0 1 | 0 0 1 0 0 | 1 0 0 0 0 0 0 1 |
| 0 0 0 1 0 | 1 0 0 0 0 0 0 0 0 | 0 0 1 0 0 | 1 0 0 0 0 0 0 0 0 |
| 1 0 0 1 0 | 1 0 0 1 | 1 0 0 0 0 | 1 0 0 1 |
| 1 0 0 1 0 | 1 0 0 0 0 0 1 | 1 0 0 0 0 | 1 0 0 0 0 0 1 |
| 1 0 0 1 0 | 1 0 0 0 0 0 0 1 | 1 0 0 0 0 | 1 0 0 0 0 0 0 1 |
| 1 0 0 1 0 | 1 0 0 0 0 0 0 0 0 | 1 0 0 0 0 | 1 0 0 0 0 0 0 0 0 |
| 0 0 0 1 | 0 1 | 0 0 1 0 | 0 1 |
| 1 0 0 1 | 0 1 | 1 0 0 0 | 0 1 |
| 0 0 0 0 0 0 0 | 0 0 1 | 1 0 0 0 0 0 0 | 0 0 1 |
| 0 0 0 0 0 0 0 | 0 0 0 1 | 1 0 0 0 0 0 0 | 0 0 0 1 |
| 0 0 0 0 0 0 0 | 0 0 0 0 1 | 1 0 0 0 0 0 0 | 0 0 0 0 1 |
| 0 0 0 0 0 0 0 | 0 0 0 0 0 1 | 0 0 1 0 0 0 0 | 0 0 0 0 0 1 |

Fig.5

| Group Number | The Number of Consecutive 0's at Lower Digits of a Preceding Codeword Codeword-Pattern | The Number of Consecutive 0's at Upper Digits of a Current Codeword (Connectable) | Types of Codewords (Connectable) | Lack or Excess (Types of Codewords) |
|---|---|---|---|---|
| 1 | 0********001 | 0 1 ② ③ ④<br>⑤ ⑥ ⑦ ⑧ ⑨ | 174 | -82 |
| 2 | 1*******0010 | 0 ① ② ③ ④<br>⑤ ⑥ ⑦ ⑧ 9 | 253 | -3 |
| 3 | 2******00100 | ① ② ③ ④<br>⑤ ⑥ ⑦ 8 9 | 367 | +111 |
| 4 | 3*****001000 | ① ② ③ ④<br>⑤ ⑥ 7 8 9 | 358 | 102 |
| 5 | 4****0010000 | ① ② ③ ④<br>⑤ 6 7 8 9 | 345 | 89 |
| 6 | 5***00100000 | ① ② ③ ④<br>5 6 7 8 9 | 326 | 70 |
| 7 | 6**001000000 | ① ② ③ 4<br>5 6 7 8 9 | 299 | 43 |
| 8 | 7*0010000000 | ① ② 3 4<br>5 6 7 8 9 | 260 | 4 |
| 9 | 80010000000 | ① 2 3 4<br>5 6 7 8 9 | 203 | -53 |
| 10 | 001000000000 | 1 2 3 4<br>5 6 7 8 9 | 120 | -136 |

Fig.6

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract, Types of Codewords |
|---|---|---|---|
| 1 | 174 | (1) 001,0001,00001,000001,0000001,00000001,000000001,0000000001<br>(2) 0010,1000<br>(3) Add 82 Codewords | +82, 256 |
| 2 | 253 | (3) Subtract 82 Codewords (in 83 Codewords) of "01" | −82, 171 |
| 3 | 367 | | 367 |
| 4 | 358 | (3) Subtract 82 Codewords (in 83 Codewords) of "01" | −82, 276 |
| 5 | 345 | | 345 |
| 6 | 326 | | 326 |
| 7 | 299 | | 299 |
| 8 | 260 | | 260 |
| 9 | 203 | | 203 |
| 10 | 120 | | 120 |

Fig.7

| Group Number | Types of Codewords | (1) Bit-Pattern at Upper Digits of a Current Codeword (2) Replaced Bit-Pattern at Lower Digits of a Preceding Codeword (3) Add and Subtract | Add or Subtract, Types of Codewords |
|---|---|---|---|
| 1 | 256 | | 256 |
| 2 | 253 | (1) 01, 001, 0001, 00001, 000001, 0000001, 00000001, 000000001 (2) 00100, 10000 (3) Add 85 Codewords (in 120 Codewords) of "1" | +85, 256 |
| 3 | 367 | (3) Subtract 85 Codewords (in 120 Codewords) of "1" | −85, 282 |
| 4 | 276 | | 276 |
| 5 | 345 | (3) Subtract 85 Codewords (in 120 Codewords) of "1" | −85, 260 |
| 6 | 326 | | 326 |
| 7 | 299 | | 299 |
| 8 | 260 | | 260 |
| 9 | 203 | | 203 |
| 10 | 120 | | 120 |

Fig. 8

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract, Types of Codewords |
|---|---|---|---|
| 1 | 256 | | 256 |
| 2 | 256 | | 256 |
| 3 | 282 | | 282 |
| 4 | 276 | | 276 |
| 5 | 260 | | 260 |
| 6 | 326 | (3) Subtract 53 Codewords (in 57 Codewords) of "001" | −53, 273 |
| 7 | 299 | | 299 |
| 8 | 260 | | 260 |
| 9 | 203 | (1) 1,01<br>(2) 100100000<br>(3) Add 53 Codewords (in 57 Codewords) of "001" | +53, 256 |
| 10 | 120 | | 120 |

Fig.9

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract, Types of Codewords |
|---|---|---|---|
| 1 | 256 | | 256 |
| 2 | 256 | | 256 |
| 3 | 282 | | 282 |
| 4 | 276 | | 276 |
| 5 | 260 | | 260 |
| 6 | 273 | (3) Subtract 57 Codewords (in 57 Codewords) of "001" | −4, 269 |
| 7 | 299 | | 299 |
| 8 | 260 | | 260 |
| 9 | 256 | | 256 |
| 10 | 120 | (1) 1<br>(2) 1000100000<br>(3) Add 57 Codewords (in 57 Codewords) of "001" | +57, 177 |

Fig.10

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract, Types of Codewords |
|---|---|---|---|
| 1 | 256 | | 256 |
| 2 | 256 | | 256 |
| 3 | 282 | | 282 |
| 4 | 276 | | 276 |
| 5 | 260 | | 260 |
| 6 | 269 | | 269 |
| 7 | 299 | (3) Subtract 39 Codewords (in 39 Codewords) of "0001" | −39, 260 |
| 8 | 260 | | 260 |
| 9 | 256 | | 256 |
| 10 | 177 | (1) 1,001<br>(2) 1001000000<br>(3) Add 39 Codewords (in 39 Codewords) of "0001" | +39, 216 |

Fig. 11

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract. Types of Codewords |
|---|---|---|---|
| 1 | 256 | | 256 |
| 2 | 256 | | 256 |
| 3 | 282 | | 282 |
| 4 | 276 | | 276 |
| 5 | 260 | | 260 |
| 6 | 269 | (3) Subtract 27 Codewords (in 27 Codewords) of "00001" | −27, 242 |
| 7 | 260 | | 260 |
| 8 | 260 | | 260 |
| 9 | 256 | | 256 |
| 10 | 216 | (1) 1, 001.0001<br>(2) 1000100000<br>(3) Add 27 Codewords (in 27 Codewords) of "00001" | +27, 243 |

Fig.12

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract, Types of Codewords |
|---|---|---|---|
| 1 | 256 | | 256 |
| 2 | 256 | | 256 |
| 3 | 282 | (3) Subtract 13 Codewords (in 19 Codewords) of "000001" | −13, 269 |
| 4 | 276 | | 276 |
| 5 | 260 | | 260 |
| 6 | 242 | | 242 |
| 7 | 260 | | 260 |
| 8 | 260 | | 260 |
| 9 | 256 | | 256 |
| 10 | 243 | (1) 1, 001, 0001, 00001<br>(2) 1000000100<br>(3) Add 13 Codewords (in 19 Codewords) of "000001" | +13, 256 |

Fig. 13

| Group Number | Types of Codewords | (1) Bit-Pattern at Upper Digits of a Current Codeword<br>(2) Replaced Bit-Pattern at Lower Digits of a Preceding Codeword<br>(3) Add and Subtract | Add or Subtract. Types of Codewords |
|---|---|---|---|
| 1 | 256 | | 256 |
| 2 | 256 | | 256 |
| 3 | 269 | (3) Subtract 14 Codewords (in 19 Codewords) of "000001" | −1, 268 |
| 4 | 276 | | 276 |
| 5 | 260 | | 260 |
| 6 | 242 | (1) 1, 01.0001<br>(2) 100100<br>(3) Add 14 Codewords (in 19 Codewords) of "000001" | +14, 256 |
| 7 | 260 | | 260 |
| 8 | 260 | | 260 |
| 9 | 256 | | 256 |
| 10 | 256 | | 256 |

Fig. 14

| Group Number | Replaced Lower Bits | The Number of Consecutive 0's at Upper Digits of a Current Codeword | Types of Codewords | Table Number |
|---|---|---|---|---|
| 1 | 0 0 1 0 → Group 2<br>1 0 0 0 → Group 4 | ⓪ ① ② ③ ④<br>⑤ ⑥ ⑦ ⑧ ⑨ | 256 | 0 |
| 2 | 0 0 1 0 0 → Group 3<br>1 0 0 0 0 → Group 5 | (0) ① ② ③ ④<br>⑤ ⑥ ⑦ ⑧ 9 | 256 | 1 |
| 3 | | 0 ① ② ③ ④<br>⑤ ⑥ ⑦ 8 9 | 268 | 2 |
| 4 | | 0 ① ② ③ ④<br>⑤ 6 ⑦ 8 9 | 276 | 3 |
| 5 | | 0 ① 2 ③ ④<br>⑤ 6 7 8 9 | 260 | 4 |
| 6 | 1 0 0 1 0 0 → Group 2 | 0 ① 2 3 4<br>⑤ 6 7 8 9 | 256 | 5 |
| 7 | | 0 ① 2 3 4<br>⑤ 6 7 8 9 | 260 | 6 |
| 8 | | 0 ① ② 3 4<br>⑤ 6 7 8 9 | 260 | 6 |
| 9 | 1 0 0 1 0 0 0 0 0 → Group 6 | 0 ① ② 3 4<br>⑤ 6 7 8 9 | 256 | 6 |
| 10 | 1 0 0 1 0 0 0 0 0 0 → Group 7<br>1 0 0 0 0 0 1 0 0 0 → Group 6<br>1 0 0 0 0 0 0 1 0 0 → Group 3 | 0 1 ② ③ ④<br>⑤ 6 7 8 9 | 256 | 7 |

Fig.15

| Group Number | The Number of Consecutive 0's at Upper Digits of a Current Codeword | Number of Codewords | Add or Subtract Codewords | The Number of Consecutive 0's at Upper Digits of a Current Codeword | Table Number |
|---|---|---|---|---|---|
| 1 | 0̶ 1̶ 2 3 4 5 6 7 8 9 | 174 | a) [256] +3 | 0̶ 1 2 3 4 5 6 7 8 9 | 0 |
| 2 | 0̶ 1 2 3 4 5 6 7 8 9̶ | 253 | ↑ 364 (1) | 0 1 2 3 4 5 6 7 8 9̶ | 1 |
| 3 | 0 1 2 3 4 5 6 7 8̶ 9̶ | 367 | b) [257] +83 | 0̶ 2 3 4 5 6̶ 7̶ 8̶ 9̶ | 2 |
| 4 | 0 1 2 3 4 5̶ 6̶ 7̶ 8̶ 9̶ | 358 | ↑ 342 (2) | 0̶ 2 3 4 5 6̶ 7̶ 8̶ 9̶ | 2 |
| 5 | 0 1 2 3 4 5̶ 6̶ 7̶ 8̶ 9̶ | 345 | 281 (3) [275] (4) [259] (5) | 0̶ 2 3 4 5̶ 6̶ 7̶ 8̶ 9̶ | 2 |
| 6 | 0 1 2 3 4 5̶ 6̶ 7̶ 8̶ 9̶ | 326 | c) 269 d) [260] e) 242 f) [259] | 0 1 2̶ 3 4 5̶ 6̶ 7̶ 8̶ 9̶ | 4 |
| 7 | 0 1 2̶ 3 4 5̶ 6̶ 7̶ 8̶ 9̶ | 299 | ↑ +57 +39 +27 +22 | 0 1 2 3̶ 4 5̶ 6̶ 7̶ 8̶ 9̶ | 5 |
| 8 | 0 1 2̶ 3̶ 4 5̶ 6̶ 7̶ 8̶ 9̶ | [260] | [260] (9) 216 (8) 243 (7) [264] (6) | 0 1 2 3̶ 4̶ 5̶ 6̶ 7̶ 8̶ 9̶ | 5 |
| 9 | 0 1 2̶ 3̶ 4̶ 5̶ 6̶ 7̶ 8̶ 9̶ | 203 | 177 (9) | 0 1 2 3̶ 4̶ 5̶ 6̶ 7̶ 8̶ 9̶ | 5 |
| 10 | 0̶ 1 2̶ 3̶ 4̶ 5̶ 6̶ 7̶ 8̶ 9̶ | 120 | [265] (6) | 0̶ 2 3 4 5̶ 6̶ 7̶ 8̶ 9̶ | 3 |

Fig.16

(a) RULE FOR SELECTING THE LOOK-UP TABLE

| Preceding Codeword | Table Number |
|---|---|
| 1 | 0 (0a-0h) |
| 1 0 | 1 (1a-1h) |
| 1 0 0 | 2 (2a-2h) |
| 1 0 0 0 | 2 (2a-2h) |
| 1 0 0 0 0 | 2 (2a-2h) |
| 1 0 0 0 0 0 | 4 (4a-4h) |
| 1 0 0 0 0 0 0 | 5 (5a-5h) |
| 1 0 0 0 0 0 0 0 | 5 (5a-5h) |
| 1 0 0 0 0 0 0 0 0 | 5 (5a-5h) |
| 1 0 0 0 0 0 0 0 0 0 | 3 (3a-3h) |

(b) RULE FOR REPLACING THE LOWER BITS OF THE PRECEDING CODEWORD

| Before Replacing | | After Replacing | |
|---|---|---|---|
| Preceding | Current | Preceding | Current |
| 00010 | 100000000 | 00100 | 100000000 |
| 10010 | 100000000 | 10000 | 100000000 |
| 00001 | 01 | 00100 | 01 |
| 01001 | 01 | 01000 | 01 |
| 10001 | 01 | 10000 | 01 |
| 00000 | 000000 | 00100 | 000000 |
| 000000 | 00001 | 100000 | 00001 |
| 0000000 | 0001 | 1000000 | 0001 |
| 00000000 | 001 | 00100000 | 001 |

ENCODING CIRCUIT AND DECODING CIRCUIT

BACKGROUND OF THE INVENTION

1. Field of the Invention

The present invention relates to an encoding circuit which encodes each m-bit dataword cut out of an input binary data sequence one after another into an n-bit codeword by reffering to a look-up table respectively. Also, the present invention relates to a decoding circuit which decodes each n-bit codeword cut out of an input (d,k;m,n) RLL binary code sequence one after another into an m-bit dataword by reffering to a look-up table respectively.

2. Description of the Related Art

An input binary data stream is mapped to an RLL code sequence, then modulated to an NRZI waveform, and then recorded onto a recording medium, and thereby the recording density can be heightened.

In the RLL coding, m-bit datawords are cut out of the binary data stream one after another, and each m-bit dataword is mapped to an n-bit codeword. In this mapping or translating, a constraint is imposed to set the minimum value $T_{min}$ of the polarity inversion interval (=transition interval) of the NRZI code sequence at a larger value and to set the maximum value $T_{max}$ thereof at a smaller value. Specifically, with respect to the RLL code sequence, such constraint is imposed that the number of bits 0's existing between the bit 1 and the adjacent bit 1 should be limited to be d or more and k or less. In other words, such constraint is imposed that two logical 1's should be separated by a run of at least d consecutive zeros and any run of consecutive zeros has a length of k at most. The RLL code sequence mapped to satisfy this constraint is called (d,k;m,n) RLL code.

In the NRZI modulation, such operation is performed that the RLL code sequence is inverted only at the bit 1 and not inverted at the bit 0. In other words, the RLL code sequence is converted into an NRZI waveform using a transition for a 1 and no transition for a 0. By such modulation or conversion, the minimum distance between transitions of the NRZI code sequence becomes larger than that of the corresponding RLL code sequence. Therefore, compared with a case where the RLL code signal before NRZI modulation is recorded onto a recording medium and read the same therefrom, the waveform distortion of the reading signal is reduced in a case where the NRZI-modulated code signal is recorded onto a recording medium and reading therefrom. As a result, the error rate of the reading signal can be lowered. And if the same level of waveform distortion is acceptable in both the cases described above, the recording density can be heightened better in the case where the NRZI-modulated code signal is recorded onto a recording medium than in the case where the RLL code signal before NRZI modulation is recorded onto a recording medium.

In both the RLL coding and the NRZI modulation, it is required to meet the following conditions:

(1) The minimum transition distance $T_{min}$

When the recording density becomes higher, the minimum transition interval $T_{min}$ of the recording signal becomes smaller. Therefore, the reading pulses may be distorted due to the interference of the adjacent pulses, and as a result, the reading errors may arise. To reduce the distortion of the reading pulses from a high density recording medium and thereby reduce the reading errors, the minimum transition period of time $T_{min}$ should preferably be larger.

(2) The maximum transition distance $T_{max}$

The reading pulse from a recording medium can not be obtained during the period of no transition. And, within that period, the clock based on the reading pulse can not be generated, and therefore the clock may be inaccurate. On the other hand, when the transition interval of the recording signal is large, the DC component of the recording signal may become large. Therefore, the maximum transition period of time $T_{max}$ should preferably be smaller.

(3) DC component and low frequency component

Both the recording device and the reproducing device have AC coupling elements. The recording signal having the DC component or low frequency components is unfavorably distorted through the AC coupling elements of the recording device, and this distorted signal is recorded onto a recording medium. As a result, the reading signal from the recording medium, which is the recorded distorted signal, has inevitable distortion. Therefore, the DC component and low frequency components should preferably be smaller. The DC component or low frequency components of the recording signal is evaluated by using the DSV (digital sum value). The DSV is the sum of values with the bit "1" taken as "+1" and the bit "0" as "−1" from the specified start bit of the binary data sequence. When the absolute value of DSV is small, the DC component or low frequency components of the binary data sequence is small. On the other hand, the DC component or low frequency components of the each codeword is evaluated by using the CDS (codeword digital sum). The CDS is the sum of values with the bit "1" taken as "+1" and the bit "0" as "−1" from the first bit of the codeword to the last bit thereof. When the absolute value of CDS is small, the DC component or low frequency components of the codeword is small.

(4) Window margin $T_w$

The window margin $T_w$ indicates the allowable range of the phase shift of the reading signal due to interference thereof, noise, etc. The window margin $T_w$ is given by $(m/n)T$. Here, T refers to the length of 1-bit data before RLL-coding. The window margin $T_w$ should preferably be larger.

(5) Constraint length $L_c$

To optimize the $T_{min}$, the $T_{max}$ and the DSV, coding may be performed by referring to the codewords before dataword before or after thereof. The length of the codewords before thereof, datawords before or after to be referred to then is called "constraint length $L_c$." The larger the $L_c$ is, the more extensive the error propagates if the error occurs, and therefore, the $L_c$ should preferably be smaller.

In the Japanese Unexamined Patent Publication No. 52-128024, a technique to set the $T_{min}$ of the NRZI-modulated signal larger and to set the $T_{max}$ of the NRZI-modulated signal smaller is disclosed. According to the technique of the 52-128024, each 2-bit dataword serial/parallel converted from an input binary data stream is translated to a corresponding 3-bit codeword to generate a (1,7;2,3) RLL code. Then, the translated RLL code sequence is modulated to an NRZI code sequence. In such cases that the constraint d=1 is impossible to be satisfied in the above translation, a (1,7;4,6) RLL code is generated.

In the Japanese Examined Patent Publication No. 1-27510, a technique to reduce the DC component of the NRZI-modulated signal and to set the $T_{min}$ of the NRZI-modulated signal not smaller is disclosed. According to the technique disclosed in the No. 1-27510, the redundant data of 3 bits is inserted into between the adjacent 14-bit codewords cut out of an RLL code sequence one after another to genarate a (2,10;8,17) RLL code sequence. Then, this inserted code sequence is modulated to an NRZI code sequence. Here, the each redundant data is determined based on the necessity of the transition between the 14-bit codewords and the state of the tail bit of the immediately preceding 14-bit codeword. That is, the determination is made in such a way that the DC component of the NRZI-modulated signal can be reduced and the transition distance of the NRZI-modulated signal can not be set less than $T_{min}$.

In the Japanese Examined Patent Publication No. 5-34747, a translating or a coding method to set the $T_{min}$ at 1.5 T, set the $T_{max}$ at 4.5 T and set the $L_c$ at 5 T is disclosed. According to the technique disclosed in the No. 5-34747, the regulation of the coding is determined based on the arrangement of the input binary data sequence and the sequence is translated to the (2,7;i,2i) RLL code sequence.

In the Japanese Examined Patent Publication No. 4-77991, a technique to reduce the DC component of the NRZI-modulated signal and to set the $T_{min}$ of the NRZI-modulated signal larger is disclosed. According to the technique disclosed in the No. 4-77991, each 8-bit dataword serial/parallel converted from an input binary data stream is translated to a corresponding 14-bit codeword to generate a (1,8;8,14) RLL code. That is, the conversion is performed in such a way that the number of bits 0's existing between the bit 1 and the adjacent bit 1 of the coded data sequence can be 1 or more and 8 or less. The table for use in the coding of the 8-bit dataword to the 14-bit codeword is made ready for 2 different types, and depending on the DSV of the tail bit of the codeword coded immediately before, the codeword in either of the tables is selected. That is, the selection of the table is made in such a way that the DC component of the NRZI modulated recording signal can be reduced.

In the Japanese Unexamined Patent Publication No. 6-311042, a technique for heightening the recording density ratio DR (density ratio) by sufficiently reducing the DC component of the NRZI modulated recording signal and setting the $T_{min}$ of the NRZI modulated recording signal large is disclosed. According to this technique disclosed in the No. 6-311042, 8-bit datawords are cut out of the input binary data stream one after another and translated to respective 17-bit codewords. The translation or mapping is performed in such a way that the number of bits 0's existing between the bit 1 and the adjacent bit 1 can be 2 or more and 9 or less. The above-mentioned 17-bit codeword is generated by adding the redundant data of 2-bit to the 15-bit code corresponding to the original 8-bit dataword. According to the technique disclosed in the No. 6-311042, the table for use in the mapping of the 8-bit dataword to the 15-bit code is made ready for 2 different types, and the redundant data of 2-bits is made ready for 3 different types. The above-described 8-bit dataword is translated to the 17-bit codeword selected based on the DSV at the tail bit of the data coded immediately before from among six different types of codewords obtained by combining the 2 different types of tables and the 3 different types of redundant data. That is, by the 17-bit codeword selected in such a way that the DC component of the NRZI modulated code can be reduced, the above-described 8-bit dataword is replaced. Incidentally, according to the No. 6-311042, the above-described 8-bit data sequence may be translated to the (1,7;8,13) RLL code sequence.

SUMMARY OF THE INVENTION

In each of the techniques disclosed in the above described publications, such a technique is used that redundant data is added or the optimum translation table is selected from among different types of translation tables or the like according to the input dataword to reduce the DC component or low-frequency components of the NRZI modulated recording signal. As a result, however, there is a problem that the constraint related to the "d" or "k" would be eased and the $T_{min}$ would be set a smaller value or the $T_{max}$ would be set a larger value. Furthermore, there is a problem that as the number of bits of the codeword increases more, the $T_w$ would become set a smaller value.

For example, the (d,k;m,n)=(2,7;i,2i) RLL code disclosed in the Japanese Examined Patent Publication No. 5-34747 has the $T_w$ of 0.5 T, the $T_{min}$ of 1.5 T and the $T_{max}$ of 4.5 T. The (d,k;m,n)=(1,7;2i,3i) RLL code disclosed in the Japanese Unexamined Patent Publication No. 52-128024 has the $T_w$ of 0.67 T, the $T_{min}$ of 1.33 T and the $T_{max}$ of 5.36 T. And the EFM modulation of the (d,k;m,n)=(2,10;8,17) RLL code has the $T_w$ of 0.47 T, the $T_{min}$ of 1.41 T and the $T_{max}$ of 5.18 T.

In view of these problems, it is an object of the present invention to optimize the $T_w$, the $T_{min}$ and the $T_{max}$.

In order to achieve this object, according to the present invention, different types of look-up tables, each of which is able to be addressed by an m-bit dataword and read the corresponding n-bit codeword, are available. Also, according to the present invention, one look-up table is selected for each m-bit dataword according to the number of consecutive 0's at lower digits, which include the lowermost digit, of the n-bit codeword preceding thereto and the encoding is performed by using the selected look-up table. Furthermore, according to the present invention, the bit-pattern at lower digits, which include the lowermost digit, of a current n-bit codeword is replaced according to the number of consecutive 0's at upper digits, which include an uppermost digit, of the n-bit codeword following thereafter.

BRIEF DESCRIPTION OF THE DRAWINGS

In the accompanying drawings:

FIG. 3 shows the number of consecutive logical 0's at upper digits, which include an uppermost digit, of each 15-bit codeword versus the number of the 15-bit codewords satisfying the constraint of "d=2, k=9";

FIG. 4(a) shows a rule for selecting a look-up table for each 8-bit dataword according to the number of consecutive logical 0's at lower digits, which include a lowermost digit, of the 15-bit codeword preceding thereto and 4(b) shows a rule for replacing the specified bits at lower digits, which include a lowermost digit, of a 15-bit codeword according to a bit-pattern at upper digits, which include an uppermost digit, of the 15-bit codeword following thereafter;

FIG. 5 shows the number of 15-bit codewords satisfying the constraint of "d=2, k=9" versus the number of consecutive logical 0's at lower digits, which include a lowermost digit, of a 15-bit codeword preceding thereto;

FIG. 6 to FIG. 13 show stages of technique for completing look-up tables respectively;

FIG. 14 shows the components of the completed look-up tables by using a technique shown in FIGS. 6 to 13.

FIG. 15 shows an another technique for completing different look-up tables from that of FIG. 14; and, FIG. 16(a) shows another rule for selecting a look-up table for each 8-bit dataword according to the number of consecutive logical 0's at lower digits, which include a lowermost digit, of the 15-bit codeword preceding thereto and 16(b) shows another rule for replacing the specified bits at lower digits, which include a lowermost digit, of a 15-bit codeword according to a bit-pattern at upper digits, which include an uppermost digit, of the 15-bit codeword following thereafter.

DETAILED DESCRIPTION OF THE PREFERRED EMBODIMENT

1. Look-up Tables

Figure 1:
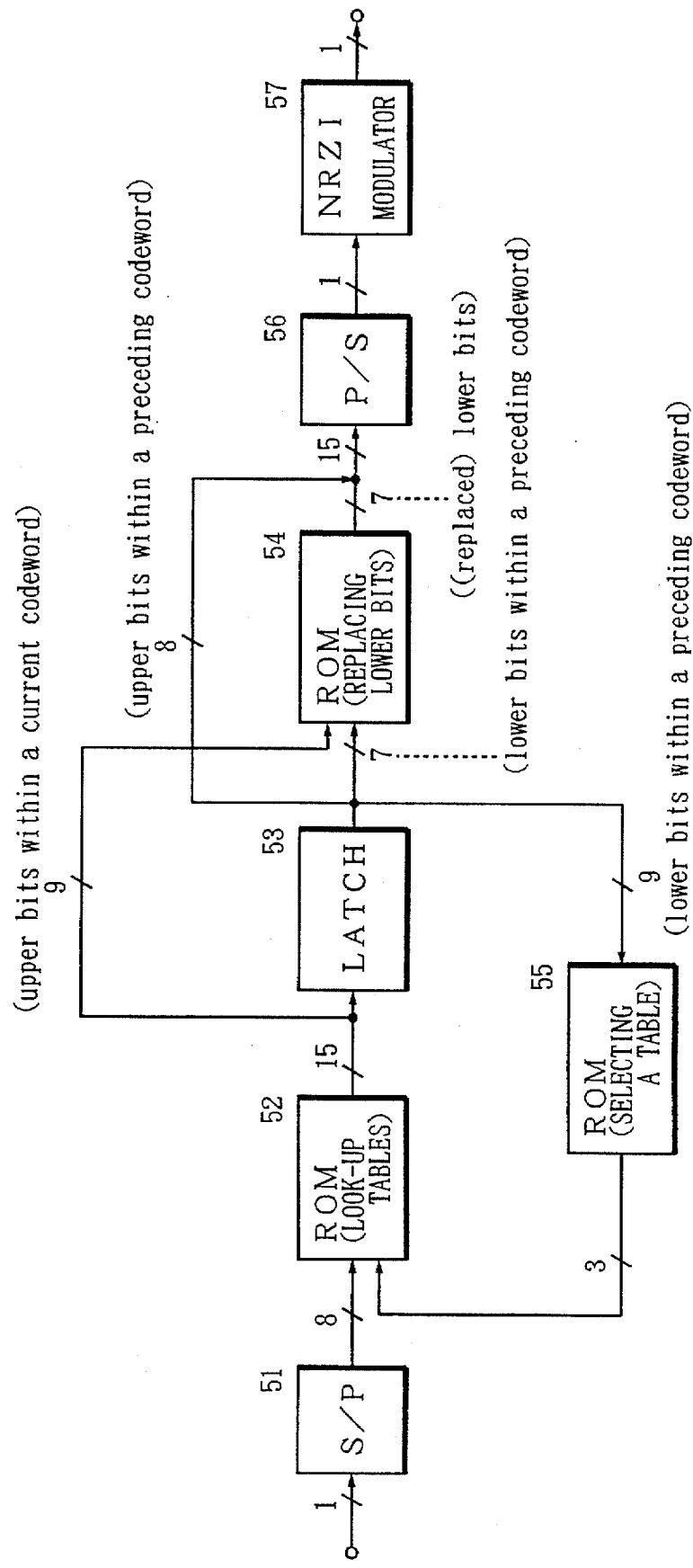
FIG. 1 is a block diagram of an encoding circuit of the first embodiment according to the present invention.

In the first place, description will be given to different types of look-up tables which are selectively refered to in the encoding and then to the replacement of lower digits within the preceding codeword.

1-1. Number of the Codewords (FIG. 3)

FIG. 3 shows the number of 15-bit codewords satisfying the constraint of "d=2, k=9" and having consecutive bit-zeros at left side digits, which include uppermost bit, thereof versus the number of the consecutive bit-zeros.

The number of 15-bit codewords having logical 1 at the uppermost bit thereof is 120. In other words, there are 120 15-bit codewords having no consecutive bit-zeros at the left side digits thereof. The number of 15-bit codewords having a bit-pattern of "01" at the upper digits thereof is 83. In other words, there are 83 15-bit codewords having only one consecutive bit-zero at the left side digits thereof. Similarly, the number of 15-bit codewords having a bit-pattern of "001" at the upper digits thereof is 57, that is, there are 57 15-bit codewords having 2 consecutive bit-zeros at the left side digits thereof. The number of 15-bit codewords having a bit-pattern of "0001" at the upper digits thereof is 39, that is, there are 39 15-bit codewords having 3 consecutive bit-zeros at the left side digits thereof. The number of 15-bit codewords having a bit-pattern of "00001" at the upper digits thereof is 27, that is, there are 27 15-bit codewords having 4 consecutive bit-zeros at the left side digits thereof. The number of 15-bit codewords having a bit-pattern of "000001" at the upper digits thereof is 19, that is, there are 19 15-bit codewords having 5 consecutive bit-zeros at the left side digits thereof. The number of 15-bit codewords having a bit-pattern of "0000001" at the upper digits thereof is 13, that is, there are 13 15-bit codewords having 6 consecutive bit-zeros at the left side digits thereof. The number of 15-bit codewords having a bit-pattern of "00000001" at the upper digits thereof is 9, that is, there are 9 15-bit codewords having 7 consecutive bit-zeros at the left side digits thereof. The number of 15-bit codewords having a bit-pattern of "000000001" at the upper digits thereof is 6, that is, there are 6 15-bit codewords having 8 consecutive bit-zeros at the left side digits thereof. The number of 15-bit codewords having a bit-pattern of "0000000001" at the upper digits thereof is 4, that is, there are 4 15-bit codewords having 9 consecutive bit-zeros at the left side digits thereof.

1-2. Constraint at a connection part (FIG. 4(a))

It is required that a binary code sequence composed of 15-bit codewords, each of which satisfies the constraint of "d=2 and k=9," should satisfy the constraint of "d=2 and k=9" even at each connection part between every two adjacent 15-bit codewords. Therefore, it is requested that conditions described below should be satisfied.

1-2-1. The lowermost bit of the preceding codeword ="1"

The number of consecutive logical 0's at upper digits including the uppermost digit of a 15-bit codeword are 2, 3, 4, 5, 6, 7, 8, or 9 where the lowermost digit of the 15-bit codeword preceding thereto is "1". In other words, bit-patterns formed from upper bits including the uppermost bit within a 15-bit codeword are "001" "0001", "00001", "000001", "0000001", "00000001", "000000001", or "0000000001" where the lowermost bit within the 15-bit codeword preceding thereto is "1". There are 174 15-bit codewords in total corresponding to the codewords having the bit-patterns formed from upperbits and these 174 15-bit codewords are refered to as group 1 in FIG. 5. Incidentally, there are 2 patterns of "0001" and "1001" at the lower bits of the preceding codeword for the case that the lowermost digit of the preceding codeword is "1".

1-2-2. A lower bit-pattern of the preceding codeword ="10"

The number of consecutive logical 0's at upper digits including the uppermost digit of a 15-bit codeword are 1, 2, 3, 4, 5, 6, 7, or 8 where lower 2 digits including the lowermost digit of the 15-bit codeword preceding thereto are "10". In other words, bit-patterns formed from upper bits including the uppermost bit within a 15-bit codeword are "01", "001", "0001", "00001", "000001", "0000001", "00000001", or "000000001" where lower 2 bits including the lowermost bit within the 15-bit codeword preceding thereto are "10". There are 253 15-bit codewords in total corresponding to the codewords having the bit-patterns formed from upperbits and these 253 15-bit codewords are refered to as group 2 in FIG. 5. Incidentally, there are 2 patterns of "00010" and "10010" at the lower bits of the preceding codeword for the case that the bit-pattern of lower 2 digits of the preceding codeword is "10".

1-2-3. A lower bit-pattern of the preceding codeword ="100"

The number of consecutive logical 0's at upper digits including the uppermost digit of a 15-bit codeword are 0, 1, 2, 3, 4, 5, 6, or 7 where lower 3 digits including the lowermost digit of the 15-bit codeword preceding thereto are "100". In other words, bit-patterns formed from upper bits including the uppermost bit within a 15-bit codeword are "1", "01", "001", "0001", "00001", "000001", "0000001", or "00000001" where lower 3 bits including the lowermost bit within the 15-bit codeword preceding thereto are "100". There are 367 15-bit codewords in total corresponding to the codewords having the bit-patterns formed from upperbits and these 367 15-bit codewords are refered to as group 3 in FIG. 5.

1-2-4. A lower bit-pattern of the preceding codeword ="1000"

The number of consecutive logical 0's at upper digits including the uppermost digit of a 15-bit codeword are 0, 1, 2, 3, 4, 5, or 6 where lower 4 digits including the lowermost digit of the 15-bit codeword preceding thereto are "1000". In other words, bit-patterns formed from upper bits including the uppermost bit within a 15-bit codeword are "1", "01", "001", "0001", "00001", "000001", or "0000001" where lower 4 bits including the lowermost bit within the 15-bit codeword preceding thereto are "1000". There are 358 15-bit codewords in total corresponding to the codewords having the bit-patterns formed from upperbits and these 358 15-bit codewords are refered to as group 4 in FIG. 5.

1-2-5. A lower bit-pattern of the preceding codeword ="10000"

The number of consecutive logical 0's at upper digits including the uppermost digit of a 15-bit codeword are 0, 1, 2, 3, 4, or 5 where lower 5 digits including the lowermost digit of the 15-bit codeword preceding thereto are "10000". In other words, bit-patterns formed from upper bits including the uppermost bit within a 15-bit codeword are "1", "01", "001", "0001", "00001", or "000001" where lower 5 bits including the lowermost bit within the 15-bit codeword preceding thereto are "10000". There are 345 15-bit codewords in total corresponding to the codewords having the bit-patterns formed from upperbits and these 345 15-bit codewords are refered to as group 5 in FIG. 5.

1-2-6. A lower bit-pattern of the preceding codeword ="100000"

The number of consecutive logical 0's at upper digits including the uppermost digit of a 15-bit codeword are 0, 1, 2, 3, or 4 where lower 6 digits including the lowermost digit of the 15-bit codeword preceding thereto are "100000". In other words, bit-patterns formed from upper bits including the uppermost bit within a 15-bit codeword are "1", "01", "001", "0001", or "00001" where lower 6 bits including the lowermost bit within the 15-bit codeword preceding thereto are "100000". There are 326 15-bit codewords in total corresponding to the codewords having the bit-patterns formed from upperbits and these 326 15-bit codewords are refered to as group 6 in FIG. 5.

1-2-7. A lower bit-pattern of the preceding codeword ="1000000"

The number of consecutive logical 0's at upper digits including the uppermost digit of a 15-bit codeword are 0, 1, 2, or 3 where lower 7 digits including the lowermost digit of the 15-bit codeword preceding thereto are "1000000". In other words, bit-patterns formed from upper bits including the uppermost bit within a 15-bit codeword are "1", "01", "001", or "0001" where lower 7 bits including the lowermost bit within the 15-bit codeword preceding thereto are "1000000". There are 299 15-bit codewords in total corresponding to the codewords having the bit-patterns formed from upperbits and these 299 15-bit codewords are refered to as group 7 in FIG. 5.

1-2-8. A lower bit-pattern of the preceding codeword ="10000000"

The number of consecutive logical 0's at upper digits including the uppermost digit of a 15-bit codeword are 0, 1 or 2 where lower 8 digits including the lowermost digit of the 15-bit codeword preceding thereto are "10000000". In other words, bit-patterns formed from upper bits including the uppermost bit within a 15-bit codeword are "1", "01" or "001" where lower 8 bits including the lowermost bit within the 15-bit codeword preceding thereto are "10000000". There are 260 15-bit codewords in total corresponding to the codewords having the bit-patterns formed from upperbits and these 260 15-bit codewords are refered to as group 8 in FIG. 5.

1-2-9. A lower bit-pattern of the preceding codeword ="100000000"

The number of consecutive logical 0's at upper digits including the uppermost digit of a 15-bit codeword are 0 or 1 where lower 9 digits including the lowermost digit of the 15-bit codeword preceding thereto are "100000000". In other words, bit-patterns formed from upper bits including the uppermost bit within a 15-bit codeword are "1" or "01" where lower 9 bits including the lowermost bit within the 15-bit codeword preceding thereto are "100000000". There are 203 15-bit codewords in total corresponding to the codewords having the bit-patterns formed from upperbits and these 203 15-bit codewords are refered to as group 9 in FIG. 5.

1-2-10. A lower bit-pattern of the preceding codeword ="1000000000"

The number of consecutive logical 0's at upper digits including the uppermost digit of a 15-bit codeword is 0 where lower 10 digits including the lowermost digit of the 15-bit codeword preceding thereto are "1000000000". In other words, the uppermost bit of a 15-bit codeword is "1" where lower 10 bits including the lowermost bit within the 15-bit codeword preceding thereto are "1000000000". There are 120 15-bit codewords in total corresponding to the codewords having the bit-patterns formed from upperbits and these 120 15-bit codewords are refered to as group 10 in FIG. 5.

1-3. Look-up tables used in the first embodiment

As described above, the ten groups are prepared according to the types of the preceding codewords. On the other hand, it is required that the look-up table, which is used for translating 256 types of 8-bit datawords to different types of 15-bit codewords, should have 256 types of 15-bit codewords. In other words, the above groups of 1, 2, 9, and 10 are lacking of the number of 15-bit codewords. Each group is filled with 15-bit codewords as described below.

1-3-1. The group 1 (FIG. 6 and FIG. 4(b))

The group 1 having 174 15-bit codewords has 82 less 15-bit codewords than the required look-up table having 256 15-bit codewords. Hence, the group 1 can become completed look-up table having 256 15-bit codewords by adding 82 15-bit codewords having a bit-pattern of "01" at the upper digits thereof. Then, the 82 15-bit codewords having a bit-pattern of "01" at the upper digits thereof are removed from both the group 2 and the group 4. Consequently, the group 2 has 171 15-bit codewords, and the group 4 has 276 15-bit codewords.

As shown in FIG. 4(b), where a 15-bit codeword having a bit-pattern of "01" at the upper digits thereof is read from a look-up table corresponding to the group 1, bit-patterns of "0001" and "1001", each of which may be arranged at the lower digits of the 15-bit codeword preceding thereto, is replaced by bit-patterns of "0010" and "1000" respectively.

1-3-2. The group 2 (FIG. 7 and FIG. 4(b))

The subtracted (removed the 82 15-bit codewords) group 2 having 171 15-bit codewords has 85 less 15-bit codewords than the required look-up table having 256 15-bit codewords. Hence, the group 2 can become the completed look-up table having 256 15-bit codewords by adding 85 15-bit codewords having a bit "1" at the uppermost digit thereof. Then, the 85 15-bit codewords having a bit "1" at the uppermost digit thereof are removed from both the group 3 and the group 5. Consequently, the group 3 has 282 15-bit codewords, and the group 5 has 260 15-bit codewords.

As shown in FIG. 4(b), where a 15-bit codeword having a bit "1" at the uppermost digit thereof is read from a look-up table corresponding to the group 2, bit-patterns of "00010" and "10010", each of which may be arranged at the lower digits of the 15-bit codeword preceding thereto, is replaced by bit-patterns of "00100" and "10000" respectively.

1-3-3. The groups 3 to 8

The groups 3, 4, 5, 6, 7, and 8 have not less than 256 15-bit codewords at this stage.

1-3-4. The group 9 (FIG. 8 and FIG. 4(b))

The group 9 having 203 15-bit codewords has 53 less 15-bit codewords than the required look-up table having 256 15-bit codewords. Hence, the group 9 can become the completed look-up table having 256 15-bit codewords by adding 53 15-bit codewords having a bit-pattern of "001" at the upper digits thereof. Then, the 53 15-bit codewords having a bit-pattern of "001" at the upper digits thereof are removed from the group 6. Consequently, the group 6 has 273 15-bit codewords.

As shown in FIG. 4(b), where a 15-bit codeword having a bit-pattern of "001" at the upper digits thereof is read from a look-up table corresponding to the group 9, a bit-pattern of "000000", which may be arranged at the lower digits of the 15-bit codeword preceding thereto, is replaced by a bit-pattern of "100000".

1-3-5. The group 10 (FIG. 9 to FIG. 12)

The group 10 having 120 15-bit codewords has 136 less 15-bit codewords than the required look-up table having 256 15-bit codewords. Firstly, the group 10 is added 57 15-bit codewords having a bit-pattern of "001" at the upper digits thereof, thereby, the group 10 has 177 15-bit codewords. Secondly, the group 10 is added 39 15-bit codewords having a bit-pattern of "0001" at the upper digits thereof, thereby, the group 10 has 216 15-bit codewords. Thirdly, the group 10 is added 27 15-bit codewords having a bit-pattern of "00001" at the upper digits thereof, thereby, the group 10 has 243 15-bit codewords. Fourthly, the group 10 is added 13 15-bit codewords having a bit-pattern of "000001" at the upper digits thereof to become the completed look-up table having 256 15-bit codewords.

Hence, the 53 15-bit codewords having a bit-pattern of "001" at the upper digits thereof had been removed from the group 6 to add to the group 9, then at this stage, the 4 15-bit codewords having a bit-pattern of "001" at the upper digits thereof are removed from the group 6. Consequently, the group 6 has 269 15-bit codewords as shown in FIG. 9. Then, the 39 15-bit codewords having a bit-pattern of "0001" at the upper digits thereof are removed from the group 7. Consequently, the group 7 has 260 15-bit codewords as shown in FIG. 10. Then, the 27 15-bit codewords having a bit-pattern of "00001" at the upper digits thereof are removed from the group 6. Consequently, the group 6 has 242 15-bit codewords as shown in FIG. 11. Then, the 13 15-bit codewords having a bit-pattern of "000001" at the upper digits thereof are removed from the group 3. Consequently, the group 3 has 269 15-bit codewords as shown in FIG. 12.

As shown in FIG. 9, where a 15-bit codeword having a bit-pattern of "001" at the upper digits thereof is read from a look-up table corresponding to the group 10, upper 10 bits of the 15-bit codeword preceding thereto is replaced by a bit-pattern of "1000100000". As shown in FIG. 10, where a 15-bit codeword having a bit-pattern of "0001" at the upper digits thereof is read from a look-up table corresponding to the group 10, upper 10 bits of the 15-bit codeword preceding thereto is replaced by a bit-pattern of "1001000000". As shown in FIG. 11, where a 15-bit codeword having a bit-pattern of "00001" at the upper digits thereof is read from a look-up table corresponding to the group 10, upper 9 bits of the 15-bit codeword preceding thereto is replaced by a bit-pattern of "100100000". As shown in FIG. 12, where a 15-bit codeword having a bit-pattern of "000001" at the upper digits thereof is read from a look-up table corresponding to the group 10, upper 9 bits of the 15-bit codeword preceding thereto is replaced by a bit-pattern of "100000100".

1-3-6. The group 6 (FIG. 13)

As described above, the 53 15-bit codewords having a bit-pattern of "001" at the upper digits thereof had been removed from the group 6 in order to add to the group 9, and then, the 4 15-bit codewords having a bit-pattern of "001" at the upper digits thereof are removed from the group 6 in order to add to the group 10. Consequently, the group 6 has 269 15-bit codewords at this stage. Farthermore, the 27 15-bit codewords having a bit-pattern of "00001" at the upper digits thereof are removed from the group 6 in order to add to the group 10. Consequently, the group 6 has 242 15-bit codewords.

Then, as shown in FIG. 13, the group 6 is added 14 15-bit codewords having a bit-pattern of "000001" at the upper digits thereof, thereby, the group 10 has 177 15-bit codewords.

Hence, the 14 15-bit codewords having a bit-pattern of "000001" at the upper digits thereof had been removed from the group 3 to add to the group 10, then at this stage, the 1 15-bit codewords having a bit-pattern of "000001" at the upper digits thereof are removed from the group 3. Consequently, the group 3 has 268 15-bit codewords.

As shown in FIG. 13, where a 15-bit codeword having a bit-pattern of "000001" at the upper digits thereof is read from a look-up table corresponding to the group 6, upper 6 bits of the 15-bit codeword preceding thereto is replaced by a bit-pattern of "100100".

1-3-7. The resultant tables (FIG. 14)

Ten groups are thus completed. The components of each group are shown in FIG. 14.

The group 1 includes such 15-bit codewords that: all of the 15-bit codewords whose upper digits including the uppermost digit are comprised of 2, 3, 4, 5, 6, 7, 8, and 9 consecutive 0's; and, a part of the 15-bit codewords whose upper digits including the uppermost digit are comprised of 1 consecutive 0's. The table 0, which consists of 0a, 0b, 0c, 0d, 0e, 0f, 0g, and 0h, is formed by using the group 1.

The group 2 includes such 15-bit codewords that: all of the 15-bit codewords whose upper digits including the uppermost digit are comprised of 2, 3, 4, 5, 6, 7, and 8 consecutive 0's; and, a part of the 15-bit codewords whose upper digits including the uppermost digit are comprised of 0 or 1 consecutive 0's. The table 1, which consists of 1a, 1b, 1c, 1d, 1e, 1f, 1g, and 1h, is formed by using the group 2.

The group 3 includes such 15-bit codewords that: all of the 15-bit codewords whose upper digits including the uppermost digit are comprised of 1, 2, 3, 4, 6, and 7 consecutive 0's; and, a part of the 15-bit codewords whose upper digits including the uppermost digit are comprised of 0 or 5 consecutive 0's. The table 2, which consists of 2a, 2b, 2c, 2d, 2e, 2f, 2g, and 2h, is formed by using the group 3.

The group 4 includes such 15-bit codewords that: all of the 15-bit codewords whose upper digits including the uppermost digit are comprised of 0, 2, 3, 4, 5, and 6 consecutive 0's; and, a part of the 15-bit codewords whose upper digits including the uppermost digit are comprised of 1 consecutive 0's. The table 3, which consists of 3a, 3b, 3c, 3d, 3e, 3f, 3g, and 3h, is formed by using the group 4.

The group 5 includes such 15-bit codewords that: all of the 15-bit codewords whose upper digits including the uppermost digit are comprised of 1, 2, 3, 4, and 5 consecutive 0's; and, a part of the 15-bit codewords whose upper digits including the uppermost digit are comprised of 0 consecutive 0's. The table 4, which consists of 4a, 4b, 4c, 4d, 4e, 4f, 4g, and 4h, is formed by using the group 5.

The group 6 includes such 15-bit codewords that: all of the 15-bit codewords whose upper digits including the uppermost digit are comprised of 0, 1, and 3 consecutive 0's; and, a part of the 15-bit codewords whose upper digits including the uppermost digit are comprised of 5 consecutive 0's. The table 5, which consists of 5a, 5b, 5c, 5d, 5e, 5f, 5g, and 5h, is formed by using the group 6.

The group 7 includes all of the 15-bit codewords whose upper digits including the uppermost digit are comprised of 0, 1, and 2 consecutive 0's. The group 8 includes all of the 15-bit codewords whose upper digits including the uppermost digit are comprised of 0, 1, and 2 consecutive 0's. The group 9 includes such 15-bits codewords that: all of the 15-bit codewords whose upper digits including the uppermost digit are comprised of 0 and 1 consecutive 0's; and, a part of the 15-bit codewords whose upper digits including the uppermost digit are comprised of 2 consecutive 0's. The table 6, which consists of 6a, 6b, 6c, 6d, 6e, 6f, 6g, and 6h, is formed by using the group 7, 8, or 9.

The group 10 includes such 15-bit codewords that: all of the 15-bit codewords whose upper digits including the uppermost digit are comprised of 0, 2, 3, and 4 consecutive 0's; and, a part of the 15-bit codewords whose upper digits including the uppermost digit are comprised of 5 consecutive 0's. The table 7, which consists of 7a, 7b, 7c, 7d, 7e, 7f, 7g, and 7h, is formed by using the group 10.

2. An encoding circuit

According to the present invention, an 8-bit dataword cut out of an input binary data stream one after another is encoded to a 15-bit codeword by reffering to the selected look-up table from among several look-up tables. Here, the look-up table is selected for translating each 8-bit dataword into a 15-bit dataword according to a number of consecutive logical 0's at lower digits of the preceding 15-bit codeword as shown in FIG. 4(a). Furthermore, according to the present invention, the bit-pattern at the lower digits, which include a lowermost digit, of a current 15-bit codeword is replaced according to the number of consecutive logical 0's at upper digits, which include an uppermost digit, of the following 15-bit codeword as shown in FIG. 4(b).

In FIG. 1, an input binary data stream supplied to an input terminal is input to a serial-to-parallel converter 51, and 8-bit parallel data (=dataword) is output therefrom. Then, the 8-bit parallel data inputs to a look-up table ROM 52. The look-up table ROM 52, which has the look-up tables 0 (0a, 0b, 0c, 0d, 0e, 0f, 0g, and 0h) to 7 (7a, 7b, 7c, 7d, 7e, 7f, 7g, and 7h), is also addressed by a 3-bit selecting-code output from a selection-table ROM 55, and outputs a 15-bit codeword to a latch circuit 53. The latch circuit 53 generates a preceding 15-bit codeword. The lower 9 bits of the preceding 15-bit codeword output from the latch circuit 53 is input to the selection-table ROM 55 and the selection-table ROM 55 outputs the 3-bit selecting-code to the look-up table ROM 52. The 3-bit selecting-code selects one look-up table from among the look-up tables 0 to 7. That is, where the number of the consecutive logical 0's at the lower digits including the lowermost digit of the preceding 15-bit codeword is "0", table 0 is selected. Similarlly, the table 1 is selected where the above number is "1". Similarlly, the table 2 is selected where the above number is "2". Similarlly, the table 3 is selected where the above number is "3". Similarlly, the table 4 is selected where the above number is "4". Similarlly, the table 5 is selected where the above number is "5". Similarlly, the table 6 is selected where the above number is "6", "7", or "8". Similarlly, the table 7 is selected where the above number is "9".

On the other hand, the lower 7 bits of the preceding 15-bit codeword inputs to a replacement-table ROM 54. The replacement-table ROM 54 is also addressed by the upper 9 bits of the current 15-bit codeword output from the look-up table ROM 52, and outputs a 7-bit code replaced or not replaced according to the upper 9 bits of the current 15-bit codeword to a lower-bit-port of a parallel-to-serial converter 56. Also, the upper 8 bits of the preceding 15-bit codeword inputs to an upper-bit-port of the parallel-to-serial converter 56. The parallel-to-serial converter 56 outputs a binary code sequence to an NRZI modulator 57. The NRZI modulator 57 modulates the binary code sequence, and the NRZI-modulated code sequence is output from the NRZI modulator 57 to an output terminal.

3. A Decoding circuit

Figure 2:
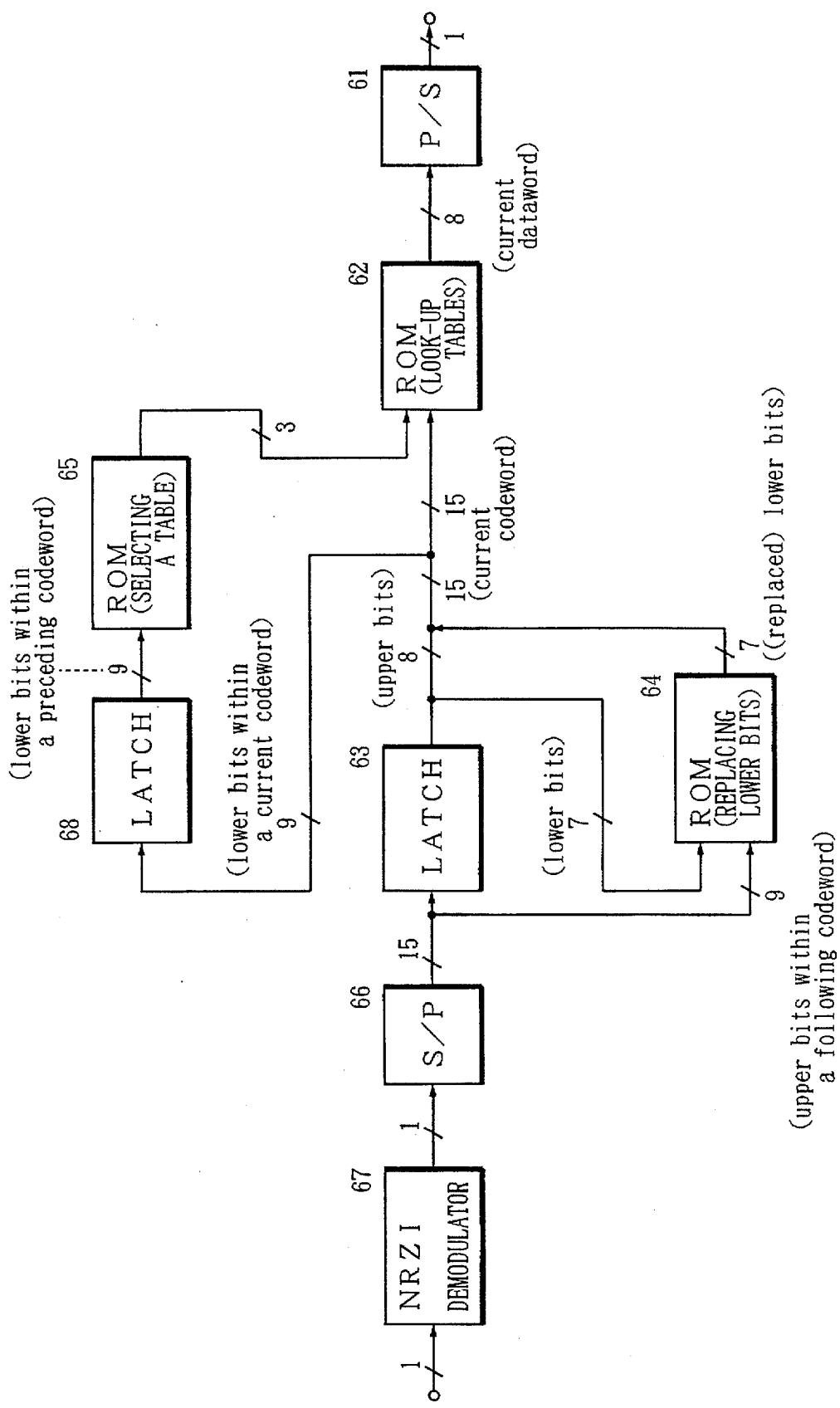
FIG. 2 is a block diagram of a decoding circuit of the first embodiment according to the present invention.

In FIG. 2, an input binary code sequence supplied to an input terminal is input to an NRZI demodulator 67 and demodulated to an RLL code sequence. The RLL code sequence is input to a serial-to-parallel converter 66, and 15-bit parallel code (=a following codeword) is generated therefrom. The 15-bit codeword output from the serial-to-parallel converter 66 is input to a latch circuit 63. On the other hand, the upper 9 bits of the 15-bit codeword (=a following codeword) output from the serial-to-parallel converter 66 is input to an inverse replacement-table ROM 64. The inverse replacement-table ROM 64 is also addressed by the lower 7 bits of the 15-bit codeword (=a current codeword) output from the latch circuit 63, and generates the replaced or not replaced 7 bits code according to the upper 9 bits of the 15-bit codeword output from the serial-to-parallel converter 66. The replaced or not replaced 7 bits code is added to the upper 8 bits code of the 15-bit codeword output from the latch circuit 63 to generate a 15-bit codeword (=a current codeword). The added 15-bit codeword is input to an inverse look-up table ROM 62, which has inverse look-up tables 0 (0a, 0b, 0c, 0d, 0e, 0f, 0g, 0h) to 7 (7a, 7b, 7c, 7d, 7e, 7f, 7g, 7h).

On the other hand, the lower 9 bits of the added 15-bit codeword is input to a latch circuit 68. The latch circuit 68 outputs 9 bits code of the lower 9 bits of the preceding 15-bit codeword to a selection-table ROM 65. The selection-table ROM 65 outputs the 3-bit selecting-code to the look-up table ROM 62. This 3-bit selecting-code selects one inverse look-up table from among inverse look-up tables 0 to 7. The inverse look-up table ROM 62 is also addressed by the current 15-bit codeword composed of the upper 8 bits code output from the latch circuit 63 and the lower 7 bits code output from the inverse replacement-table ROM 64. Then, the inverse look-up table ROM 62 outputs a corresponding 8-bit dataword to a parallel-to-serial converter 61 to convert to a binary data sequence.

4. Look-up tables used in the second embodiment

As described in the "1.2 Constraint at a connection part," ten groups are prepared according to the types of the preceding codewords. Then, in the "1.3 Look-up tables used in the first embodiment," look-up tables are completed from eight groups. In this section, a method for providing another types of look-up tables 0 to 5 will be described by reffering to FIG. 15 and FIG. 16.

4-1. The group 2

The group 2 having 253 15-bit codewords has 3 less 15-bit codewords than the required look-up table having 256 15-bit codewords. Then, the group 2 is filled with 3 15-bit codewords having 9 consecutive logical 0's thereof from among the 120 15-bit codewords having a bit "1" at the uppermost digit thereof to become the completed look-up table having 256 15-bit codewords as indicated a) in FIG. 13. Then, the 3 15-bit codewords having a bit "1" at the uppermost digit thereof are removed from both the group 3 and the group 5. Consequently, the group 3 has 364 15-bit codewords as indicated (1) in FIG. 13., and the group 5 has 342 15-bit codewords as indicated (2) in FIG. 13.

As shown in FIG. 16(b), where a 15-bit codeword having a bit "1" at the uppermost digit thereof is read from a look-up table corresponding to the group 2, bit-patterns of "00010" and "10010", each of which may be arranged at the lower digits of the 15-bit codeword preceding thereto, is replaced by bit-patterns of "00100" and "10000" respectively.

4-2. The group 1

The group 1 having 174 15-bit codewords has 82 less 15-bit codewords than the required look-up table having 256 15-bit codewords. Hence, the group 1 is added 83 15-bit codewords having a bit-pattern of "01" at the upper digits thereof as indicated b) in FIG. 15., thereby the problem of the group 1 is resolved. Then, the 83 15-bit codewords having a bit-pattern of "01" at the upper digits thereof are removed from the group 3, the group 4, and the group 5. Consequently, the group 3 has 281 15-bit codewords as indicated (3) in FIG. 15., the group 4 has 275 15-bit codewords as indicated (4) in FIG. 15., and the group 5 has 259 15-bit codewords as indicated (5) in FIG. 15.

As shown in FIG. 16(b), where a 15-bit codeword having a bit-pattern of "01" at the upper digits thereof is read from a look-up table corresponding to the group 1, bit-patterns of "00001", "01001", and "10001", each of which may be arranged at the lower digits of the 15-bit codeword preceding thereto, is replaced by bit-patterns of "00100", "01000", and "10000" respectively.

4-3. The groups 3 to 8

The groups 3, 4, 5, 6, 7, and 8 have not less than 256 15-bit codewords at this stage.

4-4. The group 9

The group 9 having 203 15-bit codewords has 53 less 15-bit codewords than the required look-up table having 256 15-bit codewords. Then, the group 9 is added 57 15-bit codewords having a bit-pattern of "001" at the upper digits thereof as indicated c) in FIG. 15., thereby the problem of the group 9 is resolved. Then, the 57 15-bit codewords having a bit-pattern of "001" at the upper digits thereof are removed from the group 6. Consequently, the group 6 has 269 15-bit codewords at this stage.

As shown in FIG. 16(b), where a 15-bit codeword having a bit-pattern of "001" at the upper digits thereof is read from a look-up table corresponding to the group 9, a bit-pattern of "100000000", which may be arranged at the lower digits of the 15-bit codeword preceding thereto, is replaced by a bit-pattern of "100100000".

4-5. The group 10

The group 10 having 120 15-bit codewords has 136 less 15-bit codewords than the required look-up table having 256 15-bit codewords. Firstly, the group 10 is added 57 15-bit codewords having a bit-pattern of "001" at the upper digits thereof, thereby, the group 10 has 177 15-bit codewords. Secondly, the group 10 is added 39 15-bit codewords having a bit-pattern of "0001" at the upper digits thereof as indicated d) in FIG. 15., thereby the group 10 has 216 15-bit codewords. Thirdly, the group 10 is added 27 15-bit codewords having a bit-pattern of "00001" at the upper digits thereof as indicated e) in FIG. 15., thereby, the group 10 has 243 15-bit codewords. Fourthly, the group 10 is added 13 15-bit codewords having a bit-pattern of "0000001" at the upper digits thereof and added 9 15-bit codewords having a bit-pattern of "00000001" at the upper digits thereof as indicated f) in FIG. 15., thereby the problem of the group 10 is resolved.

Then, the 57 15-bit codewords having a bit-pattern of "001" at the upper digits thereof should be removed from the group 6 as indicated c) in FIG. 15. However, these 57 codewords had already been removed from the group 6 when the number of codewords belonging to the group 9 increased in the "4-4. The group 9", and the group 6 has 269 15-bit codewords. Then, the 39 15-bit codewords having a bit-pattern of "0001" at the upper digits thereof are removed from the group 7 as indicated d) in FIG. 15. Consequently, the group 7 has 260 15-bit codewords. Then, the 27 15-bit codewords having a bit-pattern of "00001" at the upper digits thereof are removed from the group 6 as indicated e) in FIG. 15. Consequently, the group 6 has 242 15-bit codewords. Then, the 13 15-bit codewords having a bit-pattern of "0000001" at the upper digits and the 9 15-bit codewords having a bit-pattern of "00000001" at the upper digits thereof are removed from the group 3. Consequently, the group 3 has 259 15-bit codewords.

As shown in FIG. 16(b), where a 15-bit codeword having a bit-pattern of "001" at the upper digits thereof is read from a look-up table corresponding to the group 10, lower 10 bits of the 15-bit codeword preceding thereto, "1000000000", is replaced by a bit-pattern of "1000100000". Similarly, where a 15-bit codeword having a bit-pattern of "0001" at the upper digits thereof is read from a look-up table corresponding to the group 10, lower 10 bits of the 15-bit codeword preceding thereto, "1000000000", is replaced by a bit-pattern of "1001000000". Similarly, where a 15-bit codeword having a bit-pattern of "00001" at the upper digits thereof is read from a look-up table corresponding to the group 10, lower 10 bits of the 15-bit codeword preceding thereto, "1000000000", is replaced by a bit-pattern of "1000100000". Similarly, where a 15-bit codeword having a bit-pattern of "0000001" at the upper digits thereof or a 15-bit codeword having a bit-pattern of "00000001" at the upper digits thereof is read from a look-up table corresponding to the group 10, lower 10 bits of the 15-bit codeword preceding thereto, "1000000000", is replaced by a bit-pattern of "1000000100".

4-6. The group 6

As described above, the 57 15-bit codewords having a bit-pattern of "001" at the upper digits thereof are removed from the group 6 in order to add to the group 9 and 10. Consequently, the group 6 has 269 15-bit codewords at this stage. Farthermore, the 27 15-bit codewords having a bit-pattern of "00001" at the upper digits thereof are removed from the group 6 in order to add to the group 10. Consequently, the group 6 has 242 15-bit codewords.

Then, as indicated f) in FIG. 15, the group 6 is added 13 15-bit codewords having a bit-pattern of "0000001" at the upper digits thereof and added 9 15-bit codewords having a bit-pattern of "00000001" at the upper digits thereof, thereby, the group 6 has 264 15-bit codewords as indicated (6) in FIG. 15 and the problem of the group 6 is resolved.

Then, the 13 15-bit codewords having a bit-pattern of "0000001" at the upper digits thereof and the 9 15-bit codewords having a bit-pattern of "00000001" at the upper digits thereof are removed from the group 3 to add to the group 6. However, the removement of the 22 15-bit codeword from the group 3 had already been performed, therefore, the group 3 has 259 15-bit codewords as indicated f) in FIG. 15.

As shown in FIG. 16, where a 15-bit codeword having a bit-pattern of "0000001" at the upper digits thereof or a 15-bit codeword having a bit-pattern of "00000001" at the upper digits thereof is read from a look-up table corresponding to the group 6, lower 5 bits "00000" of the 15-bit codeword preceding thereto is replaced by a bit-pattern of "00100".

4-7. The resultant tables

Ten groups are thus completed. The components of each group are shown at the right side column in FIG. 16.

The group 1 includes all of the 15-bit codewords whose upper digits including the uppermost digit are comprised of 1, 2, 3, 4, 5, 6, 7, 8, and 9 consecutive 0's. The table 0, which consists of 0a, 0b, 0c, 0d, 0e, 0f, 0g, and 0h, of the second embodiment is formed by using the group 1.

The group 2 includes such 15-bit codewords that: all of the 15-bit codewords whose upper digits including the uppermost digit are comprised of 1, 2, 3, 4, 5, 6, 7, and 8 consecutive 0's; and, a part of the 15-bit codewords whose upper digits including the uppermost digit is comprised of 0 consecutive 0's. The table 1, which consists of 1a, 1b, 1c, 1d, 1e, 1f, 1g, and 1h, of the second embodiment is formed by using the group 2.

The group 3 includes such 15-bit codewords that: all of the 15-bit codewords whose upper digits including the uppermost digit are comprised of 2, 3, 4, and 5 consecutive 0's; and, a part of the 15-bit codewords whose upper digits 0's including the uppermost digit is comprised of 0 consecutive 0's. The table 2, which consists of 2a, 2b, 2c, 2d, 2e, 2f, 2g, and 2h, of the second embodiment may be formed by using the group 3.

The group 4 includes such 15-bit codewords that: all of the 15-bit codewords whose upper digits including the uppermost digit are comprised of 2, 3, 4, 5, and 6 consecutive 0's; and, a part of the 15-bit codewords whose upper digits including the uppermost digit is comprised of 0 consecutive 0's. The group 4 is equal to the group 3. The table 2 of the second embodiment may be formed by using the group 4.

The group 5 includes such 15-bit codewords that: all of the 15-bit codewords whose upper digits including the uppermost digit are comprised of 2, 3, 4, or 5 consecutive 0's; and, a part of the 15-bit codewords whose upper digits including the uppermost digit is comprised of 0 consecutive 0's. The group 5 is equal to the group 3 and the group 4. The table 2 of the second embodiment may be formed by using the group 5.

The group 6 includes all of the 15-bit codewords whose upper digits including the uppermost digit are comprised of 0, 1, 3, 6, and 7 consecutive 0's. The table 4, which consists of 4a, 4b, 4c, 4d, 4e, 4f, 4g, and 4h, of the second embodiment is formed by using the group 6.

The group 7 includes all of the 15-bit codewords whose upper digits including the uppermost digit are comprised of 0, 1, and 2 consecutive 0's. The group 8 includes all of the 15-bit codewords whose upper digits including the uppermost digit are comprised of 0, 1, and 2 consecutive 0's. The group 9 includes all of the 15-bit codewords whose upper digits including the uppermost digit are comprised of 0, 1, and 2 consecutive 0's. The table 5, which consists of 5a, 5b, 5c, 5d, 5e, 5f, 5g, and 5h, of the second embodiment is formed by using the group 7, 8, or 9.

The group 10 includes all of the 15-bit codewords whose upper digits including the uppermost digit are comprised of 0, 2, 3, 4, 6, and 7 consecutive 0's. The table 3, which consists of 3a, 3b, 3c, 3d, 3e, 3f, 3g, and 3h, of the second embodiment is formed by using the group 10.

The look-up tables of the second embodiment is selected according to the rule shown in FIG. 16(b). That is, where the number of the consecutive logical 0's at the lower digits including the lowermost digit of the preceding 15-bit codeword is "0", table 0 is selected. Similarlly, the table 1 is selected where the above number is "1". Similarlly, the table 2 is selected where the above number is "2", "3" or "4". Similarlly, the table 3 is selected where the above number is "9". Similarlly, the table 4 is selected where the above number is "5". Similarlly, the table 5 is selected where the above number is "6" or "7".

An encoding circuit and a decoding circuit are also comprised as described in the first embodiment.

TABLE 0

(First Embodiment)

| Source | Conversion Code | CDS | Polarity |
|---|---|---|---|
| 0 | 000000000100000 | −3 | 1 |
| 1 | 000000000100001 | −5 | 0 |
| 2 | 000000000100010 | −7 | 0 |
| 3 | 000000000100100 | −9 | 0 |
| 4 | 000000001000000 | −1 | 1 |
| 5 | 000000001000001 | −3 | 0 |
| 6 | 000000001000010 | −5 | 0 |
| 7 | 000000001000100 | −7 | 0 |
| 8 | 000000001001000 | −9 | 0 |
| 9 | 000000001001001 | −7 | 1 |
| 10 | 000000010000000 | 1 | 1 |
| 11 | 000000010000001 | −1 | 0 |
| 12 | 000000010000010 | −3 | 0 |
| 13 | 000000010000100 | −5 | 0 |
| 14 | 000000010001000 | −7 | 0 |
| 15 | 000000010001001 | −5 | 1 |
| 16 | 000000010010000 | −9 | 0 |
| 17 | 000000010010001 | −7 | 1 |
| 18 | 000000010010010 | −5 | 1 |
| 19 | 000000100000000 | 3 | 1 |
| 20 | 000000100000001 | 1 | 0 |
| 21 | 000000100000010 | −1 | 0 |
| 22 | 000000100000100 | −3 | 0 |
| 23 | 000000100001000 | −5 | 0 |
| 24 | 000000100001001 | −3 | 1 |
| 25 | 000000100010000 | −7 | 0 |
| 26 | 000000100010001 | −5 | 1 |
| 27 | 000000100010010 | −3 | 1 |
| 28 | 000000100100000 | −9 | 0 |
| 29 | 000000100100001 | −7 | 1 |
| 30 | 000000100100010 | −5 | 1 |
| 31 | 000000100100100 | −3 | 1 |
| 32 | 000001000000000 | 5 | 1 |
| 33 | 000001000000001 | 3 | 0 |
| 34 | 000001000000010 | 1 | 0 |
| 35 | 000001000000100 | −1 | 0 |
| 36 | 000001000001000 | −3 | 0 |
| 37 | 000001000001001 | −1 | 1 |
| 38 | 000001000010000 | −5 | 0 |
| 39 | 000001000010001 | −3 | 1 |
| 40 | 000001000010010 | −1 | 1 |
| 41 | 000001000100000 | −7 | 0 |
| 42 | 000001000100001 | −5 | 1 |
| 43 | 000001000100010 | −3 | 1 |
| 44 | 000001000100100 | −1 | 1 |
| 45 | 000001001000000 | −9 | 0 |
| 46 | 000001001000001 | −7 | 1 |
| 47 | 000001001000010 | −5 | 1 |
| 48 | 000001001000100 | −3 | 1 |
| 49 | 000001001001000 | −1 | 1 |
| 50 | 000001001001001 | −3 | 0 |
| 51 | 000010000000001 | 5 | 0 |
| 52 | 000010000000010 | 3 | 0 |
| 53 | 000010000000100 | 1 | 0 |
| 54 | 000010000001000 | −1 | 0 |
| 55 | 000010000001001 | 1 | 1 |
| 56 | 000010000010000 | −3 | 0 |
| 57 | 000010000010001 | −1 | 1 |
| 58 | 000010000010010 | 1 | 1 |
| 59 | 000010000100000 | −5 | 0 |
| 60 | 000010000100001 | −3 | 1 |
| 61 | 000010000100010 | −1 | 1 |
| 62 | 000010000100100 | 1 | 1 |
| 63 | 000010001000000 | −7 | 0 |
| 64 | 000010001000001 | −5 | 1 |
| 65 | 000010001000010 | −3 | 1 |
| 66 | 000010001000100 | −1 | 1 |
| 67 | 000010001001000 | 1 | 1 |
| 68 | 000010001001001 | −1 | 0 |
| 69 | 000010010000000 | −9 | 0 |
| 70 | 000010010000001 | −7 | 1 |
| 71 | 000010010000010 | −5 | 1 |
| 72 | 000010010000100 | −3 | 1 |
| 73 | 000010010001000 | −1 | 1 |
| 74 | 000000010001001 | −3 | 0 |

TABLE 0-continued

(First Embodiment)

| Source | Conversion Code | CDS | Polarity |
|---|---|---|---|
| 75 | 000010010010000 | 1 | 1 |
| 76 | 000010010010001 | −1 | 0 |
| 77 | 000010010010010 | −3 | 0 |
| 78 | 000100000000010 | 5 | 0 |
| 79 | 000100000000100 | 3 | 0 |
| 80 | 000100000001000 | 1 | 0 |
| 81 | 000100000001001 | 3 | 1 |
| 82 | 000100000010000 | −1 | 0 |
| 83 | 000100000010001 | 1 | 1 |
| 84 | 000100000010010 | 3 | 1 |
| 85 | 000100000100000 | −3 | 0 |
| 86 | 000100000100001 | −1 | 1 |
| 87 | 000100000100010 | 1 | 1 |
| 88 | 000100000100100 | 3 | 1 |
| 89 | 000100001000000 | −5 | 0 |
| 90 | 000100001000001 | −3 | 1 |
| 91 | 000100001000010 | −1 | 1 |
| 92 | 000100001000100 | 1 | 1 |
| 93 | 000100001001000 | 3 | 1 |
| 94 | 000100001001001 | 1 | 0 |
| 95 | 000100010000000 | −7 | 0 |
| 96 | 000100010000001 | −5 | 1 |
| 97 | 000100010000010 | −3 | 1 |
| 98 | 000100010000100 | −1 | 1 |
| 99 | 000100010001000 | 1 | 1 |
| 100 | 000100010001001 | −1 | 0 |
| 101 | 000100010010000 | 3 | 1 |
| 102 | 000100010010001 | 1 | 0 |
| 103 | 000100010010010 | −1 | 0 |
| 104 | 000100100000000 | −9 | 0 |
| 105 | 000100100000001 | −7 | 1 |
| 106 | 000100100000010 | −5 | 1 |
| 107 | 000100100000100 | −3 | 1 |
| 108 | 000100100001000 | −1 | 1 |
| 109 | 000100100001001 | −3 | 0 |
| 110 | 000100100010000 | 1 | 1 |
| 111 | 000100100010001 | −1 | 0 |
| 112 | 000100100010010 | −3 | 0 |
| 113 | 000100100100000 | 3 | 1 |
| 114 | 000100100100001 | 1 | 0 |
| 115 | 000100100100010 | −1 | 0 |
| 116 | 000100100100100 | −3 | 0 |
| 117 | 001000000001000 | 3 | 0 |
| 118 | 001000000001001 | 5 | 1 |
| 119 | 001000000010000 | 1 | 0 |
| 120 | 001000000010001 | 3 | 1 |
| 121 | 001000000010010 | 5 | 1 |
| 122 | 001000000100000 | −1 | 0 |
| 123 | 001000000100001 | 1 | 1 |
| 124 | 001000000100010 | 3 | 1 |
| 125 | 001000000100100 | 5 | 1 |
| 126 | 001000001000000 | −3 | 0 |
| 127 | 001000001000001 | −1 | 1 |
| 128 | 001000001000010 | 1 | 1 |
| 129 | 001000001000100 | 3 | 1 |
| 130 | 001000001001000 | 5 | 1 |
| 131 | 001000001001001 | 3 | 0 |
| 132 | 001000010000000 | −5 | 0 |
| 133 | 001000010000001 | −3 | 1 |
| 134 | 001000010000010 | −1 | 1 |
| 135 | 001000010000100 | 1 | 1 |
| 136 | 001000010001000 | 3 | 1 |
| 137 | 001000010001001 | 1 | 0 |
| 138 | 001000010010000 | 5 | 1 |
| 139 | 001000010010001 | 3 | 0 |
| 140 | 001000010010010 | 1 | 0 |
| 141 | 001000100000000 | −7 | 0 |
| 142 | 001000100000001 | −5 | 1 |
| 143 | 001000100000010 | −3 | 1 |
| 144 | 001000100000100 | −1 | 1 |
| 145 | 001000100001000 | 1 | 1 |
| 146 | 001000100001001 | −1 | 0 |
| 147 | 001000100010000 | 3 | 1 |
| 148 | 001000100010001 | 1 | 0 |
| 149 | 001000100010010 | −1 | 0 |
| 150 | 001000100100000 | 5 | 1 |
| 151 | 001000100100001 | 3 | 0 |
| 152 | 001000100100010 | 1 | 0 |
| 153 | 001000100100100 | −1 | 0 |
| 154 | 001001000000000 | −9 | 0 |
| 155 | 001001000000001 | −7 | 1 |
| 156 | 001001000000010 | −5 | 1 |
| 157 | 001001000000100 | −3 | 1 |
| 158 | 001001000001000 | −1 | 1 |
| 159 | 001001000001001 | −3 | 0 |
| 160 | 001001000010000 | 1 | 1 |
| 161 | 001001000010001 | −1 | 0 |
| 162 | 001001000010010 | −3 | 0 |
| 163 | 001001000100000 | 3 | 1 |
| 164 | 001001000100001 | 1 | 0 |
| 165 | 001001000100010 | −1 | 0 |
| 166 | 001001000100100 | −3 | 0 |
| 167 | 001001001000000 | 5 | 1 |
| 168 | 001001001000001 | 3 | 0 |
| 169 | 001001001000010 | 1 | 0 |
| 170 | 001001001000100 | −1 | 0 |
| 171 | 001001001001000 | −3 | 0 |
| 172 | 001001001001001 | −1 | 1 |
| 173 | 010000000001000 | 5 | 0 |
| 174 | 010000000001001 | 7 | 1 |
| 175 | 010000000010000 | 3 | 0 |
| 176 | 010000000010001 | 5 | 1 |
| 177 | 010000000010010 | 7 | 1 |
| 178 | 010000000100000 | 1 | 0 |
| 179 | 010000000100001 | 3 | 1 |
| 180 | 010000000100010 | 5 | 1 |
| 181 | 010000000100100 | 7 | 1 |
| 182 | 010000001000000 | −1 | 0 |
| 183 | 010000001000001 | 1 | 1 |
| 184 | 010000001000010 | 3 | 1 |
| 185 | 010000001000100 | 5 | 1 |
| 186 | 010000001001000 | 7 | 1 |
| 187 | 010000001001001 | 5 | 0 |
| 188 | 010000010000000 | −3 | 0 |
| 189 | 010000010000001 | −1 | 1 |
| 190 | 010000010000010 | 1 | 1 |
| 191 | 010000010000100 | 3 | 1 |
| 192 | 010000010001000 | 5 | 1 |
| 193 | 010000010001001 | 3 | 0 |
| 194 | 010000010010000 | 7 | 1 |
| 195 | 010000010010001 | 5 | 0 |
| 196 | 010000010010010 | 3 | 0 |
| 197 | 010000100000000 | −5 | 0 |
| 198 | 010000100000001 | −3 | 1 |
| 199 | 010000100000010 | −1 | 1 |
| 200 | 010000100000100 | 1 | 1 |
| 201 | 010000100001000 | 3 | 1 |
| 202 | 010000100001001 | 1 | 0 |
| 203 | 010000100010000 | 5 | 1 |
| 204 | 010000100010001 | 3 | 0 |
| 205 | 010000100010010 | 1 | 0 |
| 206 | 010000100100000 | 7 | 1 |
| 207 | 010000100100001 | 5 | 0 |
| 208 | 010000100100010 | 3 | 0 |
| 209 | 010000100100100 | 1 | 0 |
| 210 | 010001000000000 | −7 | 0 |
| 211 | 010001000000001 | −5 | 1 |
| 212 | 010001000000010 | −3 | 1 |
| 213 | 010001000000100 | −1 | 1 |
| 214 | 010001000001000 | 1 | 1 |
| 215 | 010001000001001 | −1 | 0 |
| 216 | 010001000010000 | 3 | 1 |
| 217 | 010001000010001 | 1 | 0 |
| 218 | 010001000010010 | −1 | 0 |
| 219 | 010001000100000 | 5 | 1 |
| 220 | 010001000100001 | 3 | 0 |
| 221 | 010001000100010 | 1 | 0 |
| 222 | 010001000100100 | −1 | 0 |
| 223 | 010001001000000 | 7 | 1 |
| 224 | 010001001000001 | 5 | 0 |

TABLE 0-continued

(First Embodiment)

| Source | Conversion Code | CDS | Polarity |
|---|---|---|---|
| 225 | 010001001000010 | 3 | 0 |
| 226 | 010001001000100 | 1 | 0 |
| 227 | 010001001001000 | −1 | 0 |
| 228 | 010001091001001 | 1 | 1 |
| 229 | 010010000000001 | −7 | 1 |
| 230 | 010010000000010 | −5 | 1 |
| 231 | 010010000000100 | −3 | 1 |
| 232 | 010010000001000 | −1 | 1 |
| 233 | 010010000001001 | −3 | 0 |
| 234 | 010010000010000 | 1 | 1 |
| 235 | 010010000010001 | −1 | 0 |
| 236 | 010010000010010 | −3 | 0 |
| 237 | 010010000100000 | 3 | 1 |
| 238 | 010010000100001 | 1 | 0 |
| 239 | 010010000100010 | −1 | 0 |
| 240 | 010010000100100 | −3 | 0 |
| 241 | 010010001000000 | 5 | 1 |
| 242 | 010010001000001 | 3 | 0 |
| 243 | 010010001000010 | 1 | 0 |
| 244 | 010010001000100 | −1 | 0 |
| 245 | 010010001001000 | −3 | 0 |
| 246 | 010010001001001 | −1 | 1 |
| 247 | 010010010000000 | 7 | 1 |
| 248 | 010010010000001 | 5 | 0 |
| 249 | 010010010000010 | 3 | 0 |
| 250 | 010010010000100 | 1 | 0 |
| 251 | 010010010001000 | −1 | 0 |
| 252 | 010010010001001 | 1 | 1 |
| 253 | 010010010010000 | −3 | 0 |
| 254 | 010010010010001 | −1 | 1 |
| 255 | 010010010010010 | 1 | 1 |

TABLE 1

(First Embodiment)

| Source | Conversion Code | CDS | Polarity |
|---|---|---|---|
| 0 | 000000001000000 | −1 | 1 |
| 1 | 000000001000001 | −3 | 0 |
| 2 | 000000001000010 | −5 | 0 |
| 3 | 000000001000100 | −7 | 0 |
| 4 | 000000001001000 | −9 | 0 |
| 5 | 000000001001001 | −7 | 1 |
| 6 | 000000010000000 | 1 | 1 |
| 7 | 000000010000001 | −1 | 0 |
| 8 | 000000010000010 | −3 | 0 |
| 9 | 000000010000100 | −5 | 0 |
| 10 | 000000010001000 | −7 | 0 |
| 11 | 000000010001001 | −5 | 1 |
| 12 | 000000010010000 | −9 | 0 |
| 13 | 000000010010001 | −7 | 1 |
| 14 | 000000010010010 | −5 | 1 |
| 15 | 000000100000000 | 3 | 1 |
| 16 | 000000100000001 | 1 | 0 |
| 17 | 000000100000010 | −1 | 0 |
| 18 | 000000100000100 | −3 | 0 |
| 19 | 000000100001000 | −5 | 0 |
| 20 | 000000100001001 | −3 | 1 |
| 21 | 000000100010000 | −7 | 0 |
| 22 | 000000100010001 | −5 | 1 |
| 23 | 000000100010010 | −3 | 1 |
| 24 | 000000100100000 | −9 | 0 |
| 25 | 000000100100001 | −7 | 1 |
| 26 | 000000100100010 | −5 | 1 |
| 27 | 000000100100100 | −3 | 1 |
| 28 | 000001000000000 | 5 | 1 |
| 29 | 000001000000001 | 3 | 0 |
| 30 | 000001000000010 | 1 | 0 |
| 31 | 000001000000100 | −1 | 0 |
| 32 | 000001000001000 | −3 | 0 |
| 33 | 000001000001001 | −1 | 1 |

TABLE 1-continued

(First Embodiment)

| Source | Conversion Code | CDS | Polarity |
|---|---|---|---|
| 34 | 000001000010000 | −5 | 0 |
| 35 | 000001000010001 | −3 | 1 |
| 36 | 000001000010010 | −1 | 1 |
| 37 | 000001000100000 | −7 | 0 |
| 38 | 000001000100001 | −5 | 1 |
| 39 | 000001000100010 | −3 | 1 |
| 40 | 000001000100100 | −1 | 1 |
| 41 | 000001001000000 | −9 | 0 |
| 42 | 000001001000001 | −7 | 1 |
| 43 | 000001001000010 | −5 | 1 |
| 44 | 000001001000100 | −3 | 1 |
| 45 | 000001001001000 | −1 | 1 |
| 46 | 000001001001001 | −3 | 0 |
| 47 | 000010000000001 | 5 | 0 |
| 48 | 000010000000010 | 3 | 0 |
| 49 | 000010000000100 | 1 | 0 |
| 50 | 000010000001000 | −1 | 0 |
| 51 | 000010000001001 | 1 | 1 |
| 52 | 000010000010000 | −3 | 0 |
| 53 | 000010000010001 | −1 | 1 |
| 54 | 000010000010010 | 1 | 1 |
| 55 | 000010000100000 | −5 | 0 |
| 56 | 000010000100001 | −3 | 1 |
| 57 | 000010000100010 | −1 | 1 |
| 58 | 000010000100100 | 1 | 1 |
| 59 | 000010001000000 | −7 | 0 |
| 60 | 000010001000001 | −5 | 1 |
| 61 | 000010001000010 | −3 | 1 |
| 62 | 000010001000100 | −1 | 1 |
| 63 | 000010001001000 | 1 | 1 |
| 64 | 000010001001001 | −1 | 0 |
| 65 | 000010010000000 | −9 | 0 |
| 66 | 000010010000001 | −7 | 1 |
| 67 | 000010010000010 | −5 | 1 |
| 68 | 000010010000100 | −3 | 1 |
| 69 | 000010010001000 | −1 | 1 |
| 70 | 000010010001001 | −3 | 0 |
| 71 | 000010010010000 | 1 | 1 |
| 72 | 000010010010001 | −1 | 0 |
| 73 | 000010010010010 | −3 | 0 |
| 74 | 000100000000010 | 5 | 0 |
| 75 | 000100000000100 | 3 | 0 |
| 76 | 000100000001000 | 1 | 0 |
| 77 | 000100000001001 | 3 | 1 |
| 78 | 000100000010000 | −1 | 0 |
| 79 | 000100000010001 | 1 | 1 |
| 80 | 000100000010010 | 3 | 1 |
| 81 | 000100000100000 | −3 | 0 |
| 82 | 000100000100001 | −1 | 1 |
| 83 | 000100000100010 | 1 | 1 |
| 84 | 000100000100100 | 3 | 1 |
| 85 | 000100001000000 | −5 | 0 |
| 86 | 000100001000001 | −3 | 1 |
| 87 | 000100001000010 | −1 | 1 |
| 88 | 000100001000100 | 1 | 1 |
| 89 | 000100001001000 | 3 | 1 |
| 90 | 000100001001001 | 1 | 0 |
| 91 | 000100010000000 | −7 | 0 |
| 92 | 000100010000001 | −5 | 1 |
| 93 | 000100010000010 | −3 | 1 |
| 94 | 000100010000100 | −1 | 1 |
| 95 | 000100010001000 | 1 | 1 |
| 96 | 000100010001001 | −1 | 0 |
| 97 | 000100010010000 | 3 | 1 |
| 98 | 000100010010001 | 1 | 0 |
| 99 | 000100010010010 | 4 | 0 |
| 100 | 000100100000000 | −9 | 0 |
| 101 | 000100100000001 | −7 | 1 |
| 102 | 000100100000010 | −5 | 1 |
| 103 | 000100100000100 | −3 | 1 |
| 104 | 000100100001000 | −1 | 1 |
| 105 | 000100100001001 | −3 | 0 |
| 106 | 000100100010000 | 1 | 1 |
| 107 | 000100100010001 | −1 | 0 |
| 108 | 000100100010010 | −3 | 0 |

TABLE 1-continued

(First Embodiment)

| Source | Conversion Code | CDS | Polarity |
|---|---|---|---|
| 109 | 000100100100000 | 3 | 1 |
| 110 | 000100100100001 | 1 | 0 |
| 111 | 000100100100010 | −1 | 0 |
| 112 | 000100100100100 | −3 | 0 |
| 113 | 001000000001000 | 3 | 0 |
| 114 | 001000000001001 | 5 | 1 |
| 115 | 001000000010000 | 1 | 0 |
| 116 | 001000000010001 | 3 | 1 |
| 117 | 001000000010010 | 5 | 1 |
| 118 | 001000000100000 | −1 | 0 |
| 119 | 001000000100001 | 1 | 1 |
| 120 | 001000000100010 | 3 | 1 |
| 121 | 001000000100100 | 5 | 1 |
| 122 | 001000001000000 | −3 | 0 |
| 123 | 001000001000001 | −1 | 1 |
| 124 | 001000001000010 | 1 | 1 |
| 125 | 001000001000100 | 3 | 1 |
| 126 | 001000001001000 | 5 | 1 |
| 127 | 001000001001001 | 3 | 0 |
| 128 | 001000010000000 | −5 | 0 |
| 129 | 001000010000001 | −3 | 1 |
| 130 | 001000010000010 | −1 | 1 |
| 131 | 001000010000100 | 1 | 1 |
| 132 | 001000010001000 | 3 | 1 |
| 133 | 001000010001001 | 1 | 0 |
| 134 | 001000010010000 | 5 | 1 |
| 135 | 001000010010001 | 3 | 0 |
| 136 | 001000010010010 | 1 | 0 |
| 137 | 001000100000000 | −7 | 0 |
| 138 | 001000100000001 | −5 | 1 |
| 139 | 001000100000010 | −3 | 1 |
| 140 | 001000100000100 | −1 | 1 |
| 141 | 001000100001000 | 1 | 1 |
| 142 | 001000100001001 | −1 | 0 |
| 143 | 001000100010000 | 3 | 1 |
| 144 | 001000100010001 | 1 | 0 |
| 145 | 001000100010010 | −1 | 0 |
| 146 | 001000100100000 | 5 | 1 |
| 147 | 001000100100001 | 3 | 0 |
| 148 | 001000100100010 | 1 | 0 |
| 149 | 001000100100100 | −1 | 0 |
| 150 | 001001000000000 | −9 | 0 |
| 151 | 001001000000001 | −7 | 1 |
| 152 | 001001000000010 | −5 | 1 |
| 153 | 001001000000100 | −3 | 1 |
| 154 | 001001000001000 | −1 | 1 |
| 155 | 001001000001001 | −3 | 0 |
| 156 | 001001000010000 | 1 | 1 |
| 157 | 001001000010001 | −1 | 0 |
| 158 | 001001000010010 | −3 | 0 |
| 159 | 001001000100000 | 3 | 1 |
| 160 | 001001000100001 | 1 | 0 |
| 161 | 001001000100010 | −1 | 0 |
| 162 | 001001000100100 | −3 | 0 |
| 163 | 001001001000000 | 5 | 1 |
| 164 | 001001001000001 | 3 | 0 |
| 165 | 001001001000010 | 1 | 0 |
| 166 | 001001001000100 | −1 | 0 |
| 167 | 001001001001000 | −3 | 0 |
| 168 | 001001001001001 | −1 | 1 |
| 169 | 100000000010000 | 5 | 0 |
| 170 | 100000000010001 | 7 | 1 |
| 171 | 100000000010010 | 9 | 1 |
| 172 | 100000000100000 | 3 | 0 |
| 173 | 100000000100001 | 5 | 1 |
| 174 | 100000000100010 | 7 | 1 |
| 175 | 100000000100100 | 9 | 1 |
| 176 | 100000010000000 | −1 | 0 |
| 177 | 100000010000001 | 1 | 1 |
| 178 | 100000010000010 | 3 | 1 |
| 179 | 100000010000100 | 5 | 1 |
| 180 | 100000010001000 | 7 | 1 |
| 181 | 100000010001001 | 5 | 1 |
| 182 | 100000010010000 | 9 | 1 |
| 183 | 100000010010001 | 7 | 0 |
| 184 | 100000010010010 | 5 | 0 |
| 185 | 100000100000000 | −3 | 0 |
| 186 | 100000100000001 | −1 | 1 |
| 187 | 100000100000010 | 1 | 1 |
| 188 | 100000100000100 | 3 | 1 |
| 189 | 100000100001000 | 5 | 1 |
| 190 | 100000100001001 | 3 | 0 |
| 191 | 100000100010000 | 7 | 1 |
| 192 | 100000100010001 | 5 | 0 |
| 193 | 100000100010010 | 3 | 0 |
| 194 | 100000100100000 | 9 | 1 |
| 195 | 100000100100001 | 7 | 0 |
| 196 | 100000100100010 | 5 | 0 |
| 197 | 100000100100100 | 3 | 0 |
| 198 | 100001000000000 | −5 | 0 |
| 199 | 100001000000001 | −3 | 1 |
| 200 | 100001000000010 | −1 | 1 |
| 201 | 100001000000100 | 1 | 1 |
| 202 | 100001000001000 | 3 | 1 |
| 203 | 100001000001001 | 1 | 0 |
| 204 | 100001000010000 | 5 | 1 |
| 205 | 100001000010001 | 3 | 0 |
| 206 | 100001000010010 | 1 | 0 |
| 207 | 100001000100000 | 7 | 1 |
| 208 | 100001000100001 | 5 | 0 |
| 209 | 100001000100010 | 3 | 0 |
| 210 | 100001000100100 | 1 | 0 |
| 211 | 100001001000000 | 9 | 1 |
| 212 | 100001001000001 | 7 | 0 |
| 213 | 100001001000010 | 5 | 0 |
| 214 | 100001001000100 | 3 | 0 |
| 215 | 100001001001000 | 1 | 0 |
| 216 | 100001001001001 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 2

(First Embodiment)

| Source | Conversion Code | CDS | Polarity |
|---|---|---|---|
| 0 | 000000010001000 | −7 | 0 |
| 1 | 000000010001001 | −5 | 1 |
| 2 | 000000100010000 | −9 | 0 |
| 3 | 000000100010001 | −7 | 1 |
| 4 | 000000100010010 | −5 | 1 |
| 5 | 000000100000000 | 3 | 1 |
| 6 | 000000100000001 | 1 | 0 |
| 7 | 000000100000010 | −1 | 0 |
| 8 | 000000100000100 | −3 | 0 |
| 9 | 000000100001000 | −5 | 0 |
| 10 | 000000100001001 | −3 | 1 |
| 11 | 000000100010000 | −7 | 0 |
| 12 | 000000100010001 | −5 | 1 |
| 13 | 000000100010010 | −3 | 1 |
| 14 | 000000100100000 | −9 | 0 |
| 15 | 000000100100001 | −7 | 1 |
| 16 | 000000100100010 | −5 | 1 |
| 17 | 000000100100100 | −3 | 1 |
| 18 | 000010000000001 | 5 | 0 |
| 19 | 000010000000010 | 3 | 0 |
| 20 | 000010000000100 | 1 | 0 |
| 21 | 000010000001000 | −1 | 0 |
| 22 | 000010000001001 | 1 | 1 |
| 23 | 000010000010000 | −3 | 0 |
| 24 | 000010000010001 | −1 | 1 |
| 25 | 000010000010010 | 1 | 1 |
| 26 | 000010000100000 | −5 | 0 |
| 27 | 000010000100001 | −3 | 1 |
| 28 | 000010000100010 | −1 | 1 |
| 29 | 000010000100100 | 1 | 1 |
| 30 | 000010001000000 | −7 | 0 |
| 31 | 000010001000001 | −5 | 1 |
| 32 | 000010001000010 | −3 | 1 |
| 33 | 000010001000100 | −1 | 1 |
| 34 | 000010001001000 | 1 | 1 |
| 35 | 000010001001001 | −1 | 0 |
| 36 | 000010010000000 | −9 | 0 |
| 37 | 000010010000001 | −7 | 1 |
| 38 | 000010010000010 | −5 | 1 |
| 39 | 000010010000100 | −3 | 1 |
| 40 | 000010010001000 | −1 | 1 |
| 41 | 000010010001001 | −3 | 0 |
| 42 | 000010010010000 | 1 | 1 |
| 43 | 000010010010001 | −1 | 0 |
| 44 | 000010010010010 | −3 | 0 |
| 45 | 000100000000010 | 5 | 0 |
| 46 | 000100000000100 | 3 | 0 |
| 47 | 000100000001000 | 1 | 0 |
| 48 | 000100000001001 | 3 | 1 |
| 49 | 000100000010000 | −1 | 0 |
| 50 | 000100000010001 | 1 | 1 |
| 51 | 000100000010010 | 3 | 1 |
| 52 | 000100000100000 | −3 | 0 |
| 53 | 000100000100001 | −1 | 1 |
| 54 | 000100000100010 | 1 | 1 |
| 55 | 000100000100100 | 3 | 1 |
| 56 | 000100001000000 | −5 | 0 |
| 57 | 000100001000001 | −3 | 1 |
| 58 | 000100001000010 | −1 | 1 |
| 59 | 000100001000100 | 1 | 1 |
| 60 | 000100001001000 | 3 | 1 |
| 61 | 000100001001001 | 1 | 0 |
| 62 | 000100010000000 | −7 | 0 |
| 63 | 000100010000001 | −5 | 1 |
| 64 | 000100010000010 | −3 | 1 |
| 65 | 000100010000100 | −1 | 1 |
| 66 | 000100010001000 | 1 | 1 |
| 67 | 000100010001001 | −1 | 0 |
| 68 | 000100010010000 | 3 | 1 |
| 69 | 000100010010001 | 1 | 0 |
| 70 | 000100010010010 | −1 | 0 |
| 71 | 000100100000000 | −9 | 0 |
| 72 | 000100100000001 | −7 | 1 |
| 73 | 000100100000010 | −5 | 1 |
| 74 | 000100100000100 | −3 | 1 |
| 75 | 000100100001000 | −1 | 1 |
| 76 | 000100100001001 | −3 | 0 |
| 77 | 000100100010000 | 1 | 1 |
| 78 | 000100100010001 | −1 | 0 |
| 79 | 000100100010010 | −3 | 0 |
| 80 | 000100100100000 | 3 | 1 |
| 81 | 000100100100001 | 1 | 0 |
| 82 | 000100100100010 | −1 | 0 |
| 83 | 000100100100100 | −3 | 0 |
| 84 | 001000000001000 | 3 | 0 |
| 85 | 001000000001001 | 5 | 1 |
| 86 | 001000000010000 | 1 | 0 |
| 87 | 001000000010001 | 3 | 1 |
| 88 | 001000000010010 | 5 | 1 |
| 89 | 001000000100000 | −1 | 0 |
| 90 | 001000000100001 | 1 | 1 |
| 91 | 001000000100010 | 3 | 1 |
| 92 | 001000000100100 | 5 | 1 |
| 93 | 001000001000000 | −3 | 0 |
| 94 | 001000001000001 | −1 | 1 |
| 95 | 001000001000010 | 1 | 1 |
| 96 | 001000001000100 | 3 | 1 |
| 97 | 001000001001000 | 5 | 1 |
| 98 | 001000001001001 | 3 | 0 |
| 99 | 001000010000000 | −5 | 0 |
| 100 | 001000010000001 | −3 | 1 |
| 101 | 001000010000010 | −1 | 1 |
| 102 | 001000010000100 | 1 | 1 |
| 103 | 001000010001000 | 3 | 1 |
| 104 | 001000010001001 | 1 | 0 |
| 105 | 001000010010000 | 5 | 1 |
| 106 | 001000010010001 | 3 | 0 |
| 107 | 001000010010010 | 1 | 0 |
| 108 | 001000100000000 | −7 | 0 |
| 109 | 001000100000001 | −5 | 1 |
| 110 | 001000100000010 | −3 | 1 |
| 111 | 001000100000100 | −1 | 1 |
| 112 | 001000100001000 | 1 | 1 |
| 113 | 001000100001001 | −1 | 0 |
| 114 | 001000100010000 | 3 | 1 |
| 115 | 001000100010001 | 1 | 0 |
| 116 | 001000100010010 | −1 | 0 |
| 117 | 001000100100000 | 5 | 1 |
| 118 | 001000100100001 | 3 | 0 |
| 119 | 001000100100010 | 1 | 0 |
| 120 | 001000100100100 | −1 | 0 |
| 121 | 001001000000000 | −9 | 0 |
| 122 | 001001000000001 | −7 | 1 |
| 123 | 001001000000010 | −5 | 1 |
| 124 | 001001000000100 | −3 | 1 |
| 125 | 001001000001000 | −1 | 1 |
| 126 | 001001000001001 | −3 | 0 |
| 127 | 001001000010000 | 1 | 1 |
| 128 | 001001000010001 | −1 | 0 |
| 129 | 001001000010010 | −3 | 0 |
| 130 | 001001000100000 | 3 | 1 |
| 131 | 001001000100001 | 1 | 0 |
| 132 | 001001000100010 | −1 | 0 |
| 133 | 001001000100100 | −3 | 0 |
| 134 | 001001001000000 | 5 | 1 |
| 135 | 001001001000001 | 3 | 0 |
| 136 | 001001001000010 | 1 | 0 |
| 137 | 001001001000100 | −1 | 0 |
| 138 | 001001001001000 | −3 | 0 |
| 139 | 001001001001001 | −1 | 1 |
| 140 | 010000000001000 | 5 | 0 |
| 141 | 010000000001001 | 7 | 1 |
| 142 | 010000000010000 | 3 | 0 |
| 143 | 010000000010001 | 5 | 1 |
| 144 | 010000000010010 | 7 | 1 |
| 145 | 010000000100000 | 1 | 0 |
| 146 | 010000000100001 | 3 | 1 |
| 147 | 010000000100010 | 5 | 1 |
| 148 | 010000000100100 | 7 | 1 |
| 149 | 010000001000000 | −1 | 0 |

TABLE 2-continued

(First Embodiment)

| Source | Conversion Code | CDS | Polarity |
|---|---|---|---|
| 150 | 010000001000001 | 1 | 1 |
| 151 | 010000001000010 | 3 | 1 |
| 152 | 010000001000100 | 5 | 1 |
| 153 | 010000001001000 | 7 | 1 |
| 154 | 010000001001001 | 5 | 0 |
| 155 | 010000010000000 | -3 | 0 |
| 156 | 010000010000001 | -1 | 1 |
| 157 | 010000010000010 | 1 | 1 |
| 158 | 010000010000100 | 3 | 1 |
| 159 | 010000010001000 | 5 | 1 |
| 160 | 010000010001001 | 3 | 0 |
| 161 | 010000010010000 | 7 | 1 |
| 162 | 010000010010001 | 5 | 0 |
| 163 | 010000010010010 | 3 | 0 |
| 164 | 010000100000000 | -5 | 0 |
| 165 | 010000100000001 | -3 | 1 |
| 166 | 010000100000010 | -1 | 1 |
| 167 | 010000100000100 | 1 | 1 |
| 168 | 010000100001000 | 3 | 1 |
| 169 | 010000100001001 | 1 | 0 |
| 170 | 010000100010000 | 5 | 1 |
| 171 | 010000100010001 | 3 | 0 |
| 172 | 010000100010010 | 1 | 0 |
| 173 | 010000100100000 | 7 | 1 |
| 174 | 010000100100001 | 5 | 0 |
| 175 | 010000100100010 | 3 | 0 |
| 176 | 010000100100100 | 1 | 0 |
| 177 | 010001000000000 | -7 | 0 |
| 178 | 010001000000001 | -5 | 1 |
| 179 | 010001000000010 | -3 | 1 |
| 180 | 010001000000100 | -1 | 1 |
| 181 | 010001000001000 | 1 | 1 |
| 182 | 010001000001001 | -1 | 0 |
| 183 | 010001000010000 | 3 | 1 |
| 184 | 010001000010001 | 1 | 0 |
| 185 | 010001000010010 | -1 | 0 |
| 186 | 010001000100000 | 5 | 1 |
| 187 | 010001000100001 | 3 | 0 |
| 188 | 010001000100010 | 1 | 0 |
| 189 | 010001000100100 | -1 | 0 |
| 190 | 010001001000000 | 7 | 1 |
| 191 | 010001001000001 | 5 | 0 |
| 192 | 010001001000010 | 3 | 0 |
| 193 | 010001001000100 | 1 | 0 |
| 194 | 010001001001000 | -1 | 0 |
| 195 | 010001001001001 | 1 | 1 |
| 196 | 010010000000001 | -7 | 1 |
| 197 | 010010000000010 | -5 | 1 |
| 198 | 010010000000100 | -3 | 1 |
| 199 | 010010000001000 | -1 | 1 |
| 200 | 010010000001001 | -3 | 0 |
| 201 | 010010000010000 | 1 | 1 |
| 202 | 010010000010001 | 4 | 0 |
| 203 | 010010000010010 | -3 | 0 |
| 204 | 010010000100000 | 3 | 1 |
| 205 | 010010000100001 | 1 | 0 |
| 206 | 010010000100010 | -1 | 0 |
| 207 | 010010000100100 | -3 | 0 |
| 208 | 010010001000000 | 5 | 1 |
| 209 | 010010001000001 | 3 | 0 |
| 210 | 010010001000010 | 1 | 0 |
| 211 | 010010001000100 | -1 | 0 |
| 212 | 010010001001000 | -3 | 0 |
| 213 | 010010001001001 | -1 | 1 |
| 214 | 010010010000000 | 7 | 1 |
| 215 | 010010010000001 | 5 | 0 |
| 216 | 010010010000010 | 3 | 0 |
| 217 | 010010010000100 | 1 | 0 |
| 218 | 010010010001000 | -1 | 0 |
| 219 | 010010010001001 | 1 | 1 |
| 220 | 010010010010000 | -3 | 0 |
| 221 | 010010010010001 | -1 | 1 |
| 222 | 010010010010010 | 1 | 1 |
| 223 | 100000001000000 | 1 | 0 |
| 224 | 100000001000001 | 3 | 1 |
| 225 | 100000001000010 | 5 | 1 |
| 226 | 100000001000100 | 7 | 1 |
| 227 | 100000001001000 | 9 | 1 |
| 228 | 100000001001001 | 7 | 0 |
| 229 | 100010000000001 | -5 | 1 |
| 230 | 100010000000010 | -3 | 1 |
| 231 | 100010000000100 | -1 | 1 |
| 232 | 100010000001000 | 1 | 1 |
| 233 | 100010000001001 | -1 | 0 |
| 234 | 100010000010000 | 3 | 1 |
| 235 | 100010000010001 | 1 | 0 |
| 236 | 100010000010010 | -1 | 0 |
| 237 | 100010000100000 | 5 | 1 |
| 238 | 100010000100001 | 3 | 0 |
| 239 | 100010000100010 | 1 | 0 |
| 240 | 100010000100100 | -1 | 0 |
| 241 | 100010001000000 | 7 | 1 |
| 242 | 100010001000001 | 5 | 0 |
| 243 | 100010001000010 | 3 | 0 |
| 244 | 100010001000100 | 1 | 0 |
| 245 | 100010001001000 | -1 | 0 |
| 246 | 100010001001001 | 1 | 1 |
| 247 | 100010010000000 | 9 | 1 |
| 248 | 100010010000001 | 7 | 0 |
| 249 | 100010010000010 | 5 | 0 |
| 250 | 100010010000100 | 3 | 0 |
| 251 | 100010010001000 | 1 | 0 |
| 252 | 100010010001001 | 3 | 0 |
| 253 | 100010010010000 | -1 | 0 |
| 254 | 100010010010001 | 1 | 1 |
| 255 | 100010010010010 | 3 | 1 |

TABLE 3

(First Embodiment)

| Source | Conversion Code | CDS | Polarity |
|---|---|---|---|
| 0 | 000001000001001 | -1 | 1 |
| 1 | 000001000010000 | -5 | 0 |
| 2 | 000001000010001 | -3 | 1 |
| 3 | 000001000010010 | -1 | 1 |
| 4 | 000001000100000 | -7 | 0 |
| 5 | 000001000100001 | -5 | 1 |
| 6 | 000001000100010 | -3 | 1 |
| 7 | 000001000100100 | -1 | 1 |
| 8 | 000001001000000 | -9 | 0 |
| 9 | 000001001000001 | -7 | 1 |
| 10 | 000001001000010 | -5 | 1 |
| 11 | 000001001000100 | -3 | 1 |
| 12 | 000001001001000 | -1 | 1 |
| 13 | 000001001001001 | -3 | 0 |
| 14 | 000010000000001 | 5 | 0 |
| 15 | 000010000000010 | 3 | 0 |
| 16 | 000010000000100 | 1 | 0 |
| 17 | 000010000001000 | -1 | 0 |
| 18 | 000010000001001 | 1 | 1 |
| 19 | 000010000010000 | -3 | 0 |
| 20 | 000010000010001 | -1 | 1 |
| 21 | 000010000010010 | 1 | 1 |
| 22 | 000010000100000 | -5 | 0 |
| 23 | 000010000100001 | -3 | 1 |
| 24 | 000010000100010 | -1 | 1 |
| 25 | 000010000100100 | 1 | 1 |
| 26 | 000010001000000 | -7 | 0 |
| 27 | 000010001000001 | -5 | 1 |
| 28 | 000010001000010 | -3 | 1 |
| 29 | 000010001000100 | -1 | 1 |
| 30 | 000010001001000 | 1 | 1 |
| 31 | 000010001001001 | -1 | 0 |
| 32 | 000010010000000 | -9 | 0 |
| 33 | 000010010000001 | -7 | 1 |

TABLE 3-continued

(First Embodiment)

| Source | Conversion Code | CDS | Polority |
|---|---|---|---|
| 34 | 000010010000010 | −5 | 1 |
| 35 | 000010010000100 | −3 | 1 |
| 36 | 000010010001000 | −1 | 1 |
| 37 | 000010010001001 | −3 | 0 |
| 38 | 000010010010000 | 1 | 1 |
| 39 | 000010010010001 | −1 | 0 |
| 40 | 000010010010010 | −3 | 0 |
| 41 | 000100000000010 | 5 | 0 |
| 42 | 000100000000100 | 3 | 0 |
| 43 | 000100000001000 | 1 | 0 |
| 44 | 000100000001001 | 3 | 1 |
| 45 | 000100000010000 | −1 | 0 |
| 46 | 000100000010001 | 1 | 1 |
| 47 | 000100000010010 | 3 | 1 |
| 48 | 000100000100000 | −3 | 0 |
| 49 | 000100000100001 | −1 | 1 |
| 50 | 000100000100010 | 1 | 1 |
| 51 | 000100000100100 | 3 | 1 |
| 52 | 000100001000000 | −5 | 0 |
| 53 | 000100001000001 | −3 | 1 |
| 54 | 000100001000010 | −1 | 1 |
| 55 | 000100001000100 | 1 | 1 |
| 56 | 000100001001000 | 3 | 1 |
| 57 | 000100001001001 | 1 | 0 |
| 58 | 000100010000000 | −7 | 0 |
| 59 | 000100010000001 | −5 | 1 |
| 60 | 000100010000010 | −3 | 1 |
| 61 | 000100010000100 | −1 | 1 |
| 62 | 000100010001000 | 1 | 1 |
| 63 | 000100010001001 | −1 | 0 |
| 64 | 000100010010000 | 3 | 1 |
| 65 | 000100010010001 | 1 | 0 |
| 66 | 000100010010010 | −1 | 0 |
| 67 | 000100100000000 | −9 | 0 |
| 68 | 000100100000001 | −7 | 1 |
| 69 | 000100100000010 | −5 | 1 |
| 70 | 000100100000100 | −3 | 1 |
| 71 | 000100100001000 | −1 | 1 |
| 72 | 000100100001001 | −3 | 0 |
| 73 | 000100100010000 | 1 | 1 |
| 74 | 000100100010001 | −1 | 0 |
| 75 | 000100100010010 | −3 | 0 |
| 76 | 000100100100000 | 3 | 1 |
| 77 | 000100100100001 | 1 | 0 |
| 78 | 000100100100010 | −1 | 0 |
| 79 | 000100100100100 | −3 | 0 |
| 80 | 001000000001000 | 3 | 0 |
| 81 | 001000000001001 | 5 | 1 |
| 82 | 001000000010000 | 1 | 0 |
| 83 | 001000000010001 | 3 | 1 |
| 84 | 001000000010010 | 5 | 1 |
| 85 | 001000000100000 | −1 | 0 |
| 86 | 001000000100001 | 1 | 1 |
| 87 | 001000000100010 | 3 | 1 |
| 88 | 001000000100100 | 5 | 1 |
| 89 | 001000001000000 | −3 | 0 |
| 90 | 001000001000001 | −1 | 1 |
| 91 | 001000001000010 | 1 | 1 |
| 92 | 001000001000100 | 3 | 1 |
| 93 | 001000001001000 | 5 | 1 |
| 94 | 001000001001001 | 3 | 0 |
| 95 | 001000010000000 | −5 | 0 |
| 96 | 001000010000001 | −3 | 1 |
| 97 | 001000010000010 | −1 | 1 |
| 98 | 001000010000100 | 1 | 1 |
| 99 | 001000010001000 | 3 | 1 |
| 100 | 001000010001001 | 1 | 0 |
| 101 | 001000010010000 | 5 | 1 |
| 102 | 001000010010001 | 3 | 0 |
| 103 | 001000010010010 | 1 | 0 |
| 04 | 001000100000000 | −7 | 0 |
| 105 | 001000100000001 | −5 | 1 |
| 106 | 001000100000010 | −3 | 1 |
| 107 | 001000100000100 | −1 | 1 |
| 168 | 001000100001000 | 1 | 1 |
| 109 | 001000100001001 | −1 | 0 |
| 110 | 001000100010000 | 3 | 1 |
| 111 | 001000100010001 | 1 | 0 |
| 112 | 001000100010010 | −1 | 0 |
| 114 | 001000100100001 | 3 | 0 |
| 115 | 001000100100010 | 1 | 0 |
| 116 | 001000100100100 | −1 | 0 |
| 117 | 001001000000000 | −9 | 0 |
| 118 | 001001000000001 | −7 | 1 |
| 119 | 001001000000010 | −5 | 1 |
| 120 | 001001000000100 | −3 | 1 |
| 121 | 001001000001000 | −1 | 1 |
| 122 | 001001000001001 | −3 | 0 |
| 123 | 001001000010000 | 1 | 1 |
| 124 | 001001000010001 | −1 | 0 |
| 125 | 001001000010010 | −3 | 0 |
| 126 | 001001000100000 | 3 | 1 |
| 127 | 001001000100001 | 1 | 0 |
| 128 | 001001000100010 | −1 | 0 |
| 129 | 001001000100100 | −3 | 0 |
| 130 | 001001001000000 | 5 | 1 |
| 131 | 001001001000001 | 3 | 0 |
| 132 | 001001001000010 | 1 | 0 |
| 133 | 001001001000100 | −1 | 0 |
| 134 | 001001001001000 | −3 | 0 |
| 135 | 001001001001001 | −1 | 1 |
| 136 | 100000000010000 | 5 | 0 |
| 137 | 100000000010001 | 7 | 1 |
| 138 | 100000000010010 | 9 | 1 |
| 139 | 100000000100000 | 3 | 0 |
| 140 | 100000000100001 | 5 | 1 |
| 141 | 100000000100010 | 7 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |
| 184 | 100001001000000 | 9 | 1 |

TABLE 3-continued

(First Embodiment)

| Source | Conversion Code | CDS | Polority |
|---|---|---|---|
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 4

(First Embodiment)

| Source | Conversion Code | CDS | Polority |
|---|---|---|---|
| 0 | 000001000000001 | 3 | 0 |
| 1 | 000001000000010 | 1 | 0 |
| 2 | 000001000000100 | −1 | 0 |
| 3 | 000001000001000 | −3 | 0 |
| 4 | 000001000001001 | −1 | 1 |
| 5 | 000001000010000 | −5 | 0 |
| 6 | 000001000010001 | −3 | 1 |
| 7 | 000001000010010 | −1 | 1 |
| 8 | 000001000100000 | −7 | 0 |
| 9 | 000001000100001 | −5 | 1 |
| 10 | 000001000100010 | −3 | 1 |
| 11 | 000001000100100 | −1 | 1 |
| 12 | 000001001000000 | −9 | 0 |
| 13 | 000001001000001 | −7 | 1 |
| 14 | 000001001000010 | −5 | 1 |
| 15 | 000001001000100 | −3 | 1 |
| 16 | 000001001001000 | −1 | 1 |
| 17 | 000001001001001 | −1 | 0 |
| 18 | 000010000000001 | 5 | 0 |
| 19 | 000010000000010 | 3 | 0 |
| 20 | 000010000000100 | 1 | 0 |
| 21 | 000010000001000 | −1 | 0 |
| 22 | 000010000001001 | 1 | 1 |
| 23 | 000010000010000 | −3 | 0 |
| 24 | 000010000010001 | −1 | 1 |
| 25 | 000010000010010 | 1 | 1 |
| 26 | 000010000100000 | −5 | 0 |
| 27 | 000010000100001 | −3 | 1 |
| 28 | 000010000100010 | −1 | 1 |
| 29 | 000010000100100 | 1 | 1 |
| 30 | 000010001000000 | −7 | 0 |
| 31 | 000010001000001 | −5 | 1 |
| 32 | 000010001000010 | −3 | 1 |
| 33 | 000010001000100 | −1 | 1 |
| 34 | 000010001001000 | 1 | 1 |
| 35 | 000010001001001 | −1 | 0 |
| 36 | 000010010000000 | −9 | 0 |
| 37 | 000010010000001 | −7 | 1 |
| 38 | 000010010000010 | −5 | 1 |
| 39 | 000010010000100 | −3 | 1 |
| 40 | 000010010001000 | −1 | 1 |
| 41 | 000010010001001 | −3 | 0 |
| 42 | 000010010010000 | 1 | 1 |
| 43 | 000010010010001 | −1 | 0 |
| 44 | 000010010010010 | −3 | 0 |
| 45 | 000100000000010 | 5 | 0 |
| 46 | 000100000000100 | 3 | 0 |
| 47 | 000100000001000 | 1 | 0 |
| 48 | 000100000001001 | 3 | 1 |
| 49 | 000100000010000 | −1 | 0 |
| 50 | 000100000010001 | 1 | 1 |
| 51 | 000100000010010 | 3 | 1 |
| 52 | 000100000100000 | −3 | 0 |
| 53 | 000100000100001 | −1 | 1 |
| 54 | 000100000100010 | 1 | 1 |
| 55 | 000100000100100 | 3 | 1 |
| 56 | 000100001000000 | −5 | 0 |
| 57 | 000100001000001 | −3 | 1 |
| 58 | 000100001000010 | −1 | 1 |
| 59 | 000100001000100 | 1 | 1 |
| 60 | 000100001001000 | 3 | 1 |
| 61 | 000100001001001 | 1 | 0 |
| 62 | 000100010000000 | −7 | 0 |
| 63 | 000100010000001 | −5 | 1 |
| 64 | 000100010000010 | −3 | 1 |
| 65 | 000100010000100 | −1 | 1 |
| 66 | 000100010001000 | 1 | 1 |
| 67 | 000100010001001 | −1 | 0 |
| 68 | 000100010010000 | 3 | 1 |
| 69 | 000100010010001 | 1 | 0 |
| 70 | 000100010010010 | −1 | 0 |
| 71 | 000100100000000 | −9 | 0 |
| 72 | 000100100000001 | −7 | 1 |
| 73 | 000100100000010 | −5 | 1 |
| 74 | 000100100000100 | −3 | 1 |

TABLE 4-continued

(First Embodiment)

| Source | Conversion Code | CDS | Polority |
|---|---|---|---|
| 75 | 000100100001000 | −1 | 1 |
| 76 | 000100100001001 | −3 | 0 |
| 77 | 000100100010000 | 1 | 1 |
| 78 | 000100100010001 | −1 | 0 |
| 79 | 000100100010010 | −3 | 0 |
| 80 | 000100100100000 | 3 | 1 |
| 81 | 000100100100001 | 1 | 0 |
| 82 | 000100100100010 | −1 | 0 |
| 83 | 000100100100100 | −3 | 0 |
| 84 | 001000000001000 | 3 | 0 |
| 85 | 001000000001001 | 5 | 1 |
| 86 | 001000000010000 | 1 | 0 |
| 87 | 001000000010001 | 3 | 1 |
| 88 | 001000000010010 | 5 | 1 |
| 89 | 001000000100000 | −1 | 0 |
| 90 | 001000000100001 | 1 | 1 |
| 91 | 001000000100010 | 3 | 1 |
| 92 | 001000000100100 | 5 | 1 |
| 93 | 001000001000000 | −3 | 0 |
| 94 | 001000001000001 | −1 | 1 |
| 95 | 001000001000010 | 1 | 1 |
| 96 | 001000001000100 | 3 | 1 |
| 97 | 001000001001000 | 5 | 1 |
| 98 | 001000001001001 | 3 | 0 |
| 99 | 001000010000000 | −5 | 0 |
| 100 | 001000010000001 | −3 | 1 |
| 101 | 001000010000010 | −1 | 1 |
| 102 | 001000010000100 | 1 | 1 |
| 103 | 001000010001000 | 3 | 1 |
| 104 | 001000010001001 | 1 | 0 |
| 105 | 001000010010000 | 5 | 1 |
| 106 | 001000010010001 | 3 | 0 |
| 107 | 001000010010010 | 1 | 0 |
| 108 | 001000100000000 | −7 | 0 |
| 109 | 001000100000001 | −5 | 1 |
| 110 | 001000100000010 | −3 | 1 |
| 111 | 001000100000100 | −1 | 1 |
| 112 | 001000100001000 | 1 | 1 |
| 113 | 001000100001001 | −1 | 0 |
| 114 | 001000100010000 | 3 | 1 |
| 115 | 001000100010001 | 1 | 0 |
| 116 | 001000100010010 | −1 | 0 |
| 117 | 001000100100000 | 5 | 1 |
| 118 | 001000100100001 | 3 | 0 |
| 119 | 001000100100010 | 1 | 0 |
| 120 | 001000100100100 | −1 | 0 |
| 121 | 001001000000000 | −9 | 0 |
| 122 | 001001000000001 | −7 | 1 |
| 123 | 001001000000010 | −5 | 1 |
| 124 | 001001000000100 | −3 | 1 |
| 125 | 001001000001000 | −1 | 1 |
| 126 | 001001000001001 | −3 | 0 |
| 127 | 001001000010000 | 1 | 1 |
| 128 | 001001000010001 | −1 | 0 |
| 129 | 001001000010010 | −3 | 0 |
| 130 | 001001000100000 | 3 | 1 |
| 131 | 001001000100001 | 1 | 0 |
| 132 | 001001000100010 | −1 | 0 |
| 133 | 001001000100100 | −3 | 0 |
| 134 | 001001001000000 | 5 | 1 |
| 135 | 001001001000001 | 3 | 0 |
| 136 | 001001001000010 | 1 | 0 |
| 137 | 001001001000100 | −1 | 0 |
| 138 | 001001001001000 | −3 | 0 |
| 139 | 001001001001001 | −1 | 1 |
| 140 | 010000000001000 | 5 | 0 |
| 141 | 010000000001001 | 7 | 1 |
| 142 | 010000000010000 | 3 | 0 |
| 143 | 010000000010001 | 5 | 1 |
| 144 | 010000000010010 | 7 | 1 |
| 145 | 010000000100000 | 1 | 0 |
| 146 | 010000000100001 | 3 | 1 |
| 147 | 010000000100010 | 5 | 1 |
| 148 | 010000000100100 | 7 | 1 |
| 149 | 010000001000000 | −1 | 0 |
| 150 | 010000001000001 | 1 | 1 |
| 151 | 010000001000010 | 3 | 1 |
| 152 | 010000001000100 | 5 | 1 |
| 153 | 010000001001000 | 7 | 1 |
| 154 | 010000001001001 | 5 | 0 |
| 155 | 010000010000000 | −3 | 0 |
| 156 | 010000010000001 | −1 | 1 |
| 157 | 010000010000010 | 1 | 1 |
| 158 | 010000010000100 | 3 | 1 |
| 159 | 010000010001000 | 5 | 1 |
| 160 | 010000010001001 | 3 | 0 |
| 161 | 010000010010000 | 7 | 1 |
| 162 | 010000010010001 | 5 | 0 |
| 163 | 010000010010010 | 3 | 0 |
| 164 | 010000100000000 | −5 | 0 |
| 165 | 010000100000001 | −3 | 1 |
| 166 | 010000100000010 | −1 | 1 |
| 167 | 010000100000100 | 1 | 1 |
| 168 | 010000100001000 | 3 | 1 |
| 169 | 010000100001001 | 1 | 0 |
| 170 | 010000100010000 | 5 | 1 |
| 171 | 010000100010001 | 3 | 0 |
| 172 | 010000100010010 | 1 | 0 |
| 173 | 019000100100000 | 7 | 1 |
| 174 | 010000100100001 | 5 | 0 |
| 175 | 010000100100010 | 3 | 0 |
| 176 | 010000100100100 | 1 | 0 |
| 177 | 010001000000000 | −7 | 0 |
| 178 | 010001000000001 | −5 | 1 |
| 179 | 010001000000010 | −3 | 1 |
| 180 | 010001000000100 | −1 | 1 |
| 181 | 010001000001000 | 1 | 1 |
| 182 | 010001000001001 | −1 | 0 |
| 183 | 010001000010000 | 3 | 1 |
| 184 | 010001000010001 | 1 | 0 |
| 185 | 010001000010010 | −1 | 0 |
| 186 | 010001000100000 | 5 | 1 |
| 187 | 010001000100001 | 3 | 0 |
| 188 | 010001000100010 | 1 | 0 |
| 189 | 010001000100100 | −1 | 0 |
| 190 | 010001001000000 | 7 | 1 |
| 191 | 010001001000001 | 5 | 0 |
| 192 | 010001001000010 | 3 | 0 |
| 193 | 010001001000100 | 1 | 0 |
| 194 | 010001001001000 | −1 | 0 |
| 195 | 010001001001001 | 1 | 1 |
| 196 | 010010000000001 | −7 | 1 |
| 197 | 010010000000010 | −5 | 1 |
| 198 | 010010000000100 | −3 | 1 |
| 199 | 010010000001000 | −1 | 1 |
| 200 | 010010000001001 | −3 | 0 |
| 201 | 010010000010000 | 1 | 1 |
| 202 | 010010000010001 | −1 | 0 |
| 203 | 010010000010010 | −3 | 0 |
| 204 | 010010000100000 | 3 | 1 |
| 205 | 010010000100001 | 1 | 0 |
| 206 | 010010000100010 | −1 | 0 |
| 207 | 010010000100100 | −3 | 0 |
| 208 | 010010001000000 | 5 | 1 |
| 209 | 010010001000001 | 3 | 0 |
| 210 | 010010001000010 | 1 | 0 |
| 211 | 010010001000100 | −1 | 0 |
| 212 | 010010001001000 | −3 | 0 |
| 213 | 010010001001001 | −1 | 1 |
| 214 | 010010010000000 | 7 | 1 |
| 215 | 010010010000001 | 5 | 0 |
| 216 | 010010010000010 | 3 | 0 |
| 217 | 010010010000100 | 1 | 0 |
| 218 | 010010010001000 | −1 | 0 |
| 219 | 010010010001001 | 1 | 1 |
| 220 | 010010010010000 | −3 | 0 |
| 221 | 010010010010001 | −1 | 1 |
| 222 | 010010010010010 | 1 | 1 |
| 223 | 100000001000000 | 1 | 0 |
| 224 | 100000001000001 | 3 | 1 |

TABLE 4-continued

(First Embodiment)

| Source | Conversion Code | CDS | Polority |
|---|---|---|---|
| 225 | 100000001000010 | 5 | 1 |
| 226 | 100000001000100 | 1 | 1 |
| 227 | 100000001001000 | 9 | 1 |
| 228 | 100000001001001 | 7 | 0 |
| 229 | 100010000000001 | −5 | 1 |
| 230 | 100010000000010 | −3 | 1 |
| 231 | 100010000000100 | −1 | 1 |
| 232 | 100010000001000 | 1 | 1 |
| 233 | 100010000001001 | −1 | 0 |
| 234 | 100010000010000 | 3 | 1 |
| 235 | 100010000010001 | 1 | 0 |
| 236 | 100010000010010 | −1 | 0 |
| 237 | 100010000100000 | 5 | 1 |
| 238 | 100010000100001 | 3 | 0 |
| 239 | 100010000100010 | 1 | 0 |
| 240 | 100010000100100 | −1 | 0 |
| 241 | 100010001000000 | 7 | 1 |
| 242 | 100010001000001 | 5 | 0 |
| 243 | 100010001000010 | 3 | 0 |
| 244 | 100010001000100 | 1 | 0 |
| 245 | 100010001001000 | −1 | 0 |
| 246 | 100010001001001 | 1 | 1 |
| 247 | 100010010000000 | 9 | 1 |
| 248 | 100010010000001 | 7 | 0 |
| 249 | 100010010000010 | 5 | 0 |
| 250 | 100010010000100 | 3 | 0 |
| 251 | 100010010001000 | 1 | 0 |
| 252 | 100010010001001 | 3 | 0 |
| 253 | 100010010010000 | −1 | 0 |
| 254 | 100010010010001 | 1 | 1 |
| 255 | 100010010010010 | 3 | 1 |

TABLE 5

(First Embodiment)

| Source | Conversion Code | CDS | Polority |
|---|---|---|---|
| 0 | 000001000001001 | −1 | 1 |
| 1 | 000001000010000 | −5 | 0 |
| 2 | 000001000010001 | −3 | 1 |
| 3 | 000001000010010 | −1 | 1 |
| 4 | 000001000100000 | −7 | 0 |
| 5 | 000001000100001 | −5 | 1 |
| 6 | 000001000100010 | −3 | 1 |
| 7 | 000001000100001 | −1 | 1 |
| 8 | 000001001000000 | −9 | 0 |
| 9 | 000001001000001 | −7 | 1 |
| 10 | 000001001000010 | −5 | 1 |
| 11 | 000001001000100 | −3 | 1 |
| 12 | 000001001001000 | −1 | 1 |
| 13 | 000001001001001 | −3 | 0 |
| 14 | 000100000000010 | 5 | 0 |
| 15 | 000100000000100 | 3 | 0 |
| 16 | 000100000001000 | 1 | 0 |
| 17 | 000100000001001 | 3 | 1 |
| 18 | 000100000010000 | −1 | 0 |
| 19 | 000100000010001 | 1 | 1 |
| 20 | 000100000000101 | 3 | 1 |
| 21 | 000100001100000 | −3 | 0 |
| 22 | 000100000100001 | −1 | 1 |
| 23 | 000100000100010 | 1 | 1 |
| 24 | 000000001001001 | 3 | 1 |
| 25 | 000100010000000 | −5 | 0 |
| 26 | 000100010000001 | −3 | 1 |
| 27 | 000100010000010 | −1 | 1 |
| 28 | 000100010000100 | 1 | 1 |
| 29 | 000100010001000 | 3 | 1 |
| 30 | 000100010001001 | 1 | 0 |
| 31 | 000100010000000 | −7 | 0 |
| 32 | 000100010000001 | −5 | 1 |
| 33 | 000100010000010 | −3 | 1 |

TABLE 5-continued

(First Embodiment)

| Source | Conversion Code | CDS | Polority |
|---|---|---|---|
| 34 | 000100010000100 | −1 | 1 |
| 35 | 000100010001000 | 1 | 1 |
| 36 | 000100010001001 | −1 | 0 |
| 37 | 000100010010000 | 3 | 1 |
| 38 | 000100010010001 | 1 | 0 |
| 39 | 000100010010010 | −1 | 0 |
| 40 | 000100100000000 | −9 | 0 |
| 41 | 000100100000001 | −7 | 1 |
| 42 | 000100100000010 | −5 | 1 |
| 43 | 000100100000100 | −3 | 1 |
| 44 | 000100100001000 | −1 | 1 |
| 45 | 000100100001001 | −3 | 0 |
| 46 | 000100100010000 | 1 | 1 |
| 47 | 000100100010001 | −1 | 0 |
| 48 | 000100100010010 | −3 | 0 |
| 49 | 000100100100000 | 3 | 1 |
| 50 | 00010010010b001 | 1 | 0 |
| 51 | 000100100100010 | −1 | 0 |
| 52 | 000100100100100 | −3 | 0 |
| 53 | 010000000001000 | 5 | 0 |
| 54 | 010000000001001 | 7 | 1 |
| 55 | 010000000010000 | 3 | 0 |
| 56 | 010000000010001 | 5 | 1 |
| 57 | 010000000010010 | 7 | 1 |
| 58 | 010000000100000 | 1 | 0 |
| 59 | 010000000100001 | 3 | 1 |
| 60 | 010000000100010 | 5 | 1 |
| 61 | 010000000100100 | 7 | 1 |
| 62 | 010000001000000 | −1 | 0 |
| 63 | 010000001000001 | 1 | 1 |
| 64 | 010000001000010 | 3 | 1 |
| 65 | 010000001000100 | 5 | 1 |
| 66 | 010000001001000 | 7 | 1 |
| 67 | 010000001001001 | 5 | 0 |
| 68 | 010000010000000 | −3 | 0 |
| 69 | 010000010000001 | −1 | 1 |
| 70 | 010000010000010 | 1 | 1 |
| 71 | 010000010000100 | 3 | 1 |
| 72 | 010000010001000 | 5 | 1 |
| 73 | 000000010001001 | 3 | 0 |
| 74 | 010000010010000 | 7 | 1 |
| 75 | 010000010010001 | 5 | 0 |
| 76 | 010000010010010 | 3 | 0 |
| 77 | 010000100000000 | −5 | 0 |
| 78 | 010000100000001 | −3 | 1 |
| 79 | 010000100000010 | −1 | 1 |
| 80 | 010000100000100 | 1 | 1 |
| 81 | 010000100001000 | 3 | 1 |
| 82 | 01000010000001 | 1 | 0 |
| 83 | 010000100010000 | 5 | 1 |
| 84 | 010000100010001 | 3 | 0 |
| 85 | 010000100010010 | 1 | 0 |
| 86 | 010000100100000 | 7 | 1 |
| 87 | 010000100100001 | 5 | 0 |
| 88 | 010000100100010 | 3 | 0 |
| 89 | 010000100100100 | 1 | 0 |
| 90 | 010001000000000 | −7 | 0 |
| 91 | 010001000000001 | −5 | 1 |
| 92 | 010001000000010 | −3 | 1 |
| 93 | 010001000000100 | −1 | 1 |
| 94 | 010001000001000 | 1 | 1 |
| 95 | 010001000001001 | −1 | 0 |
| 96 | 010001000010000 | 3 | 1 |
| 97 | 010001000010001 | 1 | 0 |
| 98 | 010001000010010 | −1 | 0 |
| 99 | 010001000100000 | 5 | 1 |
| 100 | 010001000100001 | 3 | 0 |
| 101 | 010001000100010 | 1 | 0 |
| 102 | 010001000100100 | −1 | 0 |
| 103 | 010001001000000 | 7 | 1 |
| 104 | 010001001000001 | 5 | 0 |
| 105 | 010001001000010 | 3 | 0 |
| 106 | 010001001000100 | 1 | 0 |
| 107 | 010001001001000 | −1 | 0 |
| 108 | 010001001001001 | 1 | 1 |

TABLE 5-continued

(First Embodiment)

| Source | Conversion Code | CDS | Polority |
|---|---|---|---|
| 109 | 010010000000001 | −7 | 1 |
| 110 | 010010000000010 | −5 | 1 |
| 111 | 010010000000100 | −3 | 1 |
| 112 | 010010000001000 | −1 | 1 |
| 113 | 010010000001001 | −3 | 0 |
| 114 | 010010000010000 | 1 | 1 |
| 115 | 010010000010001 | −1 | 0 |
| 116 | 010010000010010 | −3 | 0 |
| 117 | 010010000100000 | 3 | 1 |
| 118 | 010010000100001 | 1 | 0 |
| 119 | 010010000100010 | −1 | 0 |
| 120 | 010010000100100 | −3 | 0 |
| 121 | 010010001000000 | 5 | 1 |
| 122 | 010010001000001 | 3 | 0 |
| 123 | 010010001000010 | 1 | 0 |
| 124 | 010010001000100 | −1 | 0 |
| 125 | 010010001001000 | −3 | 0 |
| 126 | 010010001001001 | −1 | 1 |
| 127 | 010010010000000 | 7 | 1 |
| 128 | 010010010000001 | 5 | 0 |
| 129 | 010010010000010 | 3 | 0 |
| 130 | 010010010000100 | 1 | 0 |
| 131 | 010010010001000 | −1 | 0 |
| 132 | 010010010001001 | 1 | 1 |
| 133 | 010010010010000 | −3 | 0 |
| 134 | 010010010010001 | −1 | 1 |
| 135 | 010010010010010 | 1 | 1 |
| 136 | 100000000010000 | 5 | 0 |
| 137 | 100000000010001 | 7 | 1 |
| 138 | 100000000010010 | 9 | 1 |
| 139 | 100000000100000 | 3 | 0 |
| 140 | 100000000100001 | 5 | 1 |
| 141 | 100000000100010 | 7 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 3 | 0 |
| 182 | 100001000100010 | 3 | 0 |
| 183 | 100001000100100 | 1 | 0 |
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100001000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 6

(First Embodiment)

| Source | Conversion Code | CDS | Polority |
|---|---|---|---|
| 0 | 001000000010001 | 3 | 1 |
| 1 | 001000000010010 | 5 | 1 |
| 2 | 001000000100000 | -1 | 0 |
| 3 | 001000000100001 | 1 | 1 |
| 4 | 001000000100010 | 3 | 1 |
| 5 | 001000000100100 | 5 | 1 |
| 6 | 001000001000000 | -3 | 0 |
| 7 | 001000001000001 | -1 | 1 |
| 8 | 001000001000010 | 1 | 1 |
| 9 | 001000001000100 | 3 | 1 |
| 10 | 001000001001000 | 5 | 1 |
| 11 | 001000001001001 | 3 | 0 |
| 12 | 001000010000000 | -5 | 0 |
| 13 | 001000010000001 | -3 | 1 |
| 14 | 001000010000010 | -1 | 1 |
| 15 | 001000010000100 | 1 | 1 |
| 16 | 001000010001000 | 3 | 1 |
| 17 | 001000010001001 | 1 | 0 |
| 18 | 001000010010000 | 5 | 1 |
| 19 | 001000010010001 | 3 | 0 |
| 20 | 001000010010010 | 1 | 0 |
| 21 | 001000100000000 | -7 | 0 |
| 22 | 001000100000001 | -5 | 1 |
| 23 | 001000100000010 | -3 | 1 |
| 24 | 001000100000100 | -1 | 1 |
| 25 | 001000100001000 | 1 | 1 |
| 26 | 001000100001001 | -1 | 0 |
| 27 | 001000100010000 | 3 | 1 |
| 28 | 001000100010001 | 1 | 0 |
| 29 | 001000100010010 | -1 | 0 |
| 30 | 001000100100000 | 5 | 1 |
| 31 | 001000100100001 | 3 | 0 |
| 32 | 001000100100010 | 1 | 0 |
| 33 | 001000100100100 | -1 | 0 |
| 34 | 001001000000000 | -9 | 0 |
| 35 | 001001000000001 | -7 | 1 |
| 36 | 001001000000010 | -5 | 1 |
| 37 | 001001000000100 | -3 | 1 |
| 38 | 001001000001000 | -1 | 1 |
| 39 | 001001000001001 | -3 | 0 |
| 40 | 001001000010000 | 1 | 1 |
| 41 | 001001000010001 | -1 | 0 |
| 42 | 001001000010010 | -3 | 0 |
| 43 | 001001000100000 | 3 | 1 |
| 44 | 001001000100001 | 1 | 0 |
| 45 | 001001000100010 | -1 | 0 |
| 46 | 001001000100100 | -3 | 0 |
| 47 | 001001001000000 | 5 | 1 |
| 48 | 001001001000001 | 3 | 0 |
| 49 | 001001001000010 | 1 | 0 |
| 50 | 001001001000100 | -1 | 0 |
| 51 | 001001001001000 | -3 | 0 |
| 52 | 001001001001001 | -1 | 1 |
| 53 | 010000000001000 | 5 | 0 |
| 54 | 010000000001001 | 7 | 1 |
| 55 | 010000000010000 | 3 | 0 |
| 56 | 010000000010001 | 5 | 1 |
| 57 | 010000000010010 | 7 | 1 |
| 58 | 010000000100000 | 1 | 0 |
| 59 | 010000000100001 | 3 | 1 |
| 60 | 010000000100010 | 5 | 1 |
| 61 | 010000000100100 | 7 | 1 |
| 62 | 010000001000000 | -1 | 0 |
| 63 | 010000001000001 | 1 | 1 |
| 64 | 010000001000010 | 3 | 1 |
| 65 | 010000001000100 | 5 | 1 |
| 66 | 010000001001000 | 7 | 1 |
| 67 | 010000001001001 | 5 | 0 |
| 68 | 010000010000000 | -3 | 0 |
| 69 | 010000010000001 | -1 | 1 |
| 70 | 010000010000010 | 1 | 1 |
| 71 | 010000010000100 | 3 | 1 |
| 72 | 010000010001000 | 5 | 1 |
| 73 | 010000010001001 | 3 | 0 |
| 74 | 010000010010000 | 7 | 1 |
| 75 | 010000010010001 | 5 | 0 |
| 76 | 010000010010010 | 3 | 0 |
| 77 | 010000100000000 | -5 | 0 |
| 78 | 010000100000001 | -3 | 1 |
| 79 | 010000100000010 | -1 | 1 |
| 80 | 010000100000100 | 1 | 1 |
| 81 | 010000100001000 | 3 | 1 |
| 82 | 010000100001001 | 1 | 0 |
| 83 | 010000100010000 | 5 | 1 |
| 84 | 010000100010001 | 3 | 0 |
| 85 | 010000100010010 | 1 | 0 |
| 86 | 010000100100000 | 7 | 1 |
| 87 | 010000100100001 | 5 | 0 |
| 88 | 010000100100010 | 3 | 0 |
| 89 | 010000100100100 | 1 | 0 |
| 90 | 010001000000000 | -7 | 0 |
| 91 | 010001000000001 | -5 | 1 |
| 92 | 010001000000010 | -3 | 1 |
| 93 | 010001000000100 | 1 | 1 |
| 94 | 010001000001000 | 1 | 1 |
| 95 | 010001000001001 | -1 | 0 |
| 96 | 010001000010000 | 3 | 1 |
| 97 | 010001000010001 | 1 | 0 |
| 98 | 010001000010010 | -1 | 0 |
| 99 | 010001000100000 | 5 | 1 |
| 100 | 010001000100001 | 3 | 0 |
| 101 | 010001000100010 | 1 | 0 |
| 102 | 010001000100100 | -1 | 0 |
| 103 | 010001001000000 | 7 | 1 |
| 104 | 010001001000001 | 5 | 0 |
| 105 | 010001001000010 | 3 | 0 |
| 106 | 010001001000100 | 1 | 0 |
| 107 | 010001001001000 | -1 | 0 |
| 108 | 010001001001001 | 1 | 1 |
| 109 | 010010000000001 | -7 | 1 |
| 110 | 010010000000010 | -5 | 1 |
| 111 | 010010000000100 | -3 | 1 |
| 112 | 010010000001000 | -1 | 1 |
| 113 | 010010000001001 | -3 | 0 |
| 114 | 010010000010000 | 1 | 1 |
| 115 | 010010000010001 | -1 | 0 |
| 116 | 010010000010010 | -3 | 0 |
| 117 | 010010000100000 | 3 | 1 |
| 118 | 010010000100001 | 1 | 0 |
| 119 | 010010000100010 | -1 | 0 |
| 120 | 010010000100100 | -3 | 0 |
| 121 | 010010001000000 | 5 | 1 |
| 122 | 010010001000001 | 3 | 0 |
| 123 | 010010001000010 | 1 | 0 |
| 124 | 010010001000100 | -1 | 0 |
| 125 | 010010001001000 | -3 | 0 |
| 126 | 010010001001001 | -1 | 1 |
| 127 | 010010010000000 | 7 | 1 |
| 128 | 010010010000001 | 5 | 0 |
| 129 | 010010010000010 | 3 | 0 |
| 130 | 010010010000100 | 1 | 0 |
| 131 | 010010010001000 | -1 | 0 |
| 132 | 010010010001001 | 1 | 1 |
| 133 | 010010010010000 | -3 | 0 |
| 134 | 010010010010001 | -1 | 1 |
| 135 | 010010010010010 | 1 | 1 |
| 136 | 100000000010000 | 5 | 0 |
| 137 | 100000000010001 | 7 | 1 |
| 138 | 100000000010010 | 9 | 1 |
| 139 | 100000000100000 | 3 | 0 |
| 140 | 100000000100001 | 5 | 1 |
| 141 | 100000000100010 | 7 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | -1 | 0 |

TABLE 6-continued

(First Embodiment)

| Source | Conversion Code | CDS | Polarity |
|---|---|---|---|
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 0 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 7

(First Embodiment)

| Source | Conversion Code | CDS | Polarity |
|---|---|---|---|
| 0 | 000001000001001 | −1 | 1 |
| 1 | 000001000010000 | −5 | 0 |
| 2 | 000001000010001 | −3 | 1 |
| 3 | 000001000010010 | −1 | 1 |
| 4 | 000001000100000 | −7 | 0 |
| 5 | 000001000100001 | −5 | 1 |
| 6 | 000001000100010 | −3 | 1 |
| 7 | 000001000100100 | −1 | 1 |
| 8 | 000001001000000 | −9 | 0 |
| 9 | 000001001000001 | −7 | 1 |
| 10 | 000001001000010 | −5 | 1 |
| 11 | 000001001000100 | −3 | 1 |
| 12 | 000001001001000 | −1 | 1 |
| 13 | 000001001001001 | −3 | 0 |
| 14 | 000010000000001 | 5 | 0 |
| 15 | 000010000000010 | 3 | 0 |
| 16 | 000010000000100 | 1 | 0 |
| 17 | 000010000001000 | −1 | 0 |
| 18 | 000010000001001 | 1 | 1 |
| 19 | 000010000010000 | −3 | 0 |
| 20 | 000010000010001 | −1 | 1 |
| 21 | 000010000010010 | 1 | 1 |
| 22 | 000010000100000 | −5 | 0 |
| 23 | 000010000100001 | −3 | 1 |
| 24 | 000010000100010 | −1 | 1 |
| 25 | 000010000100100 | 1 | 1 |
| 26 | 000010001000000 | −7 | 0 |
| 27 | 000010001000001 | −5 | 1 |
| 28 | 000010001000010 | −3 | 1 |
| 29 | 000010001000100 | −1 | 1 |
| 30 | 000010001001000 | 1 | 1 |
| 31 | 000010001001001 | −1 | 0 |
| 32 | 000010010000000 | −9 | 0 |
| 33 | 000010010000001 | −7 | 1 |

TABLE 7-continued (First Embodiment)

| Source | Conversion Code | CDS | Polarity |
|---|---|---|---|
| 34 | 000010010000010 | −5 | 1 |
| 35 | 000010010000100 | −3 | 1 |
| 36 | 000010010001000 | −1 | 1 |
| 37 | 000010010001001 | −3 | 0 |
| 38 | 000010010010000 | 1 | 1 |
| 39 | 000010010010001 | −1 | 0 |
| 40 | 000010010010010 | −3 | 0 |
| 41 | 000100000000010 | 5 | 0 |
| 42 | 000100000000100 | 3 | 0 |
| 43 | 000100000001000 | 1 | 0 |
| 44 | 000100000001001 | 3 | 1 |
| 45 | 000100000010000 | −1 | 0 |
| 46 | 000100000010001 | 1 | 1 |
| 47 | 000100000010010 | 3 | 1 |
| 48 | 000100000100000 | −3 | 0 |
| 49 | 000100000100001 | −1 | 1 |
| 50 | 000100000100010 | 1 | 1 |
| 51 | 000100000100100 | 3 | 1 |
| 52 | 000100001000000 | −5 | 0 |
| 53 | 000100001000001 | −3 | 1 |
| 54 | 000100001000010 | −1 | 1 |
| 55 | 000100001000100 | 1 | 1 |
| 56 | 000100001001000 | 3 | 1 |
| 57 | 000100001001001 | 1 | 0 |
| 58 | 000100010000000 | −7 | 0 |
| 59 | 000100010000001 | −5 | 1 |
| 60 | 000100010000010 | −3 | 1 |
| 61 | 000100010000100 | −1 | 1 |
| 62 | 000100010001000 | 1 | 1 |
| 63 | 000100010001001 | −1 | 0 |
| 64 | 000100010010000 | 3 | 1 |
| 65 | 000100010010001 | 1 | 0 |
| 66 | 000100010010010 | −1 | 0 |
| 67 | 000100100000000 | −9 | 0 |
| 68 | 000100100000001 | −7 | 1 |
| 69 | 000100100000010 | −5 | 1 |
| 70 | 000100100000100 | −3 | 1 |
| 71 | 000100100001000 | −1 | 1 |
| 72 | 000100100001001 | −3 | 0 |
| 73 | 000100100010000 | 1 | 1 |
| 74 | 000100100010001 | −1 | 0 |
| 75 | 000100100010010 | −3 | 0 |
| 76 | 000100100100000 | 3 | 1 |
| 77 | 000100100100001 | 1 | 0 |
| 78 | 000100100100010 | −1 | 0 |
| 79 | 000100100100100 | −3 | 0 |
| 80 | 001000000001000 | 3 | 0 |
| 81 | 001000000001001 | 5 | 1 |
| 82 | 001000000010000 | 1 | 0 |
| 83 | 001000000010001 | 3 | 1 |
| 84 | 001000000010010 | 5 | 1 |
| 85 | 001000000100000 | −1 | 0 |
| 86 | 001000000100001 | 1 | 1 |
| 87 | 001000000100010 | 3 | 1 |
| 88 | 001000000100100 | 5 | 1 |
| 89 | 001000001000000 | −3 | 0 |
| 90 | 001000001000001 | −1 | 1 |
| 91 | 001000001000010 | 1 | 1 |
| 92 | 001000001000100 | 3 | 1 |
| 93 | 001000001001000 | 5 | 1 |
| 94 | 001000001001001 | 3 | 0 |
| 95 | 001000010000000 | −5 | 0 |
| 96 | 001000010000001 | −3 | 1 |
| 97 | 001000010000010 | −1 | 1 |
| 98 | 001000010000100 | 1 | 1 |
| 99 | 001000010001000 | 3 | 1 |
| 100 | 001000010001001 | 1 | 0 |
| 101 | 001000010010000 | 5 | 1 |
| 102 | 001000010010001 | 3 | 0 |
| 103 | 001000010010010 | 1 | 0 |
| 104 | 001000100000000 | −7 | 0 |
| 105 | 001000100000001 | −5 | 1 |
| 106 | 001000100000010 | −3 | 1 |
| 107 | 001000100000100 | −1 | 1 |
| 108 | 001000100001000 | 1 | 1 |
| 109 | 001000100001001 | −1 | 0 |
| 110 | 001000100010000 | 3 | 1 |
| 111 | 001000100010001 | 1 | 0 |
| 112 | 001000100010010 | −1 | 0 |
| 113 | 001000100100000 | 5 | 1 |
| 114 | 001000100100001 | 3 | 0 |
| 115 | 001000100100010 | 1 | 0 |
| 116 | 001000100100100 | −1 | 0 |
| 117 | 001001000000000 | −9 | 0 |
| 118 | 001001000000001 | −7 | 1 |
| 119 | 001001000000010 | −5 | 1 |
| 120 | 001001000000100 | −3 | 1 |
| 121 | 001001000001000 | −1 | 1 |
| 122 | 001001000001001 | −3 | 0 |
| 123 | 001001000010000 | 1 | 1 |
| 124 | 001001000010001 | −1 | 0 |
| 125 | 001001000010010 | −3 | 0 |
| 126 | 001001000100000 | 3 | 1 |
| 127 | 001001000100001 | 1 | 0 |
| 128 | 001001000100010 | −1 | 0 |
| 129 | 001001000100100 | −3 | 0 |
| 130 | 001001001000000 | 5 | 1 |
| 131 | 001001001000001 | 3 | 0 |
| 132 | 001001001000010 | 1 | 0 |
| 133 | 001001001000100 | −1 | 0 |
| 134 | 001001001001000 | −3 | 0 |
| 135 | 001001001001001 | −1 | 1 |
| 136 | 100000000010000 | 5 | 0 |
| 137 | 100000000010001 | 7 | 1 |
| 138 | 100000000010010 | 9 | 1 |
| 139 | 100000000100000 | 3 | 0 |
| 140 | 100000000100001 | 5 | 1 |
| 141 | 100000000100010 | 7 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |

TABLE 7-continued

(First Embodiment)

| Source | Conversion Code | CDS | Polarity |
|---|---|---|---|
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 0

(Second Embodiment)

| Source | Conversion Code | CDS | Polarity |
|---|---|---|---|
| 0 | 000010000001000 | −1 | 0 |
| 1 | 000010000001001 | 1 | 1 |
| 2 | 000010000010000 | −3 | 0 |
| 3 | 000010000010001 | −1 | 1 |
| 4 | 000010000010010 | 1 | 1 |
| 5 | 000010000100000 | −5 | 0 |
| 6 | 000010000100001 | −3 | 1 |
| 7 | 000010000100010 | −1 | 1 |
| 8 | 000010000100100 | 1 | 1 |
| 9 | 000010001000000 | −7 | 0 |
| 10 | 000010001000001 | −5 | 1 |
| 11 | 000010001000010 | −3 | 1 |
| 12 | 000010001000100 | −1 | 1 |
| 13 | 000010001001000 | 1 | 1 |
| 14 | 000010001001001 | −1 | 0 |
| 15 | 000010010000000 | −9 | 0 |
| 16 | 000010010000001 | −7 | 1 |
| 17 | 000010010000010 | −5 | 1 |
| 18 | 000010010000100 | −3 | 1 |
| 19 | 000010010001000 | −1 | 1 |
| 20 | 000010010001001 | −3 | 0 |
| 21 | 000010010010000 | 1 | 1 |
| 22 | 000010010010001 | −1 | 0 |
| 23 | 000010010010010 | −3 | 0 |
| 24 | 000100000000010 | 5 | 0 |
| 25 | 000100000000100 | 3 | 0 |
| 26 | 000100000001000 | 1 | 0 |
| 27 | 000100000001001 | 3 | 1 |
| 28 | 000100000010000 | −1 | 0 |
| 29 | 000100000010001 | 1 | 1 |
| 30 | 000100000010010 | 3 | 1 |
| 31 | 000100000100000 | −3 | 0 |
| 32 | 000100000100001 | −1 | 1 |
| 33 | 000100000100010 | 1 | 1 |
| 34 | 000100000100100 | 3 | 1 |
| 35 | 000100001000000 | −5 | 0 |
| 36 | 000100001000001 | −3 | 1 |
| 37 | 000100001000010 | −1 | 1 |
| 38 | 000100001000100 | 1 | 1 |
| 39 | 000100001001000 | 3 | 1 |
| 40 | 000100001001001 | 1 | 0 |
| 41 | 000100010000000 | −7 | 0 |
| 42 | 000100010000001 | −5 | 1 |
| 43 | 000100010000010 | −3 | 1 |
| 44 | 000100010000100 | −1 | 1 |
| 45 | 000100010001000 | 1 | 1 |
| 46 | 000100010001001 | −1 | 0 |
| 47 | 000100010010000 | 3 | 1 |
| 48 | 000100010010001 | 1 | 0 |
| 49 | 000100010010010 | −1 | 0 |
| 50 | 000100100000000 | −9 | 0 |
| 51 | 000100100000001 | −7 | 1 |
| 52 | 000100100000010 | −5 | 1 |
| 53 | 000100100000100 | −3 | 1 |
| 54 | 000100100001000 | −1 | 1 |
| 55 | 000100100001001 | −3 | 0 |
| 56 | 000100100010000 | 1 | 1 |
| 57 | 000100100010001 | −1 | 0 |
| 58 | 000100100010010 | −3 | 0 |
| 59 | 000100100100000 | 3 | 1 |
| 60 | 000100100100001 | 1 | 0 |
| 61 | 000100100100010 | −1 | 0 |
| 62 | 000100100100100 | −3 | 0 |
| 63 | 001000000000100 | 5 | 0 |
| 64 | 001000000001000 | 3 | 0 |
| 65 | 001000000001001 | 5 | 1 |
| 66 | 001000000010000 | 1 | 0 |
| 67 | 001000000010001 | 3 | 1 |
| 68 | 001000000010010 | 5 | 1 |
| 69 | 001000000100000 | −1 | 0 |
| 70 | 001000000100001 | 1 | 1 |
| 71 | 001000000100010 | 3 | 1 |
| 72 | 001000000100100 | 5 | 1 |
| 73 | 001000001000000 | −3 | 0 |
| 74 | 001000001000001 | −1 | 1 |

TABLE 0-continued (Second Embodiment)

| Source | Conversion Code | CDS | Polarity |
|---|---|---|---|
| 75 | 001000001000010 | 1 | 1 |
| 76 | 001000001000100 | 3 | 1 |
| 77 | 001000001001000 | 5 | 1 |
| 78 | 001000001001001 | 3 | 0 |
| 79 | 001000010000000 | -5 | 0 |
| 80 | 001000010000001 | -3 | 1 |
| 81 | 001000010000010 | -1 | 1 |
| 82 | 001000010000100 | 1 | 1 |
| 83 | 001000010001000 | 3 | 1 |
| 84 | 001000010001001 | 1 | 0 |
| 85 | 001000010010000 | 5 | 1 |
| 86 | 001000010010001 | 3 | 0 |
| 87 | 001000010010010 | 1 | 0 |
| 88 | 001000100000000 | -7 | 0 |
| 89 | 001000100000001 | -5 | 1 |
| 90 | 001000100000010 | -3 | 1 |
| 91 | 001000100000100 | -1 | 1 |
| 92 | 001000100001000 | 1 | 1 |
| 93 | 001000100001001 | -1 | 0 |
| 94 | 001000100010000 | 3 | 1 |
| 95 | 001000100010001 | 1 | 0 |
| 96 | 001000100010010 | -1 | 0 |
| 97 | 001000100100000 | 5 | 1 |
| 98 | 001000100100001 | 3 | 0 |
| 99 | 001000100100010 | 1 | 0 |
| 100 | 001000100100100 | -1 | 0 |
| 101 | 001001000000000 | -9 | 0 |
| 102 | 001001000000001 | -7 | 1 |
| 103 | 001001000000010 | -5 | 1 |
| 104 | 001001000000100 | -3 | 1 |
| 105 | 001001000001000 | -1 | 1 |
| 106 | 001001000001001 | -3 | 0 |
| 107 | 001001000010000 | 1 | 1 |
| 108 | 001001000010001 | -1 | 0 |
| 109 | 001001000010010 | -3 | 0 |
| 110 | 001001000100000 | 3 | 1 |
| 111 | 001001000100001 | 1 | 0 |
| 112 | 001001000100010 | -1 | 0 |
| 113 | 001001000100100 | -3 | 0 |
| 114 | 001001001000000 | 5 | 1 |
| 115 | 001001001000001 | 3 | 0 |
| 116 | 001001001000010 | 1 | 0 |
| 117 | 001001001000100 | -1 | 0 |
| 118 | 001001001001000 | -3 | 0 |
| 119 | 001001001001001 | -1 | 1 |
| 120 | 000001000000000 | 5 | 1 |
| 121 | 000001000000001 | 3 | 0 |
| 122 | 000001000000010 | 1 | 0 |
| 123 | 000001000000100 | -1 | 0 |
| 124 | 000001000001000 | -3 | 0 |
| 125 | 000001000001001 | -1 | 1 |
| 126 | 000001000010000 | -5 | 0 |
| 127 | 000001000010001 | -3 | 1 |
| 128 | 000001000010010 | -1 | 1 |
| 129 | 000001000100000 | -7 | 0 |
| 130 | 000001000100001 | -5 | 1 |
| 131 | 000001000100010 | -3 | 1 |
| 132 | 000001000100100 | -1 | 1 |
| 133 | 000001001000000 | -9 | 0 |
| 134 | 000001001000001 | -7 | 1 |
| 135 | 000001001000010 | -5 | 1 |
| 136 | 000001001000100 | -3 | 1 |
| 137 | 000001001001000 | -1 | 1 |
| 138 | 000001001001001 | -3 | 0 |
| 139 | 000010000000001 | 5 | 0 |
| 140 | 000010000000010 | 3 | 0 |
| 141 | 000010000000100 | 1 | 0 |
| 142 | 010000000001000 | 5 | 0 |
| 143 | 010000000001001 | 7 | 1 |
| 144 | 010000000010000 | 3 | 0 |
| 145 | 010000000010001 | 5 | 1 |
| 146 | 010000000010010 | 7 | 1 |
| 147 | 010000000100000 | 1 | 0 |
| 148 | 010000000100001 | 3 | 1 |
| 149 | 010000000100010 | 5 | 1 |
| 150 | 010000000100100 | 7 | 1 |
| 151 | 010000001000000 | -1 | 0 |
| 152 | 010000001000001 | 1 | 1 |
| 153 | 010000001000010 | 3 | 1 |
| 154 | 010000001000100 | 5 | 1 |
| 155 | 010000001001000 | 7 | 1 |
| 156 | 010000001001001 | 5 | 0 |
| 157 | 010000010000000 | -3 | 0 |
| 158 | 010000010000001 | -1 | 1 |
| 159 | 010000010000010 | 1 | 1 |
| 160 | 010000010000100 | 3 | 1 |
| 161 | 010000010001000 | 5 | 1 |
| 162 | 010000010001001 | 3 | 0 |
| 163 | 010000010010000 | 7 | 1 |
| 164 | 010000010010001 | 5 | 0 |
| 165 | 010000010010010 | 3 | 0 |
| 166 | 010000100000000 | -5 | 0 |
| 167 | 010000100000001 | -3 | 1 |
| 168 | 010000100000010 | -1 | 1 |
| 169 | 010000100000100 | 1 | 1 |
| 170 | 010000100001000 | 3 | 1 |
| 171 | 010000100001001 | 1 | 0 |
| 172 | 010000100010000 | 5 | 1 |
| 173 | 010000100010001 | 3 | 0 |
| 174 | 010000100010010 | 1 | 0 |
| 175 | 010000100100000 | 7 | 1 |
| 176 | 010000100100001 | 5 | 0 |
| 177 | 010000100100010 | 3 | 0 |
| 178 | 010000100100100 | 1 | 0 |
| 179 | 010001000000000 | -7 | 0 |
| 180 | 010001000000001 | -5 | 1 |
| 181 | 010001000000010 | -3 | 1 |
| 182 | 010001000000100 | -1 | 1 |
| 183 | 010001000001000 | 1 | 1 |
| 184 | 010001000001001 | -1 | 0 |
| 185 | 010001000010000 | 3 | 1 |
| 186 | 010001000010001 | 1 | 0 |
| 187 | 010001000010010 | -1 | 0 |
| 188 | 010001000100000 | 5 | 1 |
| 189 | 010001000100001 | 3 | 0 |
| 190 | 010001000100010 | 1 | 0 |
| 191 | 010001000100100 | -1 | 0 |
| 192 | 010001001000000 | 7 | 1 |
| 193 | 010001001000001 | 5 | 0 |
| 194 | 010001001000010 | 3 | 0 |
| 195 | 010001001000100 | 1 | 0 |
| 196 | 010001001001000 | -1 | 0 |
| 197 | 010001001001001 | 1 | 1 |
| 198 | 010010000000001 | -7 | 1 |
| 199 | 010010000000010 | -5 | 1 |
| 200 | 010010000000100 | -3 | 1 |
| 201 | 010010000001000 | -1 | 1 |
| 202 | 010010000001001 | -3 | 0 |
| 203 | 010010000010000 | 1 | 1 |
| 204 | 010010000010001 | -1 | 0 |
| 205 | 010010000010010 | -3 | 0 |
| 206 | 010010000100000 | 3 | 1 |
| 207 | 010010000100001 | 1 | 0 |
| 208 | 010010000100010 | -1 | 0 |
| 209 | 010010000100100 | -3 | 0 |
| 210 | 010010001000000 | 5 | 1 |
| 211 | 010010001000001 | 3 | 0 |
| 212 | 010010001000010 | 1 | 0 |
| 213 | 010010001000100 | -1 | 0 |
| 214 | 010010001001000 | -3 | 0 |
| 215 | 010010001001001 | -1 | 1 |
| 216 | 010010010000000 | 7 | 1 |
| 217 | 010010010000001 | 5 | 0 |
| 218 | 010010010000010 | 3 | 0 |
| 219 | 010010010000100 | 1 | 0 |
| 220 | 010010010001000 | -1 | 0 |
| 221 | 010010010001001 | 1 | 1 |
| 222 | 010010010010000 | -3 | 0 |
| 223 | 010010010010001 | -1 | 1 |
| 224 | 010010010010010 | 1 | 1 |

TABLE 0-continued

(Second Embodiment)

| Source | Conversion Code | CDS | Polarity |
|---|---|---|---|
| 225 | 000000001000000 | −1 | 1 |
| 226 | 000000001000001 | −3 | 0 |
| 227 | 000000001000010 | −5 | 0 |
| 228 | 000000001000100 | −7 | 0 |
| 229 | 000000001001000 | −9 | 0 |
| 230 | 000000001001001 | −7 | 1 |
| 231 | 000000010000000 | 1 | 1 |
| 232 | 000000010000001 | −1 | 0 |
| 233 | 000000010000010 | −3 | 0 |
| 234 | 000000010000100 | −5 | 0 |
| 235 | 000000010001000 | −7 | 0 |
| 236 | 000000010001001 | −5 | 1 |
| 237 | 000000010010000 | −9 | 0 |
| 238 | 000000010010001 | −7 | 1 |
| 239 | 000000010010010 | −5 | 1 |
| 240 | 000000100000000 | 3 | 1 |
| 241 | 000000100000001 | 1 | 0 |
| 242 | 000000100000010 | −1 | 0 |
| 243 | 000000100000100 | −3 | 0 |
| 244 | 000000100001000 | −5 | 0 |
| 245 | 000000100001001 | −3 | 1 |
| 246 | 000000100010000 | −7 | 0 |
| 247 | 000000100010001 | −5 | 1 |
| 248 | 000000100010010 | −3 | 1 |
| 249 | 000000100100000 | −9 | 0 |
| 250 | 000000100100001 | −7 | 1 |
| 251 | 000000100100010 | −5 | 1 |
| 252 | 000000100100100 | −3 | 1 |
| 253 | 000000000100001 | −5 | 0 |
| 254 | 000000000100010 | −7 | 0 |
| 255 | 000000000100100 | −9 | 0 |

TABLE 1

(Second Embodiment)

| Source | Conversion Code | CDS | Polarity |
|---|---|---|---|
| 0 | 000010000001000 | −1 | 0 |
| 1 | 000010000001001 | 1 | 1 |
| 2 | 000010000010000 | −3 | 0 |
| 3 | 000010000010001 | −1 | 1 |
| 4 | 000010000010010 | 1 | 1 |
| 5 | 000010000100000 | −5 | 0 |
| 6 | 000010000100001 | −3 | 1 |
| 7 | 000010000100010 | −1 | 1 |
| 8 | 000010000100100 | 1 | 1 |
| 9 | 000010001000000 | −7 | 0 |
| 10 | 000010001000001 | −5 | 1 |
| 11 | 000010001000010 | −3 | 1 |
| 12 | 000010001000100 | −1 | 1 |
| 13 | 000010001001000 | 1 | 1 |
| 14 | 000010001001001 | −1 | 0 |
| 15 | 000010010000000 | −9 | 0 |
| 16 | 000010010000001 | −7 | 1 |
| 17 | 000010010000010 | −5 | 1 |
| 18 | 000010010000100 | −3 | 1 |
| 19 | 000010010001000 | −1 | 1 |
| 20 | 000010010001001 | −3 | 0 |
| 21 | 000010010010000 | 1 | 1 |
| 22 | 000010010010001 | −1 | 0 |
| 23 | 000010010010010 | −3 | 0 |
| 24 | 000100000000010 | 5 | 0 |
| 25 | 000100000000100 | 3 | 0 |
| 26 | 000100000001000 | 1 | 0 |
| 27 | 000100000001001 | 3 | 1 |
| 28 | 000100000010000 | −1 | 0 |
| 29 | 000100000010001 | 1 | 1 |
| 30 | 000100000010010 | 3 | 1 |
| 31 | 000100000100000 | −3 | 0 |
| 32 | 000100000100001 | −1 | 1 |
| 33 | 000100000100010 | 1 | 1 |

TABLE 1-continued

(Second Embodiment)

| Source | Conversion Code | CDS | Polarity |
|---|---|---|---|
| 34 | 000100000100100 | 3 | 1 |
| 35 | 000100001000000 | −5 | 0 |
| 36 | 000100001000001 | −3 | 1 |
| 37 | 000100001000010 | −1 | 1 |
| 38 | 000100001000100 | 1 | 1 |
| 39 | 000100001001000 | 3 | 1 |
| 40 | 000100001001001 | 1 | 0 |
| 41 | 000100010000000 | −7 | 0 |
| 42 | 000100010000001 | −5 | 1 |
| 43 | 000100010000010 | −3 | 1 |
| 44 | 000100010000100 | −1 | 1 |
| 45 | 000100010001000 | 1 | 1 |
| 46 | 000100010001001 | −1 | 0 |
| 47 | 000100010010000 | 3 | 1 |
| 48 | 000100010010001 | 1 | 0 |
| 49 | 000100010010010 | −1 | 0 |
| 50 | 000100100000000 | −9 | 0 |
| 51 | 000100100000001 | −7 | 1 |
| 52 | 000100100000010 | −5 | 1 |
| 53 | 000100100000100 | −3 | 1 |
| 54 | 000100100001000 | −1 | 1 |
| 55 | 000100100001001 | −3 | 0 |
| 56 | 000100100010000 | 1 | 1 |
| 57 | 000100100010001 | −1 | 0 |
| 58 | 000100100010010 | −3 | 0 |
| 59 | 000100100100000 | 3 | 1 |
| 60 | 000100100100001 | 1 | 0 |
| 61 | 000100100100010 | −1 | 0 |
| 62 | 000100100100100 | −3 | 0 |
| 63 | 001000000000100 | 5 | 0 |
| 64 | 001000000001000 | 3 | 0 |
| 65 | 001000000001001 | 5 | 1 |
| 66 | 001000000010000 | 1 | 0 |
| 67 | 001000000010001 | 3 | 1 |
| 68 | 001000000010010 | 5 | 1 |
| 69 | 001000000100000 | −1 | 0 |
| 70 | 001000000100001 | 1 | 1 |
| 71 | 001000000100010 | 3 | 1 |
| 72 | 001000000100100 | 5 | 1 |
| 73 | 001000001000000 | −3 | 0 |
| 74 | 001000001000001 | −1 | 1 |
| 75 | 001000001000010 | 1 | 1 |
| 76 | 001000001000100 | 3 | 1 |
| 77 | 001000001001000 | 5 | 1 |
| 78 | 001000001001001 | 3 | 0 |
| 79 | 001000010000000 | −5 | 0 |
| 80 | 001000010000001 | −3 | 1 |
| 81 | 001000010000010 | −1 | 1 |
| 82 | 001000010000100 | 1 | 1 |
| 83 | 001000010001000 | 3 | 1 |
| 84 | 001000010001001 | 1 | 0 |
| 85 | 001000010010000 | 5 | 1 |
| 86 | 001000010010001 | 3 | 0 |
| 87 | 001000010010010 | 1 | 0 |
| 88 | 001000100000000 | −7 | 0 |
| 89 | 001000100000001 | −5 | 1 |
| 90 | 001000100000010 | −3 | 1 |
| 91 | 001000100000100 | −1 | 1 |
| 92 | 001000100001000 | 1 | 1 |
| 93 | 001000100001001 | −1 | 0 |
| 94 | 001000100010000 | 3 | 1 |
| 95 | 001000100010001 | 1 | 0 |
| 96 | 001000100010010 | −1 | 0 |
| 97 | 001000100100000 | 5 | 1 |
| 98 | 001000100100001 | 3 | 0 |
| 99 | 001000100100010 | 1 | 0 |
| 100 | 001000100100100 | −1 | 0 |
| 101 | 001001000000000 | −9 | 0 |
| 102 | 001001000000001 | −7 | 1 |
| 103 | 001001000000010 | −5 | 1 |
| 104 | 001001000000100 | −3 | 1 |
| 105 | 001001000001000 | −1 | 1 |
| 106 | 001001000001001 | −3 | 0 |
| 107 | 001001000010000 | 1 | 1 |
| 108 | 001001000010001 | −1 | 0 |

TABLE 1-continued (Second Embodiment)

| Source | Conversion Code | CDS | Polarity |
|---|---|---|---|
| 109 | 001001000010010 | −3 | 0 |
| 110 | 001001000100000 | 3 | 1 |
| 111 | 001001000100001 | 1 | 0 |
| 112 | 001001000100010 | −1 | 0 |
| 113 | 001001000100100 | −3 | 0 |
| 114 | 001001001000000 | 5 | 1 |
| 115 | 001001001000001 | 3 | 0 |
| 116 | 001001001000010 | 1 | 0 |
| 117 | 001001001000100 | −1 | 0 |
| 118 | 001001001001000 | −3 | 0 |
| 119 | 001001001001001 | −1 | 1 |
| 120 | 000001000000000 | 5 | 1 |
| 121 | 000001000000001 | 3 | 0 |
| 122 | 000001000000010 | 1 | 0 |
| 123 | 000001000000100 | −1 | 0 |
| 124 | 000001000001000 | −3 | 0 |
| 125 | 000001000001001 | −1 | 1 |
| 126 | 000001000010000 | −5 | 0 |
| 127 | 000001000010001 | −3 | 1 |
| 128 | 000001000010010 | −1 | 1 |
| 129 | 000001000100000 | −7 | 0 |
| 130 | 000001000100001 | −5 | 1 |
| 131 | 000001000100010 | −3 | 1 |
| 132 | 000001000100100 | −1 | 1 |
| 133 | 000001001000000 | −9 | 0 |
| 134 | 000001001000001 | −7 | 1 |
| 135 | 000001001000010 | −5 | 1 |
| 136 | 000001001000100 | −3 | 1 |
| 137 | 000001001001000 | −1 | 1 |
| 138 | 000001001001001 | −3 | 0 |
| 139 | 000010000000001 | 5 | 0 |
| 140 | 000010000000010 | 3 | 0 |
| 141 | 000010000000100 | 1 | 0 |
| 142 | 010000000001000 | 5 | 0 |
| 143 | 010000000001001 | 7 | 1 |
| 144 | 010000000010000 | 3 | 0 |
| 145 | 010000000010001 | 5 | 1 |
| 146 | 010000000010010 | 7 | 1 |
| 147 | 010000000100000 | 1 | 0 |
| 148 | 010000000100001 | 3 | 1 |
| 149 | 010000000100010 | 5 | 1 |
| 150 | 010000000100100 | 7 | 1 |
| 151 | 010000001000000 | −1 | 0 |
| 152 | 010000001000001 | 1 | 1 |
| 153 | 010000001000010 | 3 | 1 |
| 154 | 010000001000100 | 5 | 1 |
| 155 | 010000001001000 | 7 | 1 |
| 156 | 010000001001001 | 5 | 0 |
| 157 | 010000010000000 | −3 | 0 |
| 158 | 010000010000001 | −1 | 1 |
| 159 | 010000010000010 | 1 | 1 |
| 160 | 010000010000100 | 3 | 1 |
| 161 | 010000010001000 | 5 | 1 |
| 162 | 010000010001001 | 3 | 0 |
| 163 | 010000010010000 | 7 | 1 |
| 164 | 010000010010001 | 5 | 0 |
| 165 | 010000010010010 | 3 | 0 |
| 166 | 010000100000000 | −5 | 0 |
| 167 | 010000100000001 | −3 | 1 |
| 168 | 010000100000010 | −1 | 1 |
| 169 | 010000100000100 | 1 | 1 |
| 170 | 010000100001000 | 3 | 1 |
| 171 | 010000100001001 | 1 | 0 |
| 172 | 010000100010000 | 5 | 1 |
| 173 | 010000100010001 | 3 | 0 |
| 174 | 010000100010010 | 1 | 0 |
| 175 | 010000100100000 | 7 | 1 |
| 176 | 010000100100001 | 5 | 0 |
| 177 | 010000100100010 | 3 | 0 |
| 178 | 010000100100100 | 1 | 0 |
| 179 | 010001000000000 | −7 | 0 |
| 180 | 010001000000001 | −5 | 1 |
| 181 | 010001000000010 | −3 | 1 |
| 182 | 010001000000100 | −1 | 1 |
| 183 | 010001000001000 | 1 | 1 |
| 184 | 010001000001001 | −1 | 0 |
| 185 | 010001000010000 | 3 | 1 |
| 186 | 010001000010001 | 1 | 0 |
| 187 | 010001000010010 | −1 | 0 |
| 188 | 010001000100000 | 5 | 1 |
| 189 | 010001000100001 | 3 | 0 |
| 190 | 010001000100010 | 1 | 0 |
| 191 | 010001000100100 | −1 | 0 |
| 192 | 010001001000000 | 7 | 1 |
| 193 | 010001001000001 | 5 | 0 |
| 194 | 010001001000010 | 3 | 0 |
| 195 | 010001001000100 | 1 | 0 |
| 196 | 010001001001000 | −1 | 0 |
| 197 | 010001001001001 | 1 | 1 |
| 198 | 010010000000001 | −7 | 1 |
| 199 | 010010000000010 | −5 | 1 |
| 200 | 010010000000100 | −3 | 1 |
| 201 | 010010000001000 | −1 | 1 |
| 202 | 010010000001001 | −3 | 0 |
| 203 | 010010000010000 | 1 | 1 |
| 204 | 010010000010001 | −1 | 0 |
| 205 | 010010000010010 | −3 | 0 |
| 206 | 010010000100000 | 3 | 1 |
| 207 | 010010000100001 | 1 | 0 |
| 208 | 010010000100010 | −1 | 0 |
| 209 | 010010000100100 | −3 | 0 |
| 210 | 010010001000000 | 5 | 1 |
| 211 | 010010001000001 | 3 | 0 |
| 212 | 010010001000010 | 1 | 0 |
| 213 | 010010001000100 | −1 | 0 |
| 214 | 010010001001000 | −3 | 0 |
| 215 | 010010001001001 | −1 | 1 |
| 216 | 010010010000000 | 7 | 1 |
| 217 | 010010010000001 | 5 | 0 |
| 218 | 010010010000010 | 3 | 0 |
| 219 | 010010010000100 | 1 | 0 |
| 220 | 010010010001000 | −1 | 0 |
| 221 | 010010010001001 | 1 | 1 |
| 222 | 010010010010000 | −3 | 0 |
| 223 | 010010010010001 | −1 | 1 |
| 224 | 010010010010010 | 1 | 1 |
| 225 | 000000001000000 | −1 | 1 |
| 226 | 000000001000001 | −3 | 0 |
| 227 | 000000001000010 | −5 | 0 |
| 228 | 000000001000100 | −7 | 0 |
| 229 | 000000001001000 | −9 | 0 |
| 230 | 000000001001001 | −7 | 1 |
| 231 | 000000010000000 | 1 | 1 |
| 232 | 000000010000001 | −1 | 0 |
| 233 | 000000010000010 | −3 | 0 |
| 234 | 000000010000100 | −5 | 0 |
| 235 | 000000010001000 | −7 | 0 |
| 236 | 000000010001001 | −5 | 1 |
| 237 | 000000010010000 | −9 | 0 |
| 238 | 000000010010001 | −7 | 1 |
| 239 | 000000010010010 | −5 | 1 |
| 240 | 000000100000000 | 3 | 1 |
| 241 | 000000100000001 | 1 | 0 |
| 242 | 000000100000010 | −1 | 0 |
| 243 | 000000100000100 | −3 | 0 |
| 244 | 000000100001000 | −5 | 0 |
| 245 | 000000100001001 | −3 | 1 |
| 246 | 000000100010000 | −7 | 0 |
| 247 | 000000100010001 | −5 | 1 |
| 248 | 000000100010010 | −3 | 1 |
| 249 | 000000100100000 | −9 | 0 |
| 250 | 000000100100001 | −7 | 1 |
| 251 | 000000100100010 | −5 | 1 |
| 252 | 000000100100100 | −3 | 1 |
| 253 | 100000000010000 | 5 | 0 |
| 254 | 100000000010001 | 7 | 1 |
| 255 | 100000000010010 | 9 | 1 |

TABLE 2

(Second Embodiment)

| Source | Conversion Code | CDS | Polarity |
|---|---|---|---|
| 0 | 000010000001000 | −1 | 0 |
| 1 | 000010000001001 | 1 | 1 |
| 2 | 000010000010000 | −3 | 0 |
| 3 | 000010000010001 | −1 | 1 |
| 4 | 000010000010010 | 1 | 1 |
| 5 | 000010000100000 | −5 | 0 |
| 6 | 000010000100001 | −3 | 1 |
| 7 | 000010000100010 | −1 | 1 |
| 8 | 000010000100100 | 1 | 1 |
| 9 | 000010001000000 | −7 | 0 |
| 10 | 000010001000001 | −5 | 1 |
| 11 | 000010001000010 | −3 | 1 |
| 12 | 000010001000100 | −1 | 1 |
| 13 | 000010001001000 | 1 | 1 |
| 14 | 000010001001001 | −1 | 0 |
| 15 | 000010010000000 | −9 | 0 |
| 16 | 000010010000001 | −7 | 1 |
| 17 | 000010010000010 | −5 | 1 |
| 18 | 000010010000100 | −3 | 1 |
| 19 | 000010010001000 | −1 | 1 |
| 20 | 000010010001001 | −3 | 0 |
| 21 | 000010010010000 | 1 | 1 |
| 22 | 000010010010001 | −1 | 0 |
| 23 | 000010010010010 | −3 | 0 |
| 24 | 000100000000010 | 5 | 0 |
| 25 | 000100000000100 | 3 | 0 |
| 26 | 000100000001000 | 1 | 0 |
| 27 | 000100000001001 | 3 | 1 |
| 28 | 000100000010000 | −1 | 0 |
| 29 | 000100000010001 | 1 | 1 |
| 30 | 000100000010010 | 3 | 1 |
| 31 | 000100000100000 | −3 | 0 |
| 32 | 000100000100001 | −1 | 1 |
| 33 | 000100000100010 | 1 | 1 |
| 34 | 000100000100100 | 3 | 1 |
| 35 | 000100001000000 | −5 | 0 |
| 36 | 000100001000001 | −3 | 1 |
| 37 | 000100001000010 | −1 | 1 |
| 38 | 000100001000100 | 1 | 1 |
| 39 | 000100001001000 | 3 | 1 |
| 40 | 000100001001001 | 1 | 0 |
| 41 | 000100010000000 | −7 | 0 |
| 42 | 000100010000001 | −5 | 1 |
| 43 | 000100010000010 | −3 | 1 |
| 44 | 000100010000100 | −1 | 1 |
| 45 | 000100010001000 | 1 | 1 |
| 46 | 000100010001001 | −1 | 0 |
| 47 | 000100010010000 | 3 | 1 |
| 48 | 000100010010001 | 1 | 0 |
| 49 | 000100010010010 | −1 | 0 |
| 50 | 000100100000000 | −9 | 0 |
| 51 | 000100100000001 | −7 | 1 |
| 52 | 000100100000010 | −5 | 1 |
| 53 | 000100100000100 | −3 | 1 |
| 54 | 000100100001000 | −1 | 1 |
| 55 | 000100100001001 | −3 | 0 |
| 56 | 000100100010000 | 1 | 1 |
| 57 | 000100100010001 | −1 | 0 |
| 58 | 000100100010010 | −3 | 0 |
| 59 | 000100100100000 | 3 | 1 |
| 60 | 000100100100001 | 1 | 0 |
| 61 | 000100100100010 | −1 | 0 |
| 62 | 000100100100100 | −3 | 0 |
| 63 | 001000000000100 | 5 | 0 |
| 64 | 001000000001000 | 3 | 0 |
| 65 | 001000000001001 | 5 | 1 |
| 66 | 001000000010000 | 1 | 0 |
| 67 | 001000000010001 | 3 | 1 |
| 68 | 001000000010010 | 5 | 1 |
| 69 | 001000000100000 | −1 | 0 |
| 70 | 001000000100001 | 1 | 1 |
| 71 | 001000000100010 | 3 | 1 |
| 72 | 001000000100100 | 5 | 1 |
| 73 | 001000001000000 | −3 | 0 |
| 74 | 001000001000001 | −1 | 1 |

TABLE 2-continued (Second Embodiment)

| Source | Conversion Code | CDS | Polarity |
|---|---|---|---|
| 75 | 001000001000010 | 1 | 1 |
| 76 | 001000001000100 | 3 | 1 |
| 77 | 001000001001000 | 5 | 1 |
| 78 | 001000001001001 | 3 | 0 |
| 79 | 001000010000000 | −5 | 0 |
| 80 | 001000010000001 | −3 | 1 |
| 81 | 001000010000010 | −1 | 1 |
| 82 | 001000010000100 | 1 | 1 |
| 83 | 001000010001000 | 3 | 1 |
| 84 | 001000010001001 | 1 | 0 |
| 85 | 001000010010000 | 5 | 1 |
| 86 | 001000010010001 | 3 | 0 |
| 87 | 001000010010010 | 1 | 0 |
| 88 | 001000100000000 | −7 | 0 |
| 89 | 001000100000001 | −5 | 1 |
| 90 | 001000100000010 | −3 | 1 |
| 91 | 001000100000100 | −1 | 1 |
| 92 | 001000100001000 | 1 | 1 |
| 93 | 001000100001001 | −1 | 0 |
| 94 | 001000100010000 | 3 | 1 |
| 95 | 001000100010001 | 1 | 0 |
| 96 | 001000100010010 | −1 | 0 |
| 97 | 001000100100000 | 5 | 1 |
| 98 | 001000100100001 | 3 | 0 |
| 99 | 001000100100010 | 1 | 0 |
| 100 | 001000100100100 | −1 | 0 |
| 101 | 001001000000000 | −9 | 0 |
| 102 | 001001000000001 | −7 | 1 |
| 103 | 001001000000010 | −5 | 1 |
| 104 | 001001000000100 | −3 | 1 |
| 105 | 001001000001000 | −1 | 1 |
| 106 | 001001000001001 | −3 | 0 |
| 107 | 001001000010000 | 1 | 1 |
| 108 | 001001000010001 | −1 | 0 |
| 109 | 001001000010010 | −3 | 0 |
| 110 | 001001000100000 | 3 | 1 |
| 111 | 001001000100001 | 1 | 0 |
| 112 | 001001000100010 | −1 | 0 |
| 113 | 001001000100100 | −3 | 0 |
| 114 | 001001001000000 | 5 | 1 |
| 115 | 001001001000001 | 3 | 0 |
| 116 | 001001001000010 | 1 | 0 |
| 117 | 001001001000100 | −1 | 0 |
| 118 | 001001001001000 | −3 | 0 |
| 119 | 001001001001001 | −1 | 1 |
| 120 | 000001000000000 | 5 | 1 |
| 121 | 000001000000001 | 3 | 0 |
| 122 | 000001000000010 | 1 | 0 |
| 123 | 000001000000100 | −1 | 0 |
| 124 | 000001000001000 | −3 | 0 |
| 125 | 000001000001001 | −1 | 1 |
| 126 | 000001000010000 | −5 | 0 |
| 127 | 000001000010001 | −3 | 1 |
| 128 | 000001000010010 | −1 | 1 |
| 129 | 000001000100000 | −7 | 0 |
| 130 | 000001000100001 | −5 | 1 |
| 131 | 000001000100010 | −3 | 1 |
| 132 | 000001000100100 | −1 | 1 |
| 133 | 000001001000000 | −9 | 0 |
| 134 | 000001001000001 | −7 | 1 |
| 135 | 000001001000010 | −5 | 1 |
| 136 | 000001001000100 | −3 | 1 |
| 137 | 000001001001000 | −1 | 1 |
| 138 | 000001001001001 | −3 | 0 |
| 139 | 000010000000001 | 5 | 0 |
| 140 | 000010000000010 | 3 | 0 |
| 141 | 000010000000100 | 1 | 0 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |

TABLE 2-continued

(Second Embodiment)

| Source | Conversion Code | CDS | Polarity |
|---|---|---|---|
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000000 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 3

(Second Embodiment)

| Source | Conversion Code | CDS | Polarity |
|---|---|---|---|
| 0 | 000010000001000 | −1 | 0 |
| 1 | 000010000001001 | 1 | 1 |
| 2 | 000010000010000 | −3 | 0 |
| 3 | 000010000010001 | −1 | 1 |
| 4 | 000010000010010 | 1 | 1 |
| 5 | 000010000100000 | −5 | 0 |
| 6 | 000010000100001 | −3 | 1 |
| 7 | 000010000100010 | −1 | 1 |
| 8 | 000010000100100 | 1 | 1 |
| 9 | 000010001000000 | −7 | 0 |
| 10 | 000010001000001 | −5 | 1 |
| 11 | 000010001000010 | −3 | 1 |
| 12 | 000010001000100 | −1 | 1 |
| 13 | 000010001001000 | 1 | 1 |
| 14 | 000010001001001 | −1 | 0 |
| 15 | 000010010000000 | −9 | 0 |
| 16 | 000010010000001 | −7 | 1 |
| 17 | 000010010000010 | −5 | 1 |
| 18 | 000010010000100 | −3 | 1 |
| 19 | 000010010001000 | −1 | 1 |
| 20 | 000010010001001 | −3 | 0 |
| 21 | 000010010010000 | 1 | 1 |
| 22 | 000010010010001 | −1 | 0 |
| 23 | 000010010010010 | −3 | 0 |
| 24 | 000100000000010 | 5 | 0 |
| 25 | 000100000000100 | 3 | 0 |
| 26 | 000100000001000 | 1 | 0 |
| 27 | 000100000001001 | 3 | 1 |
| 28 | 000100000010000 | −1 | 0 |
| 29 | 000100000010001 | 1 | 1 |
| 30 | 000100000010010 | 3 | 1 |
| 31 | 000100000100000 | −3 | 0 |
| 32 | 000100000100001 | −1 | 1 |
| 33 | 000100000100010 | 1 | 1 |

TABLE 3-continued (Second Embodiment)

| Source | Conversion Code | CDS | Polarity |
|---|---|---|---|
| 34 | 000100000100100 | 3 | 1 |
| 35 | 000100001000000 | −5 | 0 |
| 36 | 000100001000001 | −3 | 1 |
| 37 | 000100001000010 | −1 | 1 |
| 38 | 000100001000100 | 1 | 1 |
| 39 | 000100001001000 | 3 | 1 |
| 40 | 000100001001001 | 1 | 0 |
| 41 | 000100010000000 | −7 | 0 |
| 42 | 000100010000001 | −5 | 1 |
| 43 | 000100010000010 | −3 | 1 |
| 44 | 000100010000100 | −1 | 1 |
| 45 | 000100010001000 | 1 | 1 |
| 46 | 000100010001001 | −1 | 0 |
| 47 | 000100010010000 | 3 | 1 |
| 48 | 000100010010001 | 1 | 0 |
| 49 | 000100010010010 | −1 | 0 |
| 50 | 000100100000000 | −9 | 0 |
| 51 | 000100100000001 | −7 | 1 |
| 52 | 000100100000010 | −5 | 1 |
| 53 | 000100100000100 | −3 | 1 |
| 54 | 000100100001000 | −1 | 1 |
| 55 | 000100100001001 | −3 | 0 |
| 56 | 000100100010000 | 1 | 1 |
| 57 | 000100100010001 | −1 | 0 |
| 58 | 000100100010010 | −3 | 0 |
| 59 | 000100100100000 | 3 | 1 |
| 60 | 000100100100001 | 1 | 0 |
| 61 | 000100100100010 | −1 | 0 |
| 62 | 000100100100100 | −3 | 0 |
| 63 | 001000000000100 | 5 | 0 |
| 64 | 001000000001000 | 3 | 0 |
| 65 | 001000000001001 | 5 | 1 |
| 66 | 001000000010000 | 1 | 0 |
| 67 | 001000000010001 | 3 | 1 |
| 68 | 001000000010010 | 5 | 1 |
| 69 | 001000000100000 | −1 | 0 |
| 70 | 001000000100001 | 1 | 1 |
| 71 | 001000000100010 | 3 | 1 |
| 72 | 001000000100100 | 5 | 1 |
| 73 | 001000001000000 | −3 | 0 |
| 74 | 001000001000001 | −1 | 1 |
| 75 | 001000001000010 | 1 | 1 |
| 76 | 001000001000100 | 3 | 1 |
| 77 | 001000001001000 | 5 | 1 |
| 78 | 001000001001001 | 3 | 0 |
| 79 | 001000010000000 | −5 | 0 |
| 80 | 001000010000001 | −3 | 1 |
| 81 | 001000010000010 | −1 | 1 |
| 82 | 001000010000100 | 1 | 1 |
| 83 | 001000010001000 | 3 | 1 |
| 84 | 001000010001001 | 1 | 0 |
| 85 | 001000010010000 | 5 | 1 |
| 86 | 001000010010001 | 3 | 0 |
| 87 | 001000010010010 | 1 | 0 |
| 88 | 001000100000000 | −7 | 0 |
| 89 | 001000100000001 | −5 | 1 |
| 90 | 001000100000010 | −3 | 1 |
| 91 | 001000100000100 | −1 | 1 |
| 92 | 001000100001000 | 1 | 1 |
| 93 | 001000100001001 | −1 | 0 |
| 94 | 001000100010000 | 3 | 1 |
| 95 | 001000100010001 | 1 | 0 |
| 96 | 001000100010010 | −1 | 0 |
| 97 | 001000100100000 | 5 | 1 |
| 98 | 001000100100001 | 3 | 0 |
| 99 | 001000100100010 | 1 | 0 |
| 100 | 001000100100100 | −1 | 0 |
| 101 | 001001000000000 | −9 | 0 |
| 102 | 001001000000001 | −7 | 1 |
| 103 | 001001000000010 | −5 | 1 |
| 104 | 001001000000100 | −3 | 1 |
| 105 | 001001000001000 | −1 | 1 |
| 106 | 001001000001001 | −3 | 0 |
| 107 | 001001000010000 | 1 | 1 |
| 108 | 001001000010001 | −1 | 0 |
| 109 | 001001000010010 | −3 | 0 |
| 110 | 001001000100000 | 3 | 1 |
| 111 | 001001000100001 | 1 | 0 |
| 112 | 001001000100010 | −1 | 0 |
| 113 | 001001000100100 | −3 | 0 |
| 114 | 001001001000000 | 5 | 1 |
| 115 | 001001001000001 | 3 | 0 |
| 116 | 001001001000010 | 1 | 0 |
| 117 | 001001001000100 | −1 | 0 |
| 118 | 001001001001000 | −3 | 0 |
| 119 | 001001001001001 | −1 | 1 |
| 120 | 000000010000000 | 1 | 1 |
| 121 | 000000010000001 | −1 | 0 |
| 122 | 000000010000010 | −3 | 0 |
| 123 | 000000010000100 | −5 | 0 |
| 124 | 000000010001000 | −7 | 0 |
| 125 | 000000010001001 | −5 | 1 |
| 126 | 000000010010000 | −9 | 0 |
| 127 | 000000010010001 | −7 | 1 |
| 128 | 000000010010010 | −5 | 1 |
| 129 | 000000100000000 | 3 | 1 |
| 130 | 000000100000001 | 1 | 0 |
| 131 | 000000100000010 | −1 | 0 |
| 132 | 000000100000100 | −3 | 0 |
| 133 | 000000100001000 | −5 | 0 |
| 134 | 000000100001001 | −3 | 1 |
| 135 | 000000100010000 | −7 | 0 |
| 136 | 000000100010001 | −5 | 1 |
| 137 | 000000100010010 | −3 | 1 |
| 138 | 000000100100000 | −9 | 0 |
| 139 | 000000100100001 | −7 | 1 |
| 140 | 000000100100010 | −5 | 1 |
| 141 | 000000100100100 | −3 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |

TABLE 3-continued

(Second Embodiment)

| Source | Conversion Code | CDS | Polarity |
|---|---|---|---|
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010010001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001600 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 4

(Second Embodiment)

| Source | Conversion Code | CDS | Polarity |
|---|---|---|---|
| 0 | 010000000001000 | 5 | 0 |
| 1 | 010000000001001 | 7 | 1 |
| 2 | 010000000010000 | 3 | 0 |
| 3 | 010000000010001 | 5 | 1 |
| 4 | 010000000010010 | 7 | 1 |
| 5 | 010000000100000 | 1 | 0 |
| 6 | 010000000100001 | 3 | 1 |
| 7 | 010000000100010 | 5 | 1 |
| 8 | 010000000100100 | 7 | 1 |
| 9 | 010000001000000 | −1 | 0 |
| 10 | 010000001000001 | 1 | 1 |
| 11 | 010000001000010 | 3 | 1 |
| 12 | 010000001000100 | 5 | 1 |
| 13 | 010000001001000 | 7 | 1 |
| 14 | 010000001001001 | 5 | 0 |
| 15 | 010000010000000 | −3 | 0 |
| 16 | 010000010000001 | −1 | 1 |
| 17 | 010000010000010 | 1 | 1 |
| 18 | 010000010000100 | 3 | 1 |
| 19 | 010000010001000 | 5 | 1 |
| 20 | 010000010001001 | 3 | 0 |
| 21 | 010000010010000 | 7 | 1 |
| 22 | 010000010010001 | 5 | 0 |
| 23 | 010000010010010 | 3 | 0 |
| 24 | 010000100000000 | −1 | 0 |
| 25 | 010000100000001 | −3 | 1 |
| 26 | 000100000001000 | 1 | 0 |
| 27 | 000100000001001 | 3 | 1 |
| 28 | 000100000010000 | −1 | 0 |
| 29 | 000100000010001 | 1 | 1 |
| 30 | 000100000010010 | 3 | 1 |
| 31 | 000100000100000 | −3 | 0 |
| 32 | 000100000100001 | −1 | 1 |
| 33 | 000100000100010 | 1 | 1 |
| 34 | 000100000100100 | 3 | 1 |
| 35 | 000100001000000 | −5 | 0 |
| 36 | 000100001000001 | −3 | 1 |
| 37 | 000100001000010 | −1 | 1 |
| 38 | 000100001000100 | 1 | 1 |
| 39 | 000100001001000 | 3 | 1 |
| 40 | 000100001001001 | 1 | 0 |
| 41 | 000100010000000 | −7 | 0 |
| 42 | 000100010000001 | −5 | 1 |
| 43 | 000100010000010 | −3 | 1 |
| 44 | 000100010000100 | −1 | 1 |
| 45 | 000100010001000 | 1 | 1 |
| 46 | 000100010001001 | −1 | 0 |
| 47 | 000100100010000 | 3 | 1 |
| 48 | 000100100010001 | 1 | 0 |
| 49 | 000100100010010 | −1 | 0 |
| 50 | 000100100000000 | −9 | 0 |
| 51 | 000100100000001 | −7 | 1 |
| 52 | 000100100000010 | −5 | 1 |
| 53 | 000100100000100 | −3 | 1 |
| 54 | 000100100001000 | −1 | 1 |
| 55 | 000100100001001 | −3 | 0 |
| 56 | 000100100010000 | 1 | 1 |
| 57 | 000100100010001 | −1 | 0 |
| 58 | 000100100010010 | −3 | 0 |
| 59 | 000100100100000 | 3 | 1 |
| 60 | 000100100100001 | 1 | 0 |
| 61 | 000100101100100 | −1 | 0 |
| 62 | 000100100100100 | −3 | 0 |
| 63 | 010000100000010 | −1 | 1 |
| 64 | 010000100000100 | 1 | 1 |
| 65 | 010000100001000 | 3 | 1 |
| 66 | 010000100001001 | 1 | 0 |
| 67 | 010000100010000 | 5 | 1 |
| 68 | 010000100010001 | 3 | 0 |
| 69 | 010000100010010 | 1 | 0 |
| 70 | 010000100100000 | 7 | 1 |
| 71 | 010000100100001 | 5 | 0 |
| 72 | 010000100100010 | 3 | 0 |
| 73 | 010000100100100 | 1 | 0 |
| 74 | 010001000000000 | −7 | 0 |

TABLE 4-continued (Second Embodiment)

| Source | Conversion Code | CDS | Polarity |
|---|---|---|---|
| 75 | 010001000000001 | −5 | 1 |
| 76 | 010001000000010 | −3 | 1 |
| 77 | 010001000000100 | −1 | 1 |
| 78 | 010001000001000 | 1 | 1 |
| 79 | 010001000001001 | −1 | 0 |
| 80 | 010001000010000 | 3 | 1 |
| 81 | 010001000010001 | 1 | 0 |
| 82 | 010001000010010 | −1 | 0 |
| 83 | 010001000100000 | 5 | 1 |
| 84 | 010001000100001 | 3 | 0 |
| 85 | 010001000100010 | 1 | 0 |
| 86 | 010001000100100 | −1 | 0 |
| 87 | 010001001000000 | 7 | 1 |
| 88 | 010001001000001 | 5 | 0 |
| 89 | 010001001000010 | 3 | 0 |
| 90 | 010001001000100 | 1 | 0 |
| 91 | 010001001001000 | −1 | 0 |
| 92 | 010001001001001 | 1 | 1 |
| 93 | 010010000000001 | −7 | 1 |
| 94 | 010010000000010 | −5 | 1 |
| 95 | 010010000000100 | −3 | 1 |
| 96 | 010010000001000 | −1 | 1 |
| 97 | 010010000001001 | −3 | 0 |
| 98 | 010010000010000 | 1 | 1 |
| 99 | 010010000010001 | −1 | 0 |
| 100 | 010010000010010 | −3 | 0 |
| 101 | 010010000100000 | 3 | 1 |
| 102 | 010010000100001 | 1 | 0 |
| 103 | 010010000100010 | −1 | 0 |
| 104 | 010010000100100 | −3 | 0 |
| 105 | 010010001000000 | 5 | 1 |
| 106 | 010010001000001 | 3 | 0 |
| 107 | 010010001000010 | 1 | 0 |
| 108 | 010010001000100 | −1 | 0 |
| 109 | 010010001001000 | −3 | 0 |
| 110 | 010010001001001 | −1 | 1 |
| 111 | 010010010000000 | 7 | 1 |
| 112 | 010010010000001 | 5 | 0 |
| 113 | 010010010000010 | 3 | 0 |
| 114 | 010010010000100 | 1 | 0 |
| 115 | 010010010001000 | −1 | 0 |
| 116 | 010010010001001 | 1 | 1 |
| 117 | 010010010010000 | −3 | 0 |
| 118 | 010010010010001 | −1 | 1 |
| 119 | 010010010010010 | 1 | 1 |
| 120 | 000000010000000 | 1 | 1 |
| 121 | 000000010000001 | −1 | 0 |
| 122 | 000000010000010 | −3 | 0 |
| 123 | 000000010000100 | −5 | 0 |
| 124 | 000000010001000 | −7 | 0 |
| 125 | 000000010001001 | −5 | 1 |
| 126 | 000000010010000 | −9 | 0 |
| 127 | 000000010010001 | −7 | 1 |
| 128 | 000000010010010 | −5 | 1 |
| 129 | 000000100000000 | 3 | 1 |
| 130 | 000000100000001 | 1 | 0 |
| 131 | 000000100000010 | −1 | 0 |
| 132 | 000000100000100 | −3 | 0 |
| 133 | 000000100001000 | −5 | 0 |
| 134 | 000000100001001 | −3 | 1 |
| 135 | 000000100010000 | −7 | 0 |
| 136 | 000000100010001 | −5 | 1 |
| 137 | 000000100010010 | −3 | 1 |
| 138 | 000000100100000 | −9 | 0 |
| 139 | 000000100100001 | −7 | 1 |
| 140 | 000000100100010 | −5 | 1 |
| 141 | 000000100100100 | −3 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 106001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 1 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |

TABLE 4-continued (Second Embodiment)

| Source | Conversion Code | CDS | Polarity |
|---|---|---|---|
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

TABLE 5

(Second Embodiment)

| Source | Conversion Code | CDS | Polarity |
|---|---|---|---|
| 0 | 010000000001000 | 5 | 0 |
| 1 | 010000000001001 | 7 | 1 |
| 2 | 010000000010000 | 3 | 0 |
| 3 | 010000000010001 | 5 | 1 |
| 4 | 010000000010010 | 7 | 1 |
| 5 | 010000000100000 | 1 | 0 |
| 6 | 010000000100001 | 3 | 1 |
| 7 | 010000000100010 | 5 | 1 |
| 8 | 010000000100100 | 7 | 1 |
| 9 | 010000001000000 | −1 | 0 |
| 10 | 010000001000001 | 1 | 1 |
| 11 | 010000001000010 | 3 | 1 |
| 12 | 010000001000100 | 5 | 1 |
| 13 | 010000001001000 | 7 | 1 |
| 14 | 010000001001001 | 5 | 0 |
| 15 | 010000010000000 | −3 | 0 |
| 16 | 010000010000001 | −1 | 1 |
| 17 | 010000010000010 | 1 | 1 |
| 18 | 010000010000100 | 3 | 1 |
| 19 | 010000010001000 | 5 | 1 |
| 20 | 010000010001001 | 3 | 0 |
| 21 | 010000010010000 | 7 | 1 |
| 22 | 010000010010001 | 5 | 0 |
| 23 | 010000010010010 | 3 | 0 |
| 24 | 010000100000000 | −5 | 0 |
| 25 | 010000100000001 | −3 | 1 |
| 26 | 010000100000010 | −1 | 1 |
| 27 | 010000100000100 | 1 | 1 |
| 28 | 010000100001000 | 3 | 1 |
| 29 | 010000100001001 | 1 | 0 |
| 30 | 010000100010000 | 5 | 1 |
| 31 | 010000100010001 | 3 | 0 |
| 32 | 010000100010010 | 1 | 0 |
| 33 | 010000100100000 | 7 | 1 |

TABLE 5-continued (Second Embodiment)

| Source | Conversion Code | CDS | Polarity |
|---|---|---|---|
| 34 | 010000100100001 | 5 | 0 |
| 35 | 010000100100010 | 3 | 0 |
| 36 | 010000100100100 | 1 | 0 |
| 37 | 010001000000000 | −7 | 0 |
| 38 | 010001000000001 | −5 | 1 |
| 39 | 010001000000010 | −3 | 1 |
| 40 | 010001000000100 | −1 | 1 |
| 41 | 010001000001000 | 1 | 1 |
| 42 | 010001000001001 | −1 | 0 |
| 43 | 010001000010000 | 3 | 1 |
| 44 | 010001000010001 | 1 | 0 |
| 45 | 010001000010010 | −1 | 0 |
| 46 | 010001000100000 | 5 | 1 |
| 47 | 010001000100001 | 3 | 0 |
| 48 | 010001000100010 | 1 | 0 |
| 49 | 010001000100100 | −1 | 0 |
| 50 | 010001001000000 | 7 | 1 |
| 51 | 010001001000001 | 5 | 0 |
| 52 | 010001001000010 | 3 | 0 |
| 53 | 010001001000100 | 1 | 0 |
| 54 | 010001001001000 | −1 | 0 |
| 55 | 010001001001001 | 1 | 1 |
| 56 | 010010000000001 | −7 | 1 |
| 57 | 010010000000010 | −5 | 1 |
| 58 | 010010000000100 | −3 | 1 |
| 59 | 010010000001000 | −1 | 1 |
| 60 | 010010000001001 | −3 | 0 |
| 61 | 010010000010000 | 1 | 1 |
| 62 | 010010000010001 | −1 | 0 |
| 63 | 010010000010010 | −3 | 0 |
| 64 | 010010000100000 | 1 | 1 |
| 65 | 010010000100001 | 1 | 0 |
| 66 | 010010000100010 | −1 | 0 |
| 67 | 001000000010001 | 3 | 1 |
| 68 | 001000000010010 | 5 | 1 |
| 69 | 001000000100000 | −1 | 0 |
| 70 | 001000000100001 | 1 | 1 |
| 71 | 001000000100010 | 3 | 1 |
| 72 | 001000000100100 | 5 | 1 |
| 73 | 001000001000000 | −3 | 0 |
| 74 | 001000001000001 | −1 | 1 |
| 75 | 001000001000010 | 1 | 1 |
| 76 | 001000001000100 | 3 | 1 |
| 77 | 001000001001000 | 5 | 1 |
| 78 | 001000001001001 | 3 | 0 |
| 79 | 001000010000000 | −5 | 0 |
| 80 | 001000010000001 | −3 | 1 |
| 81 | 001000010000010 | −1 | 1 |
| 82 | 001000010000100 | 1 | 1 |
| 83 | 001000010001000 | 3 | 1 |
| 84 | 001000010001001 | 1 | 0 |
| 85 | 001000010010000 | 5 | 1 |
| 86 | 001000010010001 | 3 | 0 |
| 87 | 001000010010010 | 1 | 0 |
| 88 | 001000100000000 | −7 | 0 |
| 89 | 001000100000001 | −5 | 1 |
| 90 | 001000100000010 | −3 | 1 |
| 91 | 001000100000100 | −1 | 1 |
| 92 | 001000100001000 | 1 | 1 |
| 93 | 001000100001001 | −1 | 0 |
| 94 | 001000100010000 | 3 | 1 |
| 95 | 001000100010001 | 1 | 0 |
| 96 | 001000100010010 | −1 | 0 |
| 97 | 001000100100000 | 5 | 1 |
| 98 | 001000100100001 | 3 | 0 |
| 99 | 001000100100010 | 1 | 0 |
| 100 | 001000100100100 | −1 | 0 |
| 101 | 001001000000000 | −9 | 0 |
| 102 | 001001000000001 | −7 | 1 |
| 103 | 001001000000010 | −5 | 1 |
| 104 | 001001000000100 | −3 | 1 |
| 105 | 001001000001000 | −1 | 1 |
| 106 | 001001000001001 | −3 | 0 |
| 107 | 001001000010000 | 1 | 1 |
| 108 | 001001000010001 | −1 | 0 |

TABLE 5-continued (Second Embodiment)

| Source | Conversion Code | CDS | Polarity |
|---|---|---|---|
| 109 | 001001000010010 | −3 | 0 |
| 110 | 001001000100000 | 3 | 1 |
| 111 | 001001000100001 | 1 | 0 |
| 112 | 001001000100010 | −1 | 0 |
| 113 | 001001000100100 | −3 | 0 |
| 114 | 001001001000000 | 5 | 1 |
| 115 | 001001001000001 | 3 | 0 |
| 116 | 001001001000010 | 1 | 0 |
| 117 | 001001001000100 | −1 | 0 |
| 118 | 001001001001000 | −3 | 0 |
| 119 | 001001001001001 | −1 | 1 |
| 120 | 010010000100100 | −3 | 0 |
| 121 | 010010001000000 | 5 | 1 |
| 122 | 010010001000001 | 3 | 0 |
| 123 | 010010001000010 | 1 | 0 |
| 124 | 010010001000100 | −1 | 0 |
| 125 | 010010001001000 | −3 | 0 |
| 126 | 010010001001001 | −1 | 1 |
| 127 | 010010010000000 | 7 | 1 |
| 129 | 010010010000010 | 3 | 0 |
| 130 | 010010010000100 | 1 | 0 |
| 131 | 010010010001000 | −1 | 0 |
| 132 | 010010010001001 | 1 | 1 |
| 133 | 010010010010000 | −3 | 0 |
| 134 | 010010010010001 | −1 | 1 |
| 135 | 010010010010010 | 1 | 1 |
| 136 | 100000000010000 | 5 | 0 |
| 137 | 100000000010001 | 7 | 1 |
| 138 | 100000000010010 | 9 | 1 |
| 139 | 100000000100000 | 3 | 0 |
| 140 | 100000000100001 | 5 | 1 |
| 141 | 100000000100010 | 7 | 1 |
| 142 | 100000000100100 | 9 | 1 |
| 143 | 100000001000000 | 1 | 0 |
| 144 | 100000001000001 | 3 | 1 |
| 145 | 100000001000010 | 5 | 1 |
| 146 | 100000001000100 | 7 | 1 |
| 147 | 100000001001000 | 9 | 1 |
| 148 | 100000001001001 | 7 | 0 |
| 149 | 100000010000000 | −1 | 0 |
| 150 | 100000010000001 | 1 | 1 |
| 151 | 100000010000010 | 3 | 1 |
| 152 | 100000010000100 | 5 | 1 |
| 153 | 100000010001000 | 7 | 1 |
| 154 | 100000010001001 | 5 | 0 |
| 155 | 100000010010000 | 9 | 1 |
| 156 | 100000010010001 | 7 | 0 |
| 157 | 100000010010010 | 5 | 0 |
| 158 | 100000100000000 | −3 | 0 |
| 159 | 100000100000001 | −1 | 1 |
| 160 | 100000100000010 | 1 | 1 |
| 161 | 100000100000100 | 3 | 1 |
| 162 | 100000100001000 | 5 | 1 |
| 163 | 100000100001001 | 3 | 0 |
| 164 | 100000100010000 | 7 | 1 |
| 165 | 100000100010001 | 5 | 0 |
| 166 | 100000100010010 | 3 | 0 |
| 167 | 100000100100000 | 9 | 1 |
| 168 | 100000100100001 | 7 | 0 |
| 169 | 100000100100010 | 5 | 0 |
| 170 | 100000100100100 | 3 | 0 |
| 171 | 100001000000000 | −5 | 0 |
| 172 | 100001000000001 | −3 | 1 |
| 173 | 100001000000010 | −1 | 1 |
| 174 | 100001000000100 | 1 | 1 |
| 175 | 100001000001000 | 3 | 1 |
| 176 | 100001000001001 | 1 | 0 |
| 177 | 100001000010000 | 5 | 1 |
| 178 | 100001000010001 | 3 | 0 |
| 179 | 100001000010010 | 1 | 0 |
| 180 | 100001000100000 | 7 | 1 |
| 181 | 100001000100001 | 5 | 0 |
| 182 | 100001000100010 | 3 | 0 |
| 183 | 100001000100100 | 1 | 0 |
| 184 | 100001001000000 | 9 | 1 |
| 185 | 100001001000001 | 7 | 0 |
| 186 | 100001001000010 | 5 | 0 |
| 187 | 100001001000100 | 3 | 0 |
| 188 | 100001001001000 | 1 | 0 |
| 189 | 100001001001001 | 3 | 1 |
| 190 | 100010000000001 | −5 | 1 |
| 191 | 100010000000010 | −3 | 1 |
| 192 | 100010000000100 | −1 | 1 |
| 193 | 100010000001000 | 1 | 1 |
| 194 | 100010000001001 | −1 | 0 |
| 195 | 100010000010000 | 3 | 1 |
| 196 | 100010000010001 | 1 | 0 |
| 197 | 100010000010010 | −1 | 0 |
| 198 | 100010000100000 | 5 | 1 |
| 199 | 100010000100001 | 3 | 0 |
| 200 | 100010000100010 | 1 | 0 |
| 201 | 100010000100100 | −1 | 0 |
| 202 | 100010001000000 | 7 | 1 |
| 203 | 100010001000001 | 5 | 0 |
| 204 | 100010001000010 | 3 | 0 |
| 205 | 100010001000100 | 1 | 0 |
| 206 | 100010001001000 | −1 | 0 |
| 207 | 100010001001001 | 1 | 1 |
| 208 | 100010010000000 | 9 | 1 |
| 209 | 100010010000001 | 7 | 0 |
| 210 | 100010010000010 | 5 | 0 |
| 211 | 100010010000100 | 3 | 0 |
| 212 | 100010010001000 | 1 | 0 |
| 213 | 100010010001001 | 3 | 0 |
| 214 | 100010010010000 | −1 | 0 |
| 215 | 100010010010001 | 1 | 1 |
| 216 | 100010010010010 | 3 | 1 |
| 217 | 100100000000010 | −5 | 1 |
| 218 | 100100000000100 | −3 | 1 |
| 219 | 100100000001000 | −1 | 1 |
| 220 | 100100000001001 | −3 | 0 |
| 221 | 100100000010000 | 1 | 1 |
| 222 | 100100000010001 | −1 | 0 |
| 223 | 100100000010010 | −3 | 0 |
| 224 | 100100000100000 | 3 | 1 |
| 225 | 100100000100001 | 1 | 0 |
| 226 | 100100000100010 | −1 | 0 |
| 227 | 100100000100100 | −3 | 0 |
| 228 | 100100001000000 | 5 | 1 |
| 229 | 100100001000001 | 3 | 0 |
| 230 | 100100001000010 | 1 | 0 |
| 231 | 100100001000100 | −1 | 0 |
| 232 | 100100001001000 | −3 | 0 |
| 233 | 100100001001001 | −1 | 1 |
| 234 | 100100010000000 | 7 | 1 |
| 235 | 100100010000001 | 5 | 0 |
| 236 | 100100010000010 | 3 | 0 |
| 237 | 100100010000100 | 1 | 0 |
| 238 | 100100010001000 | −1 | 0 |
| 239 | 100100010001001 | 1 | 1 |
| 240 | 100100010010000 | −3 | 0 |
| 241 | 100100010010001 | −1 | 1 |
| 242 | 100100010010010 | 1 | 1 |
| 243 | 100100100000000 | 9 | 1 |
| 244 | 100100100000001 | 7 | 0 |
| 245 | 100100100000010 | 5 | 0 |
| 246 | 100100100000100 | 3 | 0 |
| 247 | 100100100001000 | 1 | 0 |
| 248 | 100100100001001 | 3 | 1 |
| 249 | 100100100010000 | −1 | 0 |
| 250 | 100100100010001 | 1 | 1 |
| 251 | 100100100010010 | 3 | 1 |
| 252 | 100100100100000 | −3 | 0 |
| 253 | 100100100100001 | −1 | 1 |
| 254 | 100100100100010 | 1 | 1 |
| 255 | 100100100100100 | 3 | 1 |

We claim:

1. A digital encoding circuit which encodes an m-bit dataword cut out of an input binary data stream one after another to an n-bit codeword by referring to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

different types of look-up tables;

reading means for reading a current n-bit codeword indicated by the m-bit dataword from the look-up table being selected by a selecting-code;

selecting means for selecting the look-up table according to a number of consecutive logical 0's at lower digits of a preceding n-bit codeword to generate the selecting-code; and replacing means for replacing a bit pattern at lower digits of a current n-bit codeword in accordance with a number of consecutive logical 0's at upper digits of a following n-bit codeword.

2. A digital encoding circuit according to claim 1, wherein said selecting means selects the look-up table that enables to be satisfied said constraint over the current n-bit codeword and the preceding n-bit codeword.

3. A digital encoding circuit according to claim 1:

wherein said selecting means selects such a look-up table that enables to be satisfied said constraint over the current n-bit codeword and the preceding n-bit codeword; and, wherein said replacing means replaces the lower digits to be satisfied said constraint over the current n-bit codeword and the preceding n-bit codeword.

4. A digital encoding circuit which encodes an m-bit dataword cut out of an input binary data stream one after another to an n-bit codeword, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

translating means for translating the m-bit dataword to a current n-bit codeword;

generating means for generating a replacing-code, the replacing-code indicating a number of consecutive logical 0's at upper digits of the current n-bit codeword; and, replacing means for replacing lower digits of a preceding n-bit codeword according to the replacing-code.

5. A digital encoding circuit according to claim 4, wherein said replacing means replaces the lower digits to be satisfied said constraint over the current n-bit codeword and the preceding n-bit codeword.

6. A digital encoding circuit which encodes an m-bit dataword cut out of an input binary data stream one after another to an n-bit codeword by reffering to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

different types of look-up tables;

reading means for reading a current n-bit codeword indicated by the m-bit dataword from the look-up table being selected by a selecting-code;

selecting means for selecting the look-up table according to a number of consecutive logical 0's at lower digits of preceding n-bit codeword to generate the selecting-code;

generating means for generating a replacing-code, the replacing-code indicating the number of consecutive logical 0's at upper digits of the current n-bit codeword; and, replacing means for replacing lower digits of the preceding n-bit codeword according to the replacing-code.

7. A digital encoding circuit which encodes an 8-bit dataword cut out of an input binary data stream one after another to a 15-bit codeword by reffering to a look-up table, the 15-bit codeword satisfying such constraint that two logical 1's should be separated by a run of at least 2 consecutive logical 0's and any run of consecutive logical 0's has a length of at most 9, comprising:

a translation-table ROM being addressed by an 8-bit dataword and by a selecting-code, and generating the current 15-bit codeword;

a selection-table ROM being addressed by the lower 9 bits of a preceding 15-bit codeword, and generating the selecting-code;

a replacement-table ROM being addressed by the upper 9 bits of a current 15-bit codeword and by the lower 7 bits of a preceding 15-bit codeword, and generating a 7-bit code; and, a parallel-to-serial converter input the upper 8 bits of the preceding 15-bit codeword to an upper-bit-port and input the lower 7 bits of the preceding 15-bit codeword to an lower-bit-port, and generating a binary code sequence.

8. A digital decoding circuit which decodes an n-bit codeword to an m-bit dataword by referring to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

different types of look-up tables;

reading means for reading the m-bit dataword indicated by a current n-bit codeword from the look-up table being selected by a selecting-code;

selecting means for selecting the look-up table according to a number of consecutive logical 0's at lower digits of a preceding n-bit codeword to generate the selecting-code; and replacing means for replacing a bit pattern at lower digits of a current n-bit codeword in accordance with a number of consecutive logical 0's at upper digits of a following n-bit codeword.

9. A digital decoding circuit which decodes an n-bit codeword to the m-bit dataword, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

translating means for translating a current n-bit codeword to an m-bit dataword;

generating means for generating a replacing-code, the replacing-code indicating the number of consecutive logical 0's at upper digits of the following n-bit codeword; and, replacing means for replacing lower the digits of the current n-bit codeword according to the replacing-code.

10. A digital decoding circuit which decodes an n-bit codeword to an m-bit dataword by reffering to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising:

different types of look-up tables;

reading means for reading the m-bit dataword indicated by a current n-bit codeword from the look-up table being selected by a selecting-code;

selecting means for selecting the look-up table according to a number of consecutive logical 0's at lower digits of a preceding n-bit codeword to generate a selecting-code;

generating means for generating a replacing-code, the replacing-code indicating the number of consecutive logical 0's at upper digits of the following n-bit codeword; and, replacing means for replacing lower digits of the current n-bit codeword according to the replacing-code.

11. A digital decoding circuit which decodes a 15-bit codeword to an 8-bit dataword by reffering to a look-up table, the 15-bit codeword satisfying such constraint that two logical 1's should be separated by a run of at least 2 consecutive logical 0's and any run of consecutive logical 0's has a length of at most 9, comprising:

a replacement-table ROM being addressed by the upper 9 bits of the following 15-bit codeword and by the lower 7 bits of the current 15-bit codeword, and generating a 7-bit code to replace the lower 7 bits;

a selection-table ROM being addressed by the lower 9 bits of the preceding 15-bit codeword, and generating a selecting-code; and, a translation-table ROM being addressed by the current 15-bit codeword and by the selecting-code, and generating the 8-bit dataword.

12. A method for encoding an m-bit dataword cut out of an input binary data stream one after another to an n-bit codeword by referring to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising the steps of:

reading the current n-bit codeword indicated by an m-bit dataword from the look-up table being selected by a selecting code;

selecting the look-up table according to a number of consecutive logical 0's at lower digits of a preceding n-bit codeword to generate the selecting-code; and replacing a bit pattern at lower digits of a current n-bit codeword in accordance with a number of consecutive logical 0's at upper digits of a following n-bit codeword.

13. A method for encoding according to claim 12, wherein said selecting is performed in such a way that enables to be satisfied said constraint over the current n-bit codeword and the preceding n-bit codeword.

14. A method for encoding an m-bit dataword cut out of an input binary data stream one after another to an n-bit codeword, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising the steps of:

translating an m-bit dataword to a current n-bit codeword;

generating a replacing-code, the replacing-code indicating the number of consecutive logical 0's at upper digits of the current n-bit codeword; and, replacing lower digits of preceding n-bit codeword according to a replacing-code.

15. A method for encoding according to claim 14, wherein said replacing is performed in such a way that enables to be satisfied said constraint over the current n-bit codeword and the preceding n-bit codeword.

16. A method for encoding an m-bit dataword cut out of an input binary data stream one after another to the n-bit codeword by reffering to a look-up table, the n-bit codeword satisfying such constraint that two logical 1's should be separated by a run of at least d consecutive logical 0's and any run of consecutive logical 0's has a length of at most k, the m-bit dataword and the n-bit dataword satisfying a formula: n>m, comprising the steps of:

reading the current n-bit codeword indicated by an m-bit dataword from the look-up table being selected by a selecting-code;

selecting a look-up table according to a number of consecutive logical 0's at lower digits of a preceding n-bit codeword to generate the selecting-code;

generating a replacing-code, the replacing-code indicating the number of consecutive logical 0's at upper digits of the current n-bit codeword; and, replacing lower digits of the preceding n-bit codeword according to the replacing-code.

17. A method for encoding according to claim 16:

wherein said selecting is performed in such a way that enables to be satisfied said constraint over the current n-bit codeword and the preceding n-bit codeword; and, wherein said replacing is performed in such a way that enables to be satisfied said constraint over the current n-bit codeword and the preceding n-bit codeword.

18. A method for encoding according to claim 16:

wherein said m, n, d, and k are equal to 8, 15, 2, and 9, respectively;

wherein said selecting is performed in such a way that, the bit-pattern formed from upper bits including the uppermost bit within the 15-bit codeword is one of "001" "0001", "00001", "000001", "0000001", "00000001", "000000001", and "0000000001" where the lowermost bit within the 15-bit codeword preceding thereto is "1", the bit-pattern is one of "01", "001", "0001", "00001", "000001", "0000001", "00000001", and "000000001" where lower 2 bits including the lowermost bit within the 15-bit codeword preceding thereto are "10", the bit-pattern is one of "1", "01", "001", "0001", "00001", "000001", "0000001", and "00000001" where lower 3 bits including the lowermost bit within the 15-bit codeword preceding thereto are "100", the bit-pattern is one of "1", "01", "001", "0001", "00001", "000001", and "0000001" where lower 4 bits including the lowermost bit within the 15-bit codeword preceding thereto are "1000", the bit-pattern is one of "1", "01", "001", "0001", "00001", and "000001" where lower 5 bits including the lowermost bit within the 15-bit codeword preceding thereto are "10000", the bit-pattern is one of "1", "01", "001", "0001", and "00001" where lower 6 bits including the lowermost bit within the 15-bit codeword preceding thereto are "100000", the bit-pattern is one of "1", "01", "001", and "0001" where lower 7 bits including the lowermost bit within the 15-bit codeword preceding thereto are "1000000", the bit-pattern is one of "1", "01" and "001" where lower 8 bits including the lowermost bit within the 15-bit codeword preceding thereto are "10000000", the bit-pattern is one of "1" and "01" where lower 9 bits including the lowermost bit within the 15-bit codeword preceding thereto are "100000000", the uppermost bit of the 15-bit codeword is "1" where lower 10 bits including the lowermost bit within the 15-bit codeword preceding thereto are "1000000000"; and, wherein said replacing is performed in such a way that, where the 15-bit codeword having a bit "1" at the uppermost digit thereof is read from the look-up table, bit-patterns of "00010" and "10010" at the lower digits of the 15-bit codeword preceding thereto are replaced by bit-patterns of "00100" and "10000" respectively, where the 15-bit codeword having a bit-pattern of "01" at the upper digits thereof is read from the look-up table, bit-patterns of "00001", "01001", and "10001" at the lower digits of the 15-bit codeword preceding thereto is replaced by bit-patterns of "00100", "01000", and "10000" respectively, where the 15-bit codeword having a bit-pattern of "001" at the upper digits thereof is read from the look-up table, a bit-pattern of "00000000" at the lower digits of the 15-bit codeword preceding thereto is replaced by a bit-pattern of "00100000", where the 15-bit codeword having a bit-pattern of "0001" at the upper digits thereof is read from the look-up table, a bit-pattern of "0000000" at the lower digits of the 15-bit codeword preceding thereto is replaced by a bit-pattern of "1000000", where the 15-bit codeword having a bit-pattern of "00001" at the upper digits thereof is read from the look-up table, a bit-pattern of "000000" at the lower digits of the 15-bit codeword preceding thereto is replaced by a bit-pattern of "100000", where the 15-bit codeword having a bit-pattern of "000000" at the upper digits thereof is read from the look-up table, a bit-pattern of "00000" at the lower digits of the 15-bit codeword preceding thereto is replaced by a bit-pattern of "00100".

\* \* \* \* \*